US012588355B2

(12) United States Patent
Iwawaki et al.

(10) Patent No.: US 12,588,355 B2
(45) Date of Patent: Mar. 24, 2026

(54) ORGANIC LIGHT-EMITTING ELEMENT, DISPLAY APPARATUS, PHOTOELECTRIC CONVERSION APPARATUS, ELECTRONIC EQUIPMENT, LIGHTING APPARATUS, MOVING BODY, AND EXPOSURE LIGHT SOURCE

(71) Applicant: CANON KABUSHIKI KAISHA, Tokyo (JP)

(72) Inventors: Hironobu Iwawaki, Kanagawa (JP); Jun Kamatani, Tokyo (JP); Naoki Yamada, Tokyo (JP); Yosuke Nishide, Kanagawa (JP); Hirokazu Miyashita, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 836 days.

(21) Appl. No.: 17/815,173

(22) Filed: Jul. 26, 2022

(65) Prior Publication Data

US 2023/0093269 A1 Mar. 23, 2023

(30) Foreign Application Priority Data

Jul. 29, 2021 (JP) ................................ 2021-124118

(51) Int. Cl.
*H10K 50/12* (2023.01)
*C07F 15/00* (2006.01)
(Continued)

(52) U.S. Cl.
CPC ......... *H10K 50/12* (2023.02); *C07F 15/0033* (2013.01); *H10K 50/11* (2023.02); (Continued)

(58) Field of Classification Search
None
See application file for complete search history.

(56) References Cited

U.S. PATENT DOCUMENTS 6,921,915 B2 * 7/2005 Takiguchi ........... C07F 15/0033 313/504
9,269,911 B2 * 2/2016 Horiuchi .............. H10K 85/626
(Continued)

FOREIGN PATENT DOCUMENTS

CN 110938097 A 3/2020
JP 2020125289 A 8/2020
(Continued)

OTHER PUBLICATIONS

Sangyeob Lee et al., The role of charge balance and excited state levels on device performance of exciplex-based phosphorescent organic light emitting diodes, Scientific Reports, vol. 7, 11995, 2017.

*Primary Examiner* — Robert S Loewe
(74) *Attorney, Agent, or Firm* — Canon U.S.A., Inc. IP Division

(57) ABSTRACT

A organic light-emitting element including a positive electrode, a light-emitting layer, and a negative electrode in this order, wherein the light-emitting layer contains a dopant material, a host material, and an assist material, the dopant material is a compound represented by the following general formula [1], the host material is a hydrocarbon compound, and the assist material has a lower LUMO level than the host material. In the formula [1], $R_1$ to $R_{10}$ denote a hydrogen atom, an alkyl group, or the like. X denotes O or S. m denotes an integer in the range of 1 to 3, and n denotes an integer in the range of 0 to 2, provided that m+n is 3. The partial structure $IrL_n$ is any one of structures represented by the following formulae [2] and [3], wherein $R_{11}$ to $R_{21}$ denote a hydrogen atom, an alkyl group, or the like.

[1]

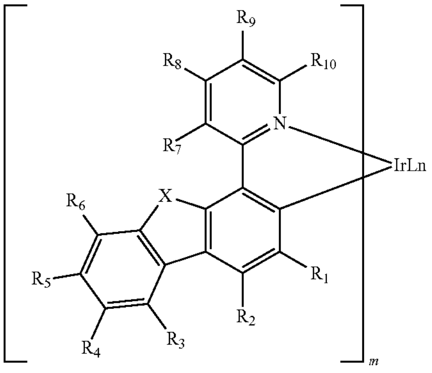

[2]

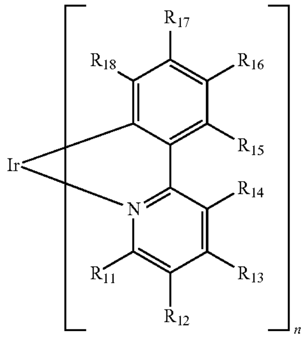

[3]

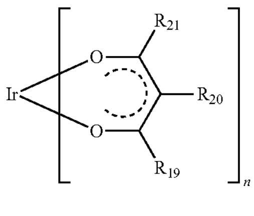

16 Claims, 8 Drawing Sheets

(51) Int. Cl.

| | |
|---|---|
| ***H10K 50/11*** | (2023.01) |
| ***H10K 59/38*** | (2023.01) |
| ***H10K 59/60*** | (2023.01) |
| ***H10K 59/65*** | (2023.01) |
| ***H10K 85/30*** | (2023.01) |
| ***H10K 85/60*** | (2023.01) |
| *H10K 101/40* | (2023.01) |

(52) U.S. Cl.

CPC ............. *H10K 59/38* (2023.02); *H10K 59/60* (2023.02); *H10K 59/65* (2023.02); *H10K 85/342* (2023.02); *H10K 85/361* (2023.02); *H10K 85/615* (2023.02); *H10K 85/622* (2023.02); *H10K 85/654* (2023.02); *H10K 85/6572* (2023.02); *H10K 85/6574* (2023.02); *H10K 85/6576* (2023.02); *C07B 2200/05* (2013.01); *H10K 2101/40* (2023.02)

(56) References Cited

U.S. PATENT DOCUMENTS

| | | | | |
|---|---|---|---|---|
| 9,812,646 | B2 * | 11/2017 | Kamatani | C07D 307/77 |
| 9,960,370 | B2 * | 5/2018 | Kishino | H10K 59/123 |
| 10,038,152 | B2 * | 7/2018 | Kosuge | H10K 85/6576 |
| 2010/0244004 | A1 * | 9/2010 | Xia | H05B 33/10 546/4 |
| 2012/0292601 | A1 * | 11/2012 | Kottas | H10K 85/342 546/4 |
| 2013/0037790 | A1 * | 2/2013 | Kamatani | C09K 11/06 257/E51.026 |
| 2013/0037791 | A1 * | 2/2013 | Horiuchi | H10K 85/622 257/E51.026 |
| 2013/0119354 | A1 * | 5/2013 | Ma | C09K 11/06 546/4 |
| 2013/0214268 | A1 * | 8/2013 | Horiuchi | H10K 85/6574 549/392 |
| 2013/0221340 | A1 * | 8/2013 | Kamatani | H05B 33/10 257/40 |
| 2014/0077172 | A1 * | 3/2014 | So | H10K 50/121 438/46 |
| 2015/0357586 | A1 | 12/2015 | Horiuchi | |
| 2015/0364701 | A1 * | 12/2015 | Horiuchi | H10K 50/11 546/4 |
| 2019/0252619 | A1 | 8/2019 | Tsai | |
| 2020/0048171 | A1 * | 2/2020 | Yamada | C07C 25/22 |
| 2020/0212309 | A1 | 7/2020 | Choi et al. | |
| 2021/0155647 | A1 | 5/2021 | Lee | |
| 2023/0093269 | A1 * | 3/2023 | Iwawaki | H10K 85/342 257/40 |

FOREIGN PATENT DOCUMENTS

| | | | |
|---|---|---|---|
| JP | 2021024800 | A | 2/2021 |
| KR | 20130010015 | A | 1/2013 |
| KR | 20160103932 | A | 9/2016 |
| KR | 20180124766 | A | 11/2018 |
| KR | 20190000185 | A | 1/2019 |
| KR | 20210031205 | A | 3/2021 |
| WO | 2009066778 | A1 | 5/2009 |

* cited by examiner

ORGANIC LIGHT-EMITTING ELEMENT, DISPLAY APPARATUS, PHOTOELECTRIC CONVERSION APPARATUS, ELECTRONIC EQUIPMENT, LIGHTING APPARATUS, MOVING BODY, AND EXPOSURE LIGHT SOURCE

BACKGROUND OF THE INVENTION

Field of the Invention

The present disclosure relates to an organic light-emitting element, a display apparatus, a photoelectric conversion apparatus, electronic equipment, a lighting apparatus, a moving body, and an exposure light source.

Description of the Related Art

An organic light-emitting element (also referred to as an organic electroluminescent element or an organic EL element) is an electronic element that includes a positive electrode and a negative electrode and an organic compound layer between these electrodes. Positive holes (holes) and electrons from the positive and negative electrodes recombine and form excitons in the organic compound layer. An organic light-emitting element emits light when the excitons return to their ground state.

With recent significant advances in organic light-emitting elements, it is possible to realize low drive voltage, various emission wavelengths, high-speed responsivity, and thin and light light-emitting devices.

At present, the use of phosphorescence has been proposed to improve the luminescence efficiency of organic EL elements. Organic EL elements utilizing phosphorescence are expected to have luminescence efficiency theoretically approximately four times the luminescence efficiency of those utilizing fluorescence. Thus, phosphorescent organometallic complexes have been actively developed. This is because the development of organometallic complexes with good emission properties is important for high-performance organic light-emitting elements.

U.S. Patent Application Publication No. 2010/0244004 (hereinafter PTL 1) proposes 1-a as an organometallic complex developed and an organic light-emitting element including a sulfur-containing compound as a host material, U.S. Patent Application Publication No. 2020/0212309 (hereinafter PTL 2) proposes the following compounds 1-a and 1-b and describes an organic light-emitting element including two compounds with a nitrogen-containing structure as a host material.

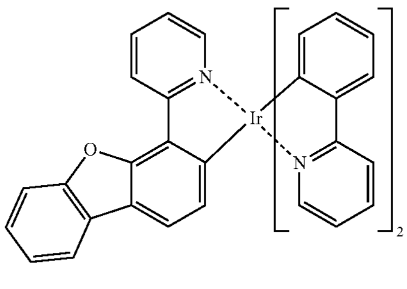

-continued

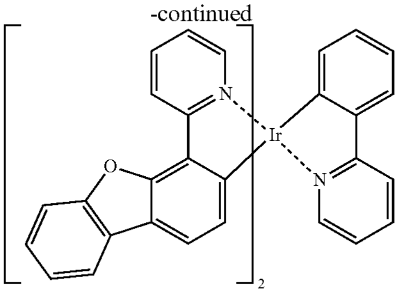

The use of iridium complexes described in PTL 1 and PTL 2, together with a compound with a sulfur-containing structure or a compound with a nitrogen-containing structure in a light-emitting layer of an organic light-emitting element causes problems in luminescence efficiency and drive durability.

SUMMARY OF THE INVENTION

The present disclosure addresses these problems and provides an organic light-emitting element with high luminescence efficiency and an organic light-emitting element with high luminescence efficiency and drive durability.

As such, an organic light-emitting element according to the present disclosure includes a positive electrode, a light-emitting layer, and a negative electrode in this order, wherein the light-emitting layer contains a dopant material, a host material, and an assist material, the dopant material is a compound represented by the following general formula [1], where the host material is an aromatic hydrocarbon compound, and the assist material has a lower LUMO level than the host material (farther from the vacuum level),

[1]

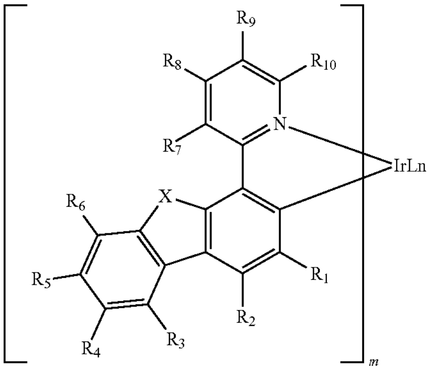

wherein $R_1$ to $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group, X denotes O or S, m denotes an integer in the range of 1 to 3, and n denotes an integer in the range of 0 to 2, provided that m+n is 3, and the partial structure $IrL_n$ is any one of structures represented by the following general formulae [2] and [3],

[2]

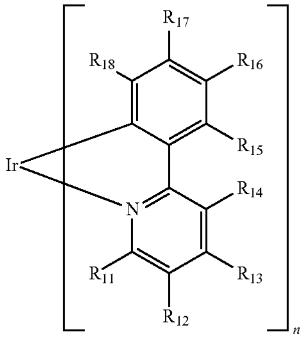

[3]

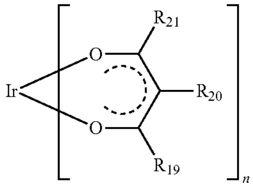

wherein $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

Further features of the present disclosure will become apparent from the following description of exemplary embodiments with reference to the attached drawings.

DESCRIPTION OF THE EMBODIMENTS

1. Organic Light-Emitting Element

An organic light-emitting element according to the present disclosure includes a positive electrode, a light-emitting layer, and a negative electrode in this order. The light-emitting layer contains a dopant material, a host material, and an assist material. The dopant material is a compound represented by the following general formula [1]. The host material is a hydrocarbon compound. The assist material has a lower LUMO level than the host material (farther from the vacuum level).

[1]

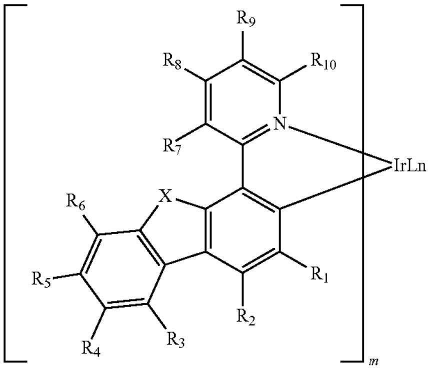

In the formula [1], $R_1$ to $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

X denotes O or S.

m denotes an integer in the range of 1 to 3, and n denotes an integer in the range of 0 to 2, provided that m+n is 3.

The partial structure $IrL_n$ is any one of structures represented by the following general formulae [2] and [3]. Ir denotes iridium. When n is 2, the Ls may be the same or different.

[2]

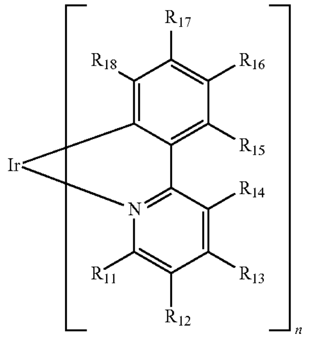

[3]

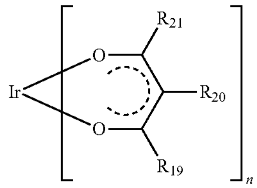

In the formulae [2] and [3], $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

Figure 1A:
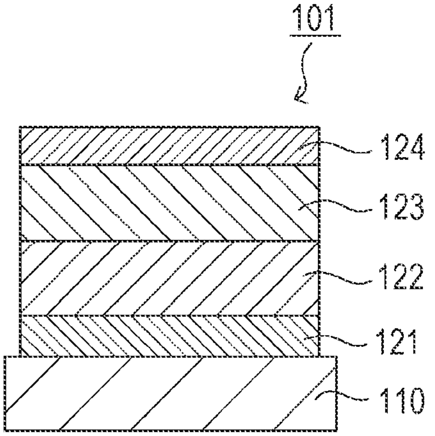
FIGS. 1A to 1C are schematic cross-sectional views of an example of an embodiment of an organic light-emitting element according to an embodiment of the present disclosure.
Figure 1B:
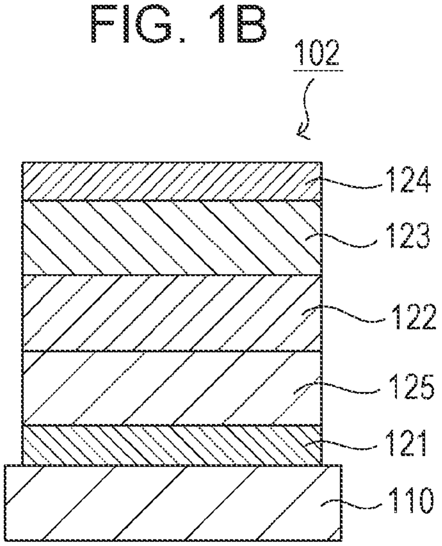
Figure 1C:
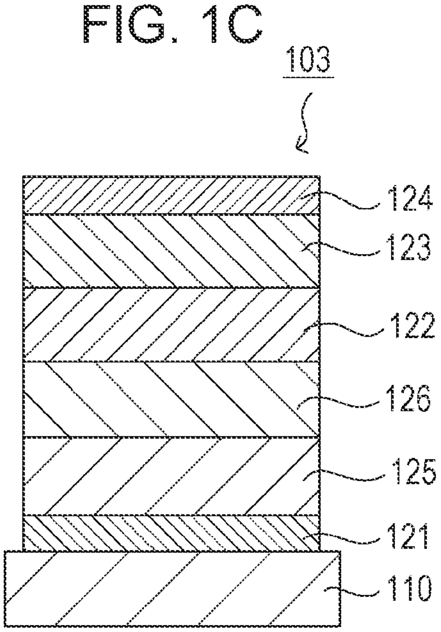

An organic light-emitting element according to the present disclosure is described below with reference to the accompanying drawings. FIGS. 1A to 1C are schematic cross-sectional views of an example of an embodiment of an organic light-emitting element according to the present disclosure. FIG. 1A is a schematic view of a first embodiment. FIG. 1B is a schematic view of a second embodiment. FIG. 1C is a schematic view of a third embodiment.

An organic light-emitting element 101 in FIG. 1A includes a positive electrode 121, a light-emitting layer 122, an electron-injection/transport layer 123, and a negative electrode 124 in this order on a substrate 110. The organic light-emitting element 101 in FIG. 1A is useful when the light-emitting layer 122 has all of hole-transport ability, electron-transport ability, and light-emitting ability. The organic light-emitting element 101 in FIG. 1A is also useful when a hole-transport material, an electron-transport material, and a light-emitting material are mixed in the light-emitting layer 122.

In the organic light-emitting element 102 illustrated in FIG. 1B, a hole-injection/transport layer 125 is provided between the positive electrode 121 and the light-emitting layer 122 of the organic light-emitting element 101 illustrated in FIG. 1A. In the organic light-emitting element 102 illustrated in FIG. 1B, a layer with a carrier transport function is separated from a layer with a light emission function, and a compound with hole-transport ability, a compound with electron-transport ability, and a compound with light-emitting ability can be appropriately combined. This can significantly increase the degree of freedom in the selection of materials, and effectively confine electric charges or excitons in the central light-emitting layer 122 and improve the luminescence efficiency.

In an organic light-emitting element 103 illustrated in FIG. 1C, an electron/exciton-blocking layer 126 is provided between the light-emitting layer 122 and the hole-injection/transport layer 125 of the organic light-emitting element 102 illustrated in FIG. 1B. In the organic light-emitting element 103 illustrated in FIG. 1C, the electron/exciton-blocking layer 126 can confine electrons in the light-emitting layer 122. This can improve luminescence efficiency as in FIG. 1B.

The organic light-emitting elements illustrated in FIGS. 1A to 1C have very basic element structures, and the present disclosure is not limited thereto. Various layer structures are possible. For example, it is possible to provide an insulating layer, an adhesive layer, or an interference layer at the interface between an electrode and an organic compound layer. It is also possible to provide a hole-transport layer composed of two layer structures with different HOMO levels or ionization potentials.

An organic light-emitting element may have the structures described in the following 1 to 5 as well as the structures illustrated in FIGS. 1A to 1C. In any of the element structures, the organic compound layer always includes a light-emitting layer containing a light-emitting material.

1. (substrate/)positive electrode/light-emitting layer/negative electrode
2. (substrate/)positive electrode/hole-transport layer/electron-transport layer/negative electrode
3. (substrate/)positive electrode/hole-transport layer/light-emitting layer/electron-transport layer/negative electrode (FIG. 1B)
4. (substrate/)positive electrode/hole-injection layer/hole-transport layer/light-emitting layer/electron-transport layer/negative electrode
5. (substrate/)positive electrode/hole-transport layer/light-emitting layer/hole/exciton-blocking layer/electron-transport layer/negative electrode In the present disclosure, the mode (element form) of extracting light from a light-emitting layer may be a bottom emission mode of extracting light from an electrode on the substrate side or a top emission mode of extracting light from the side opposite to the substrate side. The mode may also be a double-sided extraction mode (tandem mode) of extracting light from the substrate side and from the side opposite to the substrate side.

In an organic light-emitting element according to the present disclosure, an iridium complex represented by the general formula [1] can be contained in a light-emitting layer of the organic compound layer. Such a light-emitting layer contains at least an iridium complex represented by the general formula [1], a host material, and an assist material. The use of a compound contained in the light-emitting layer depends on the concentration of the compound in the light-emitting layer. More specifically, the compound is divided into a main component and an auxiliary component depending on the concentration of the compound in the light-emitting layer. A compound serving as a main component is a compound with the maximum mass ratio (content) among the materials contained in the light-emitting layer and is also referred to as a host material. The host material exists as a matrix around the light-emitting material in the light-emitting layer and is mainly responsible for carrier transport to the light-emitting material and excitation energy supply to the light-emitting material. A material serving as an auxiliary component is a material other than the main component and can be referred to as a guest (dopant, light-emitting material), an assist material, or a charge injection material depending on the function of the material.

An auxiliary component, a guest, is a light-emitting material responsible for main light emission in the light-emitting layer. An auxiliary component, an assist material, is a compound that assists the light emission of the guest and has a lower mass ratio (content) than the host in the light-emitting layer. A light-emitting assist material is also referred to as a second host because of its function.

The concentration of the guest preferably ranges from 0.1% to 30% by mass, more preferably 1% to 30% by mass, still more preferably 1% to 15% by mass, of the total amount of the constituent materials in the light-emitting layer. An iridium complex represented by the general formula [1] is a compound that exhibits more characteristic functions at a low concentration. The iridium complex at a low concentration can provide a light-emitting element with high efficiency and color purity. Thus, the guest in this concentration range can provide a light-emitting element with higher efficiency.

In the present disclosure, a combination of an iridium complex serving as a dopant material (light-emitting material) and a hydrocarbon compound serving as a host material (main component) in the light-emitting layer exhibits good characteristics for the following reason 1-1 and also for the following reason 1-2.

1-1. Mixing materials with similar polarities improves dispersibility, 1-2. The combination facilitates π-electron interaction and energy transfer.

1-1. Mixing Materials with Similar Polarities Improves Dispersibility.

The ligands of an iridium complex represented by the general formula [1] are slightly polar due to a heterocycle but have low polarity as a whole due to an aromatic ring. With a structure in which the iridium atom is surrounded by the ligands with low polarity, therefore, an iridium complex represented by the general formula [1] has low polarity as a whole. When the iridium complex is used as a light-emitting material, the host material can also have low polarity. This is because a mixture of materials with similar polarities has improved dispersibility in a film. In general, like water and oil, materials with significantly different polarities are difficult to mix, but materials with similar polarities have high compatibility. Thus, to improve the dispersibility in a film, materials can have as similar polarities as possible. The present inventors have found that when an iridium complex represented by the general formula [1] is used as a light-emitting material, the use of a hydrocarbon compound as a host material improves the dispersibility of the light-emitting material in a film. This is because a hydrocarbon compound composed only of carbon and hydrogen is a compound with very low polarity. The use of a compound containing a nitrogen atom, an oxygen atom, or a sulfur atom as a host material causes a difference in polarity from a carbon atom and increases the polarity of the entire molecule. A light-emitting layer formed of a host material with high polarity and an iridium complex represented by the general formula [1] with low polarity has intermolecular repulsion due to the polarity, and the iridium complex, which is smaller in absolute amount in the light-emitting layer, associates easily. An associated light-emitting material is susceptible to concentration quenching and may have a decrease in luminescence efficiency and drive durability. Thus, the host material can be a material with low polarity, and the molecule of the host material can be designed with a carbon atom and a hydrogen atom to minimize the polarity.

Details and the structure of a host material with low polarity composed of a carbon atom and a hydrogen atom are described later.

To further lower the polarity of an iridium complex represented by the general formula [1], it is useful to introduce an alkyl group into the ligands. To lower the polarity, there is a method of expanding the π-conjugation in the ligands, that is, a method of increasing the number of aromatic rings. However, this method increases the emission wavelength. In contrast, introducing an alkyl group into the ligands can lower the polarity without significantly changing the emission wavelength of the iridium complex. In particular, an alkyl group having 1 to 4 carbon atoms in the ligands of the iridium complex can lower the polarity with a small influence on the emission wavelength. The use of the iridium complex as a light-emitting material and the hydrocarbon compound as a host material can further improve the dispersibility of the light-emitting material in a film.

1-2. The Combination Facilitates π-electron Interaction and Energy Transfer.

The ligands of an iridium complex represented by the general formula [1] have an aromatic fused ring structure and are likely to cause π-electron interaction with a host material also having an aromatic fused ring structure. The overlap of π-electrons of the aromatic rings facilitates energy transfer between the host material and the iridium complex. It is generally believed that energy transfer from the host material to the iridium complex is easier at a shorter intermolecular distance. The use of a compound with a hydrocarbon fused polycyclic structure as a host material can more easily cause π-electron interaction with an iridium complex represented by the general formula [1].

2. Dopant Material (Iridium Complex)

The dopant material is a compound represented by the following general formula [1].

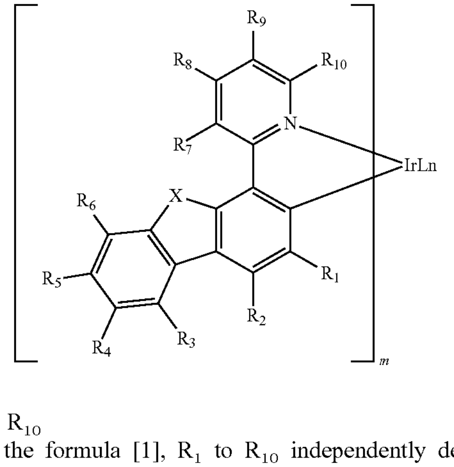

[1]

$R_1$ to $R_{10}$

In the formula [1], $R_1$ to $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

Examples of the halogen atom include, but are not limited to, fluorine, chlorine, bromine, and iodine.

Examples of the alkyl group include, but are not limited to, a methyl group, an ethyl group, a n-propyl group, an isopropyl group, a n-butyl group, a t-butyl group, a sec-butyl group, a 3-pentyl group, an octyl group, a cyclohexyl group, a tertiary pentyl group, a 3-methylpentan-3-yl group, a 1-adamantyl group, and a 2-adamantyl group. The alkyl group can be an alkyl group having 1 to 10 carbon atoms.

Examples of the alkoxy group include, but are not limited to, a methoxy group, an ethoxy group, a propoxy group, a 2-ethyl-octyloxy group, and a benzyloxy group. The alkoxy group can be an alkoxy group having 1 to 10 carbon atoms.

Examples of the amino group include, but are not limited to, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-t-butylphenyl)amino group, an N-phenyl-N-(4-trifluoromethylphenyl)amino group, an N-piperidyl group, a carbazolyl group, and an acridyl group. The amino group can be an amino group having 1 to 6 carbon atoms.

Examples of the aryl group include, but are not limited to, a phenyl group, a naphthyl group, an indenyl group, a biphenyl group, a terphenyl group, a fluorenyl group, a phenanthryl group, a triphenylenyl group, a pyrenyl group, an anthranyl group, a perylenyl group, a chrysenyl group, and a fluoranthenyl group. The aryl group can be an aryl group having 6 to 30 carbon atoms.

Examples of the heterocyclic group include, but are not limited to, a pyridyl group, a pyrimidyl group, a pyrazyl group, a triazyl group, a thienyl group, a benzofuranyl group, a benzothiophenyl group, a dibenzofuranyl group, a dibenzothiophenyl group, an oxazolyl group, an oxadiazolyl group, a thiazolyl group, a thiadiazolyl group, a carbazolyl group, an acridinyl group, and a phenanthrolyl group. The heterocyclic group can be a heterocyclic group having 3 to 27 carbon atoms.

Examples of the aryloxy group include, but are not limited to, a phenoxy group and a naphthoxy group.

Examples of the heteroaryloxy group include, but are not limited to, a furanyloxy group and a thienyloxy group.

Examples of the silyl group include, but are not limited to, a trimethylsilyl group and a triphenylsilyl group.

Examples of optional substituents of the alkyl group, the alkoxy group, the amino group, the aryl group, the heterocyclic group, the aryloxy group, the heteroaryloxy group, and the silyl group include, but are not limited to, deuterium, alkyl groups, such as a methyl group, an ethyl group, a n-propyl group, an isopropyl group, a n-butyl group, and a t-butyl group; aralkyl groups, such as a benzyl group; aryl groups, such as a phenyl group and a biphenyl group; heterocyclic groups, such as a pyridyl group and a pyrrolyl group; amino groups, such as a dimethylamino group, a diethylamino group, a dibenzylamino group, a diphenylamino group, and a ditolylamino group; alkoxy groups, such as a methoxy group, an ethoxy group, and a propoxy group; aryloxy groups, such as a phenoxy group; halogen atoms, such as fluorine, chlorine, bromine, and iodine; and a cyano group.

X

In the formula [1], X denotes O or S.

m, n

In the formula [1], m denotes an integer in the range of 1 to 3, and n denotes an integer in the range of 0 to 2, provided that m+n is 3.

Partial Structure $IrL_n$

In the formula [1], the partial structure $IrL_n$ is any one of structures represented by the following general formulae [2] and [3]. Ir denotes iridium. When n is 2, the Ls may be the same or different.

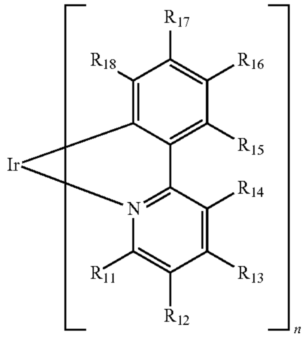

[2]

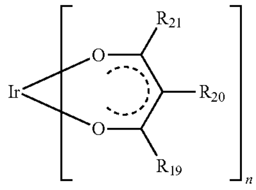

[3]

$R_{11}$ to $R_{21}$

In the formulae [2] and [3], $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

Specific examples of the halogen atom, the alkyl group, the alkoxy group, the amino group, the aryl group, the heterocyclic group, the aryloxy group, the heteroaryloxy group, and the silyl group represented by $R_{11}$ to $R_{21}$ include, but are not limited to, those described for $R_1$ to $R_{10}$. The alkyl group can be an alkyl group having 1 to 10 carbon atoms. The alkoxy group can be an alkoxy group having 1 to 10 carbon atoms. The amino group can be an amino group having 1 to 6 carbon atoms. The aryl group can be an aryl group having 6 to 30 carbon atoms. The heterocyclic group can be a heterocyclic group having 3 to 27 carbon atoms. Specific examples of optional substituents of the alkyl group, the alkoxy group, the amino group, the aryl group, the heterocyclic group, the aryloxy group, the heteroaryloxy group, and the silyl group include, but are not limited to, those described for $R_1$ to $R_{10}$.

In a compound represented by the general formula [1], concentration quenching can be reduced when at least one of $R_1$ to $R_{21}$ is a group other than a hydrogen atom or a deuterium atom, that is, a halogen atom, an alkyl group, an alkoxy group, an amino group, an aryl group, a heterocyclic group, an aryloxy group, a heteroaryloxy group, a silyl group, or a cyano group. These groups can impart the compound with improved sublimation properties at the time of sublimation and improved solvent solubility at the time of coating.

In a compound represented by the general formula [1], at least one of $R_1$ to $R_{21}$ can be an alkyl group having 1 to 4 carbon atoms. At least one of $R_1$ to $R_6$, at least one of $R_7$ to $R_{10}$, at least one of $R_{11}$ to $R_{18}$, or at least one of $R_{19}$ to $R_{21}$ can be an alkyl group having 1 to 4 carbon atoms. At least one of $R_7$ to $R_{10}$, for example, $R_8$, can be an aryl group, tor example, a phenyl group.

Specific examples of a compound represented by the general formula [1], which is a dopant material, include, but are not limited to, the following.

A1

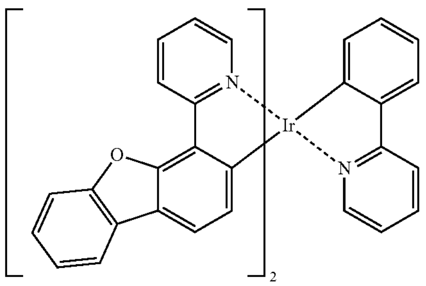

A2

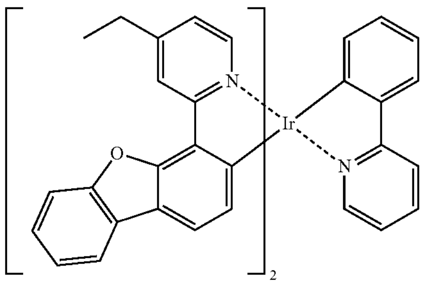

A3

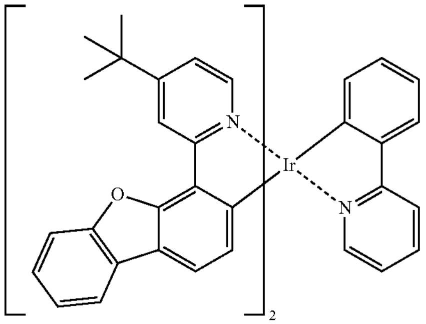

A4

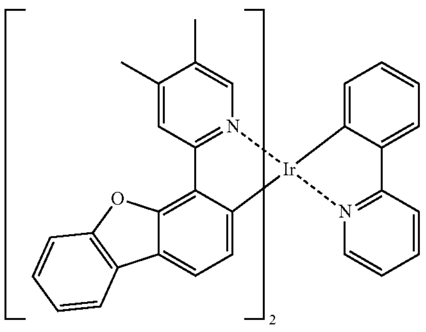

-continued

A5

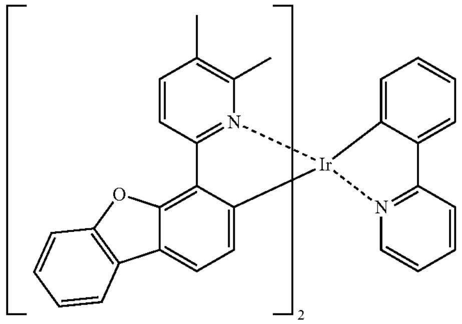

A6

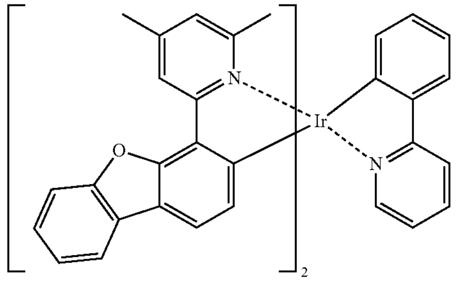

A7

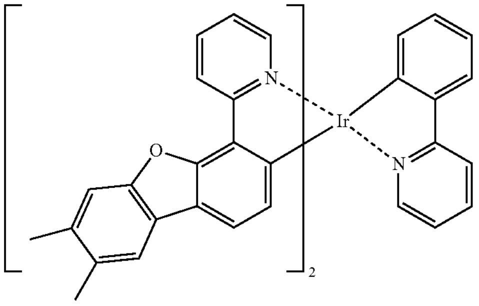

A8

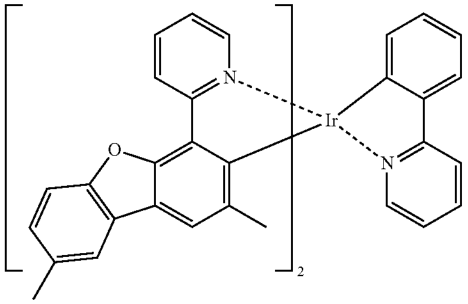

A9

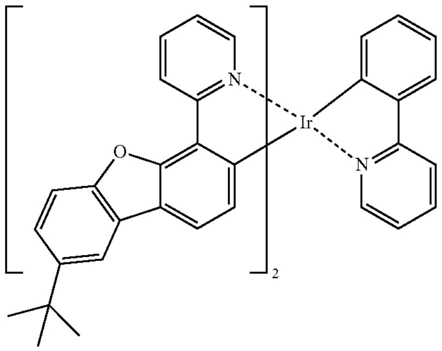

-continued
A10
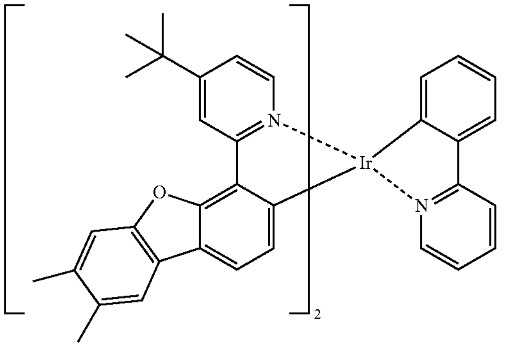
A11
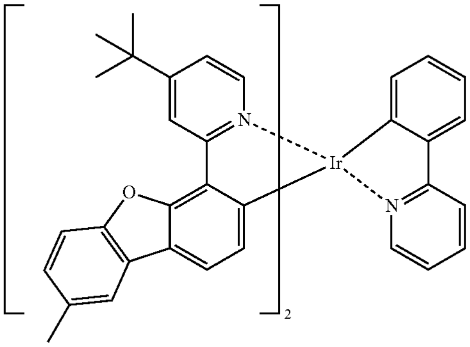
A12
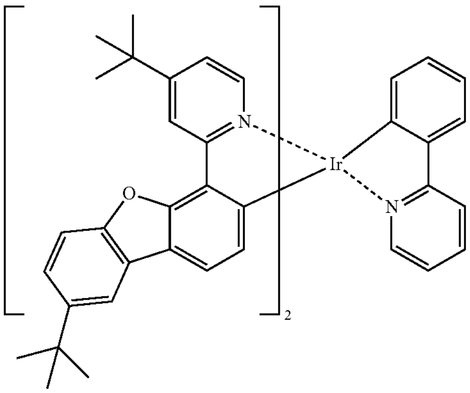
A13
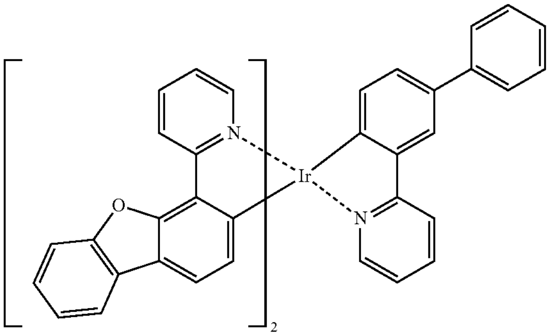
-continued
A14
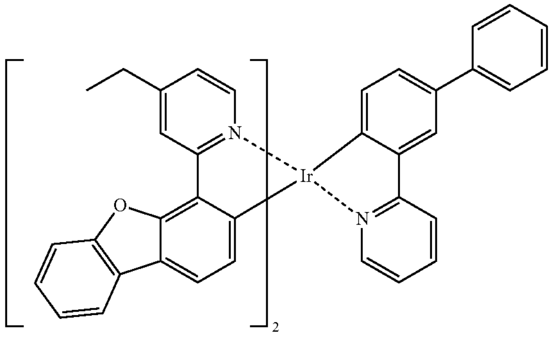
A15
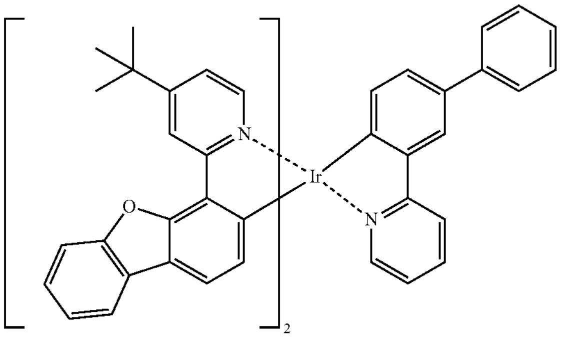
A16
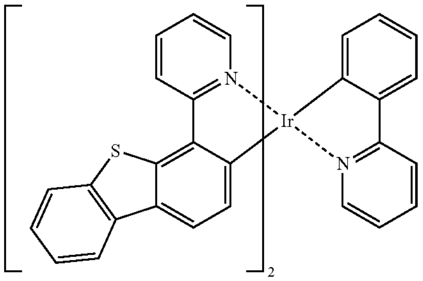
A17
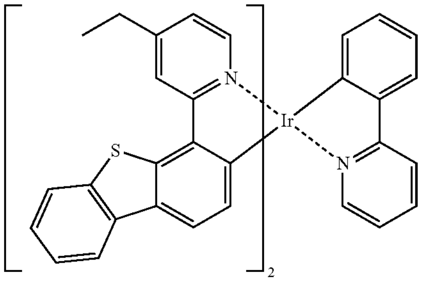
A18
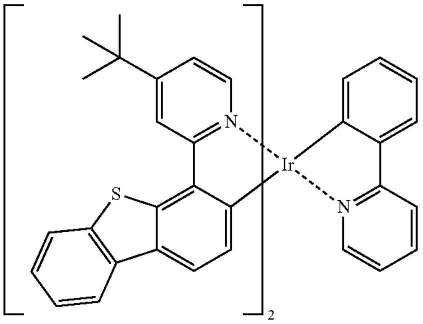

-continued
A19
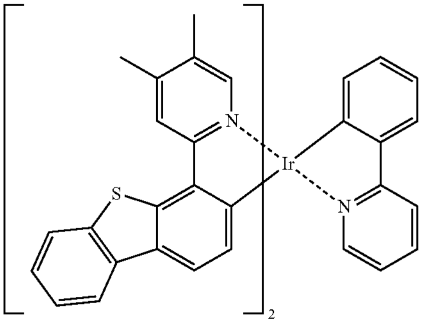
A20
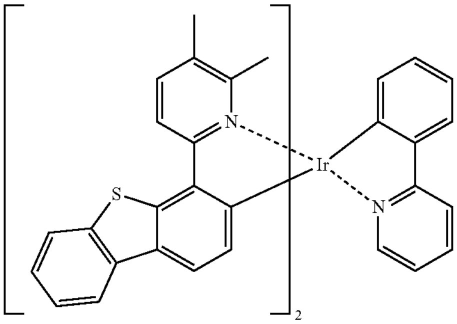
A21
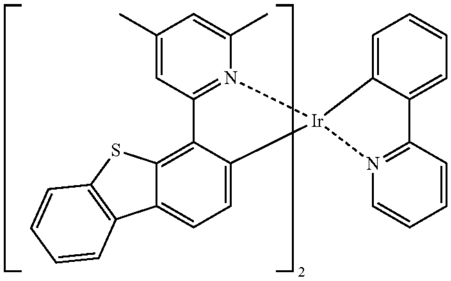
A22
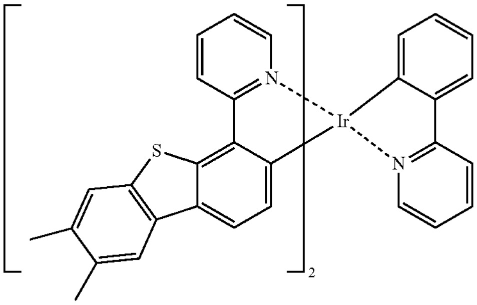
A23
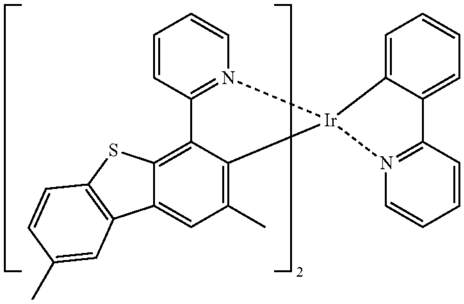
-continued
A24
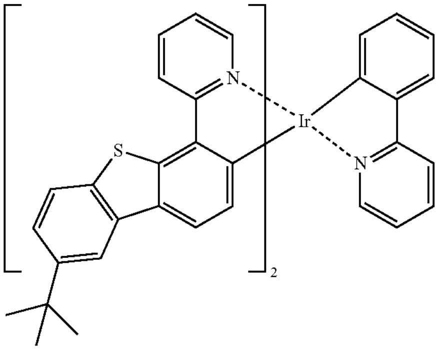
A25
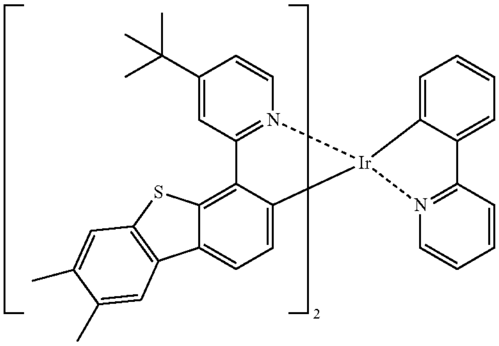
A26
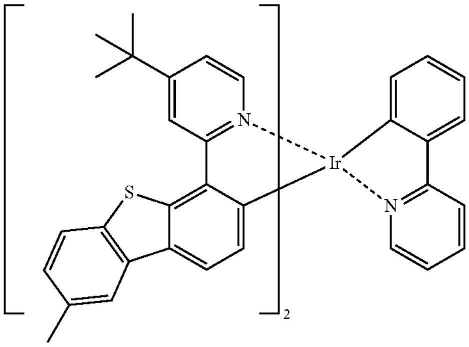
A27
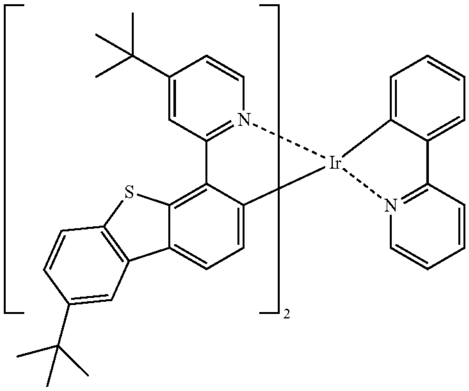

-continued
A28
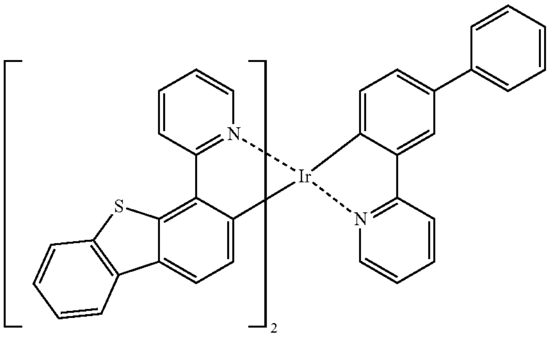
A29
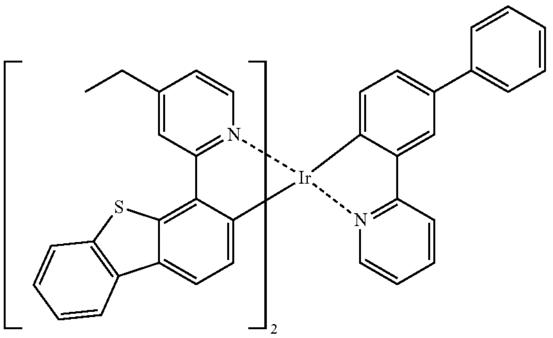
A30
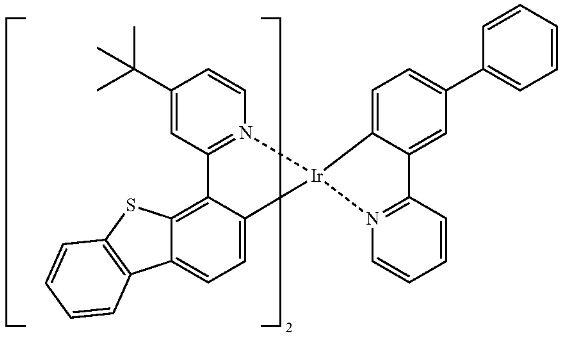
A31
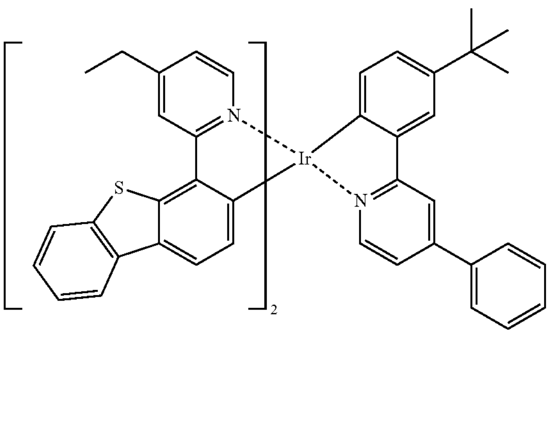
-continued
A32
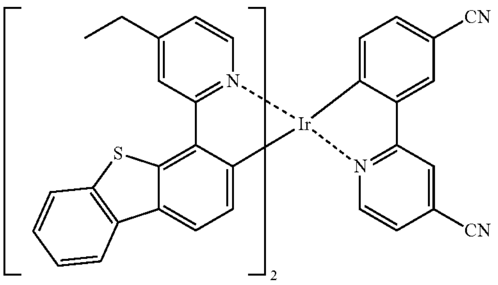
A33
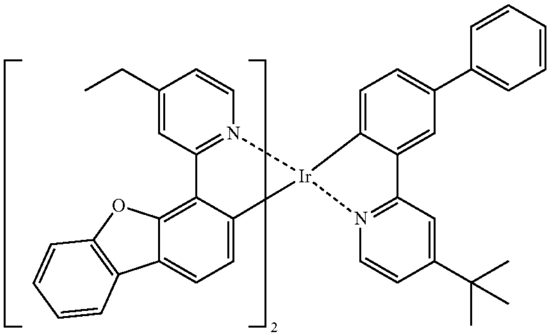
A34
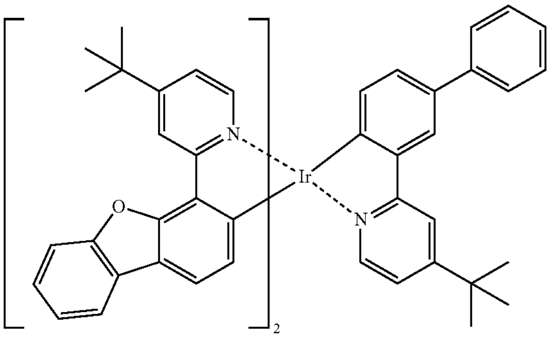
A35
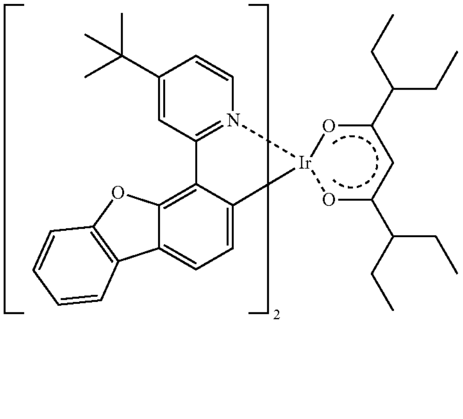

-continued
A36
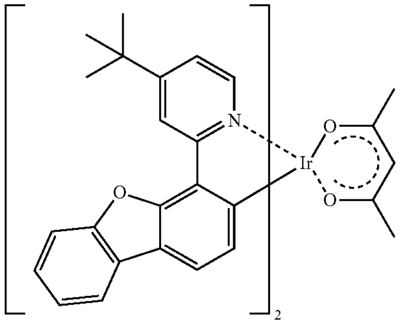
A37
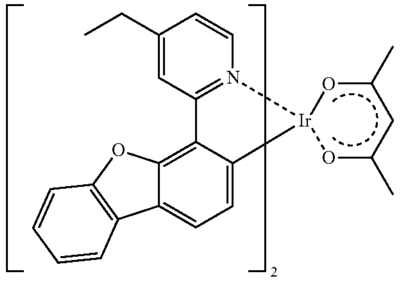
A38
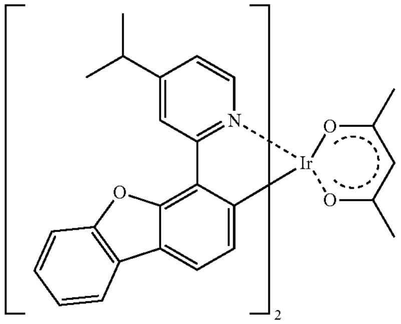
A39
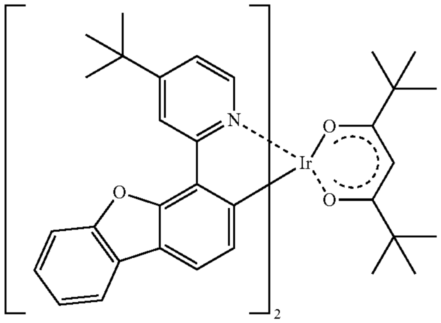
A40
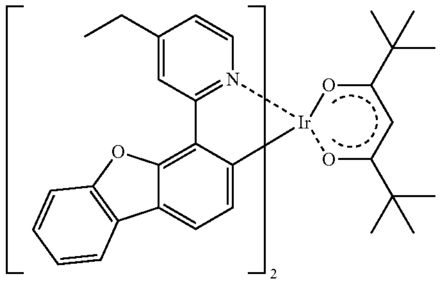
-continued
A41
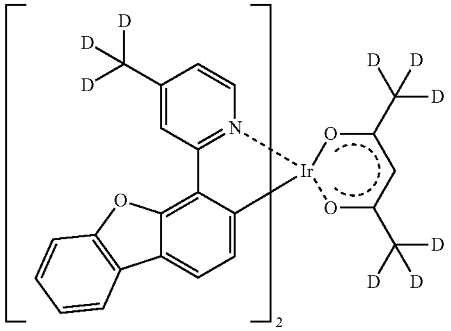
A42
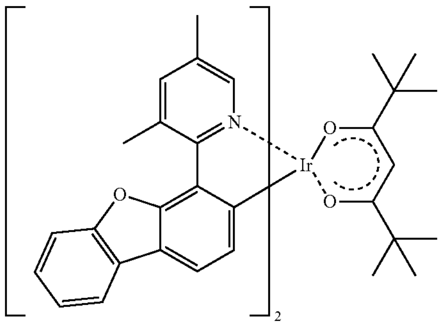
A43
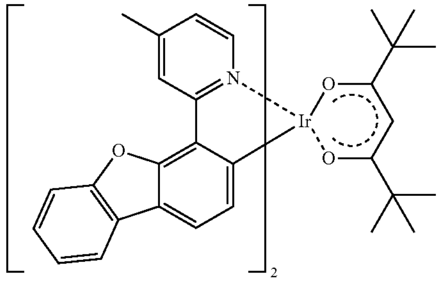
A44
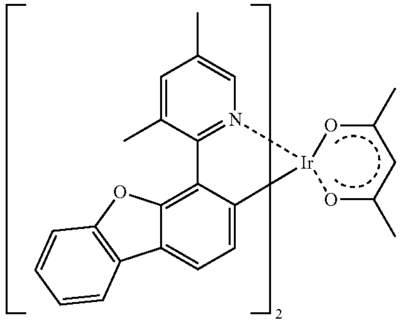
B1
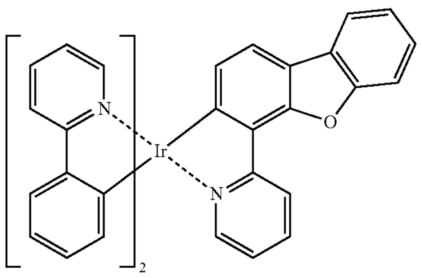

-continued
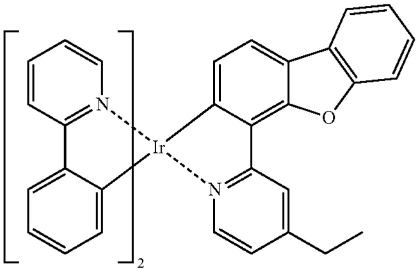
B2
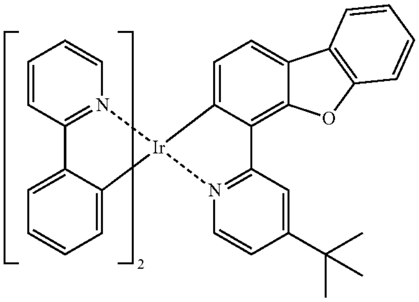
B3
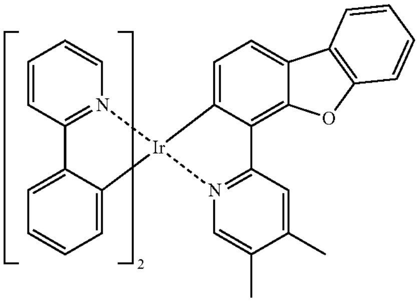
B4
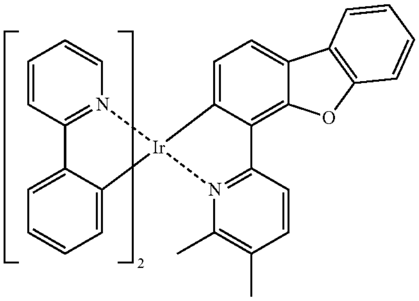
B5
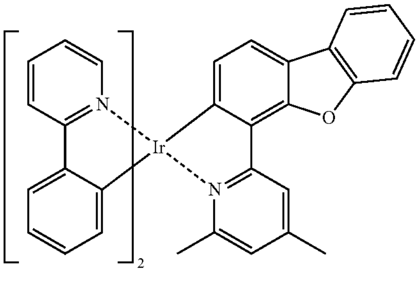
B6
-continued
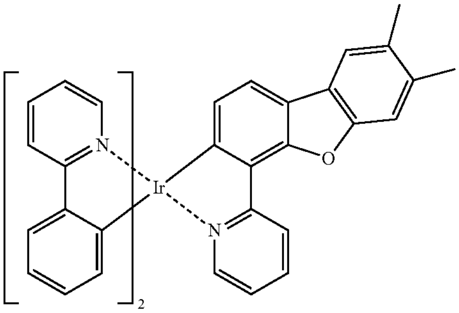
B7
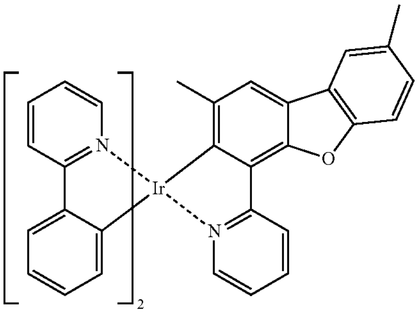
B8
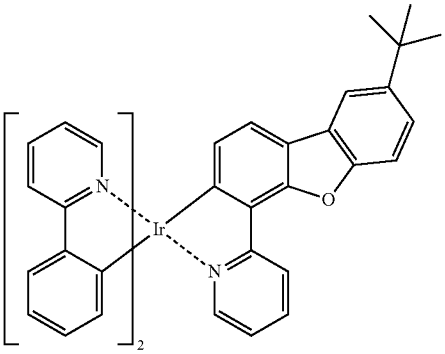
B9
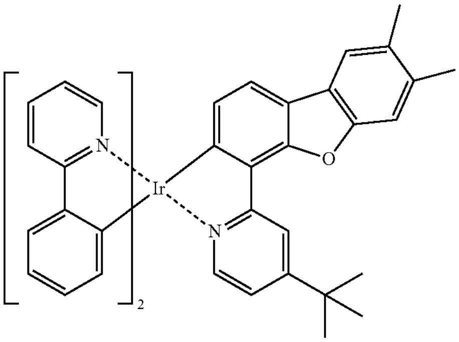
B10

-continued
B11
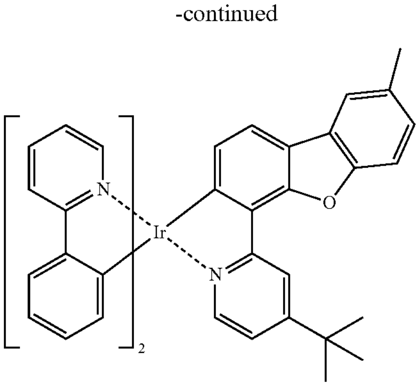
B12
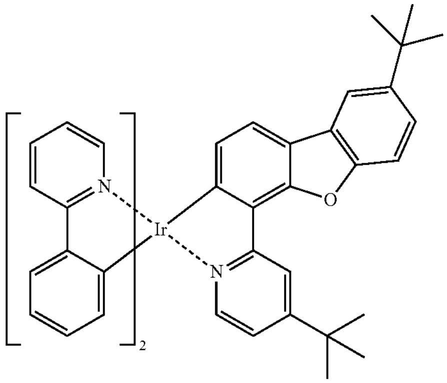
B13
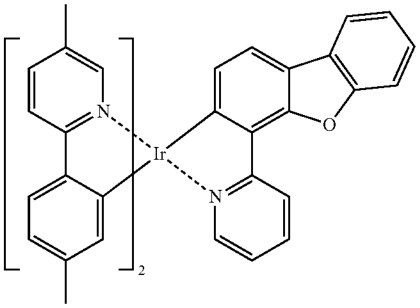
B14
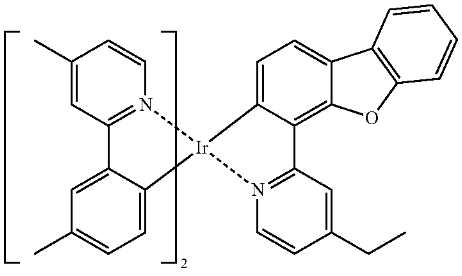
B15
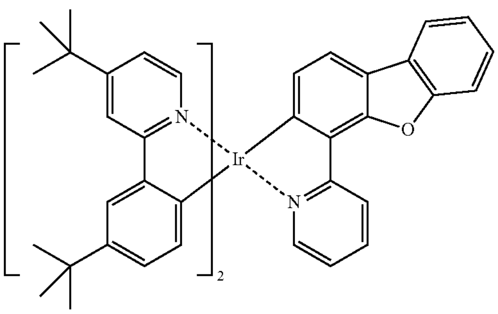
-continued
B16
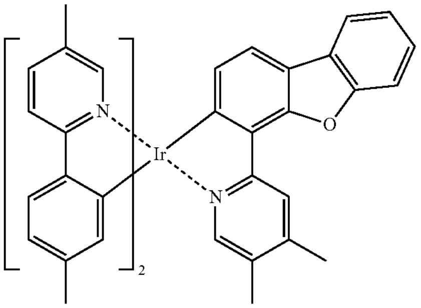
B17
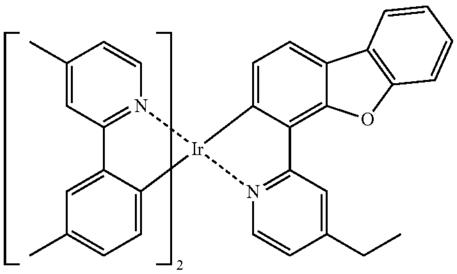
B18
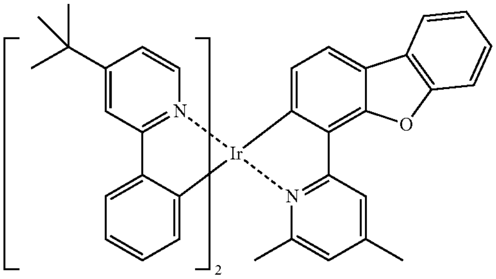
B19
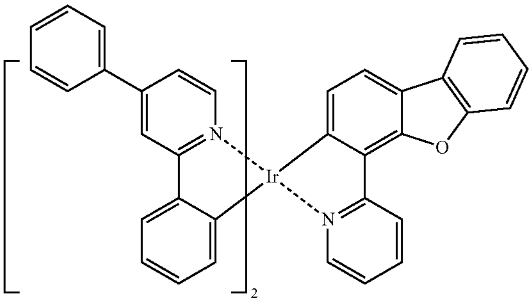
B20
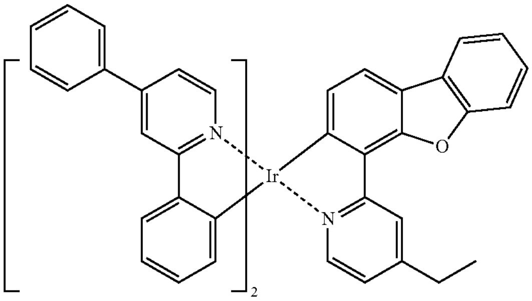

-continued
B21
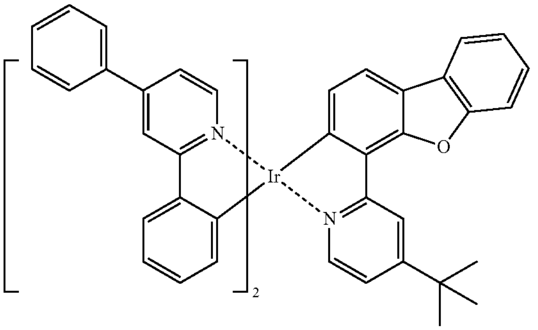
B22
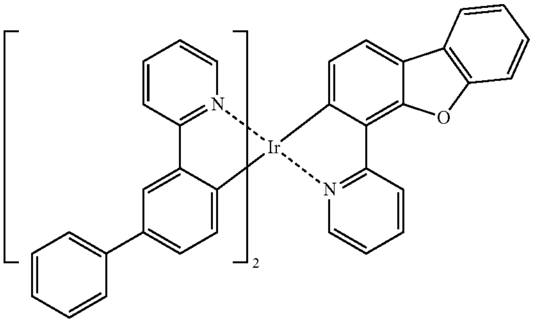
B23
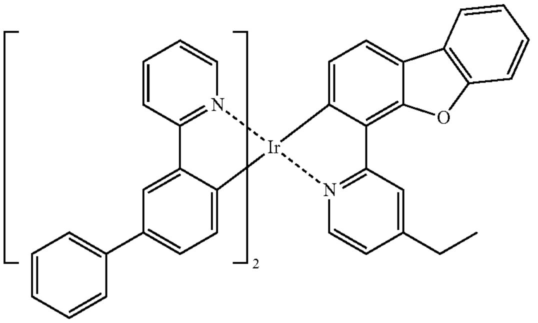
B24
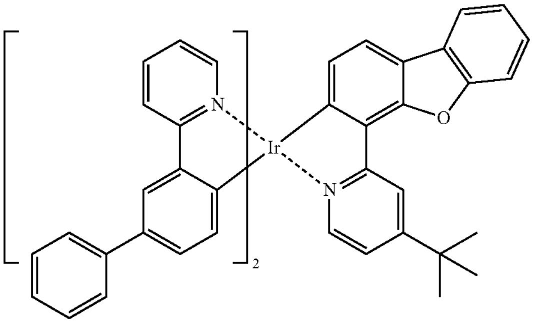
-continued
B25
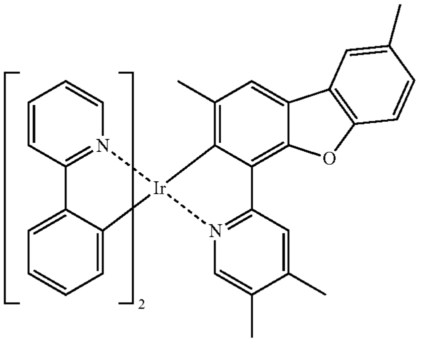
B26
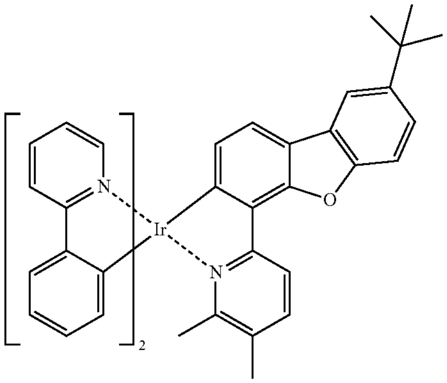
B27
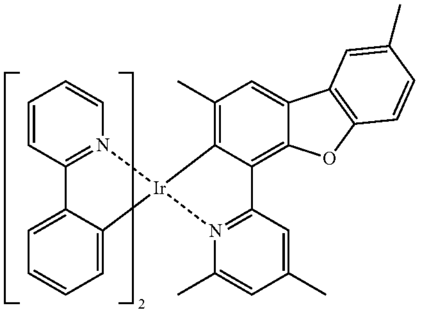
B28
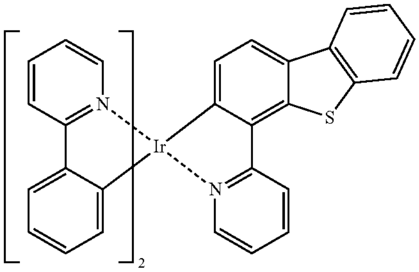
B29
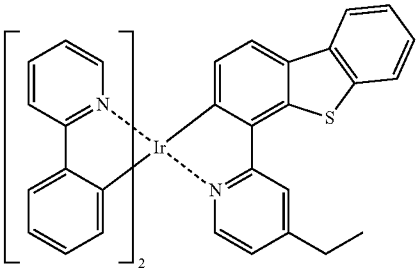

-continued
B30
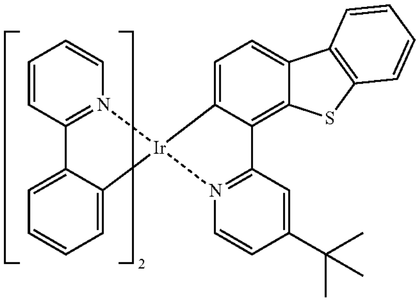
B31
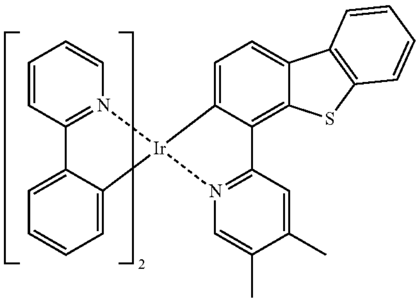
B32
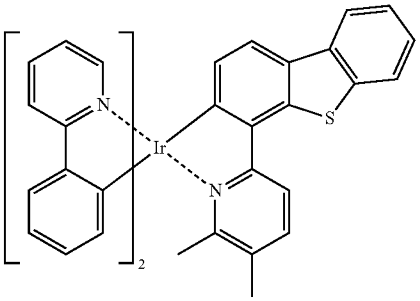
B33
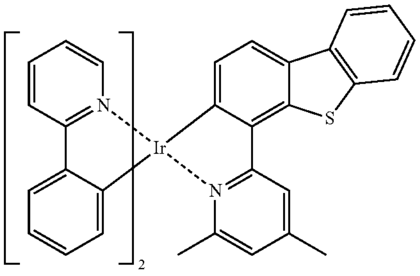
B34
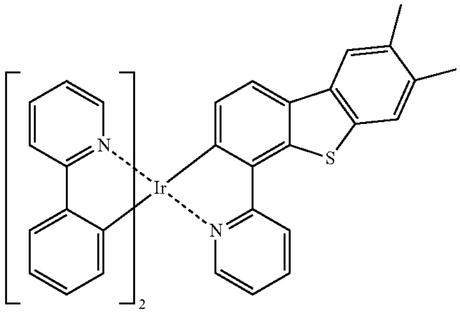
-continued
B35
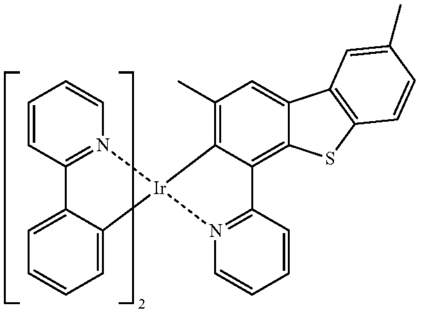
B36
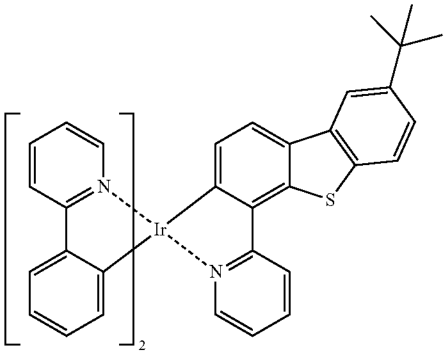
B37
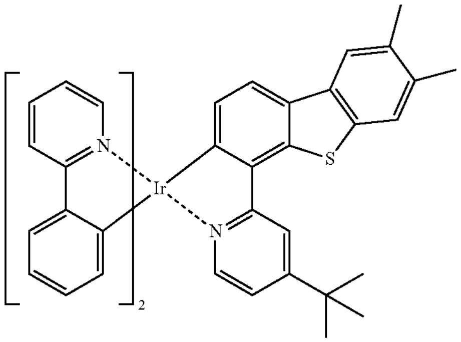
B38
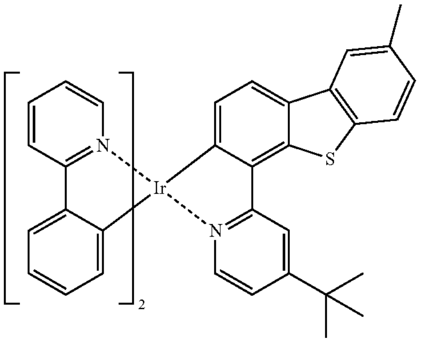

-continued
B39
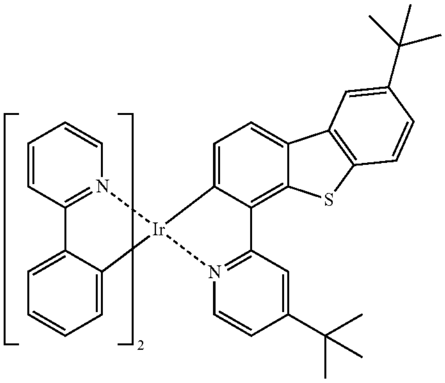
B40
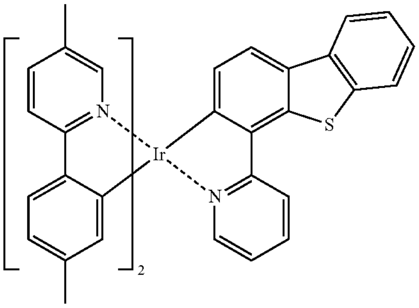
B41
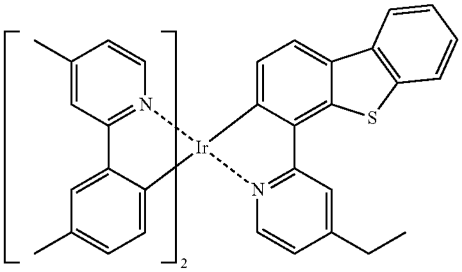
B42
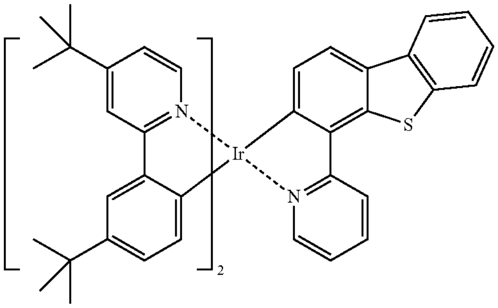
B43
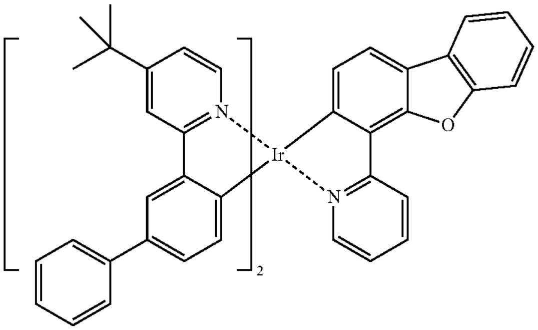
-continued
B44
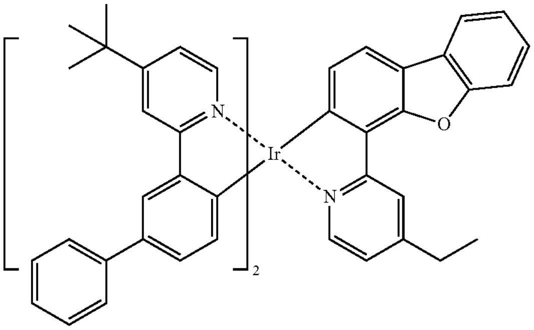
B45
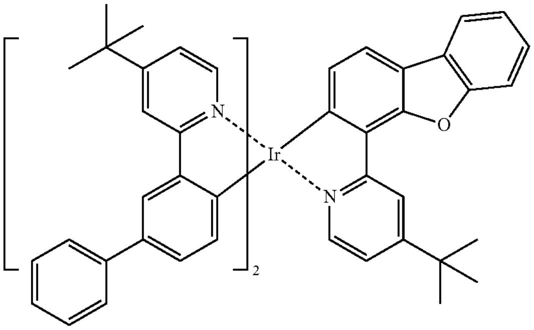
B46
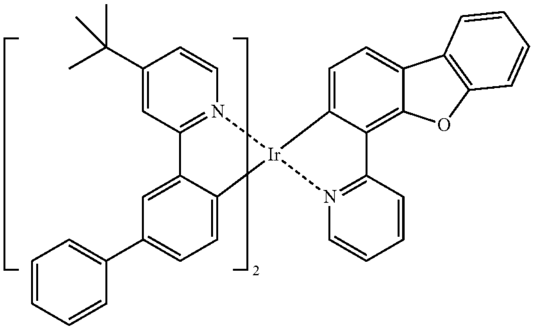
B47
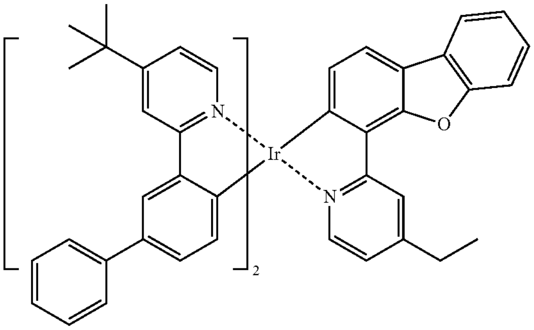

-continued
B48
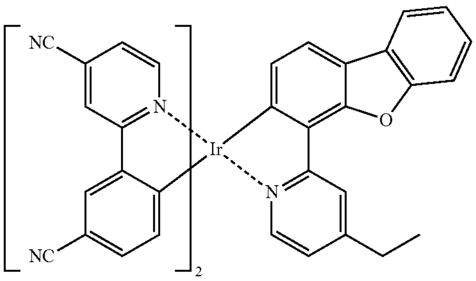
B49
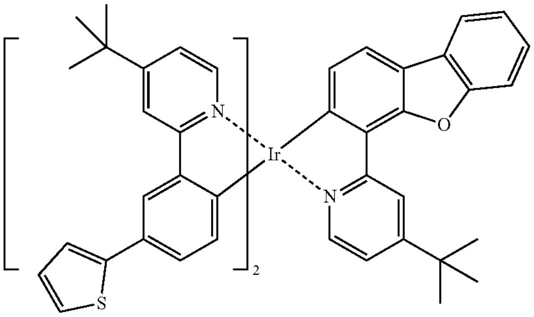
B50
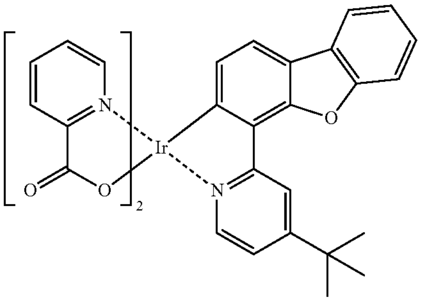
B51
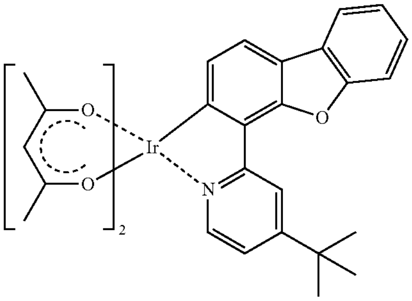
B52
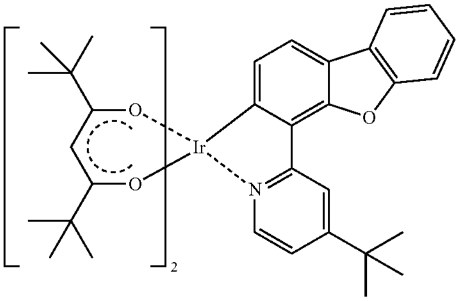
-continued
C1
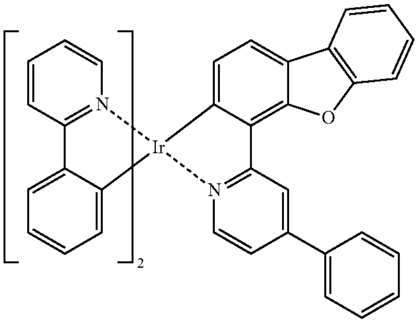
C2
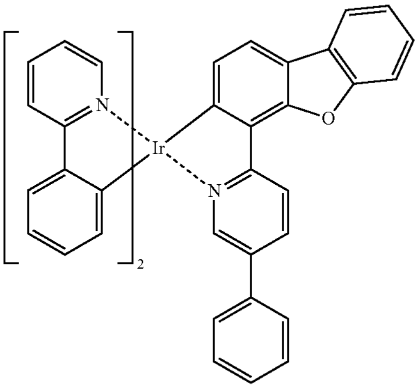
C3
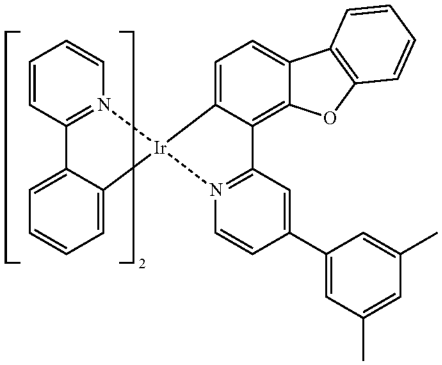
C4
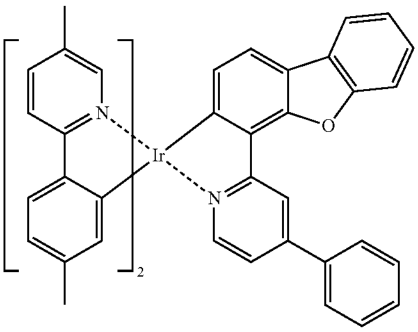

-continued
C5
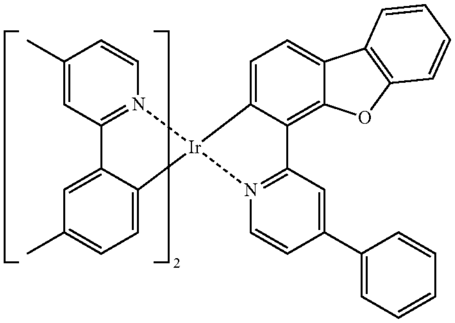
C6
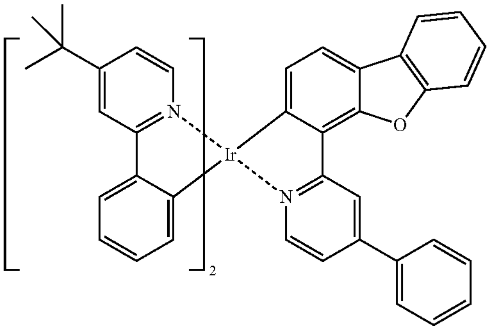
C7
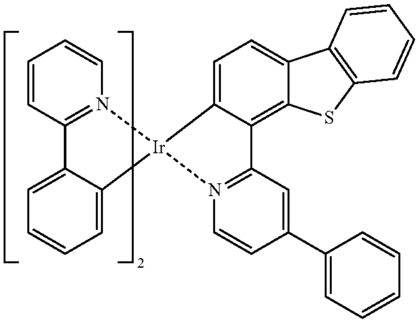
C8
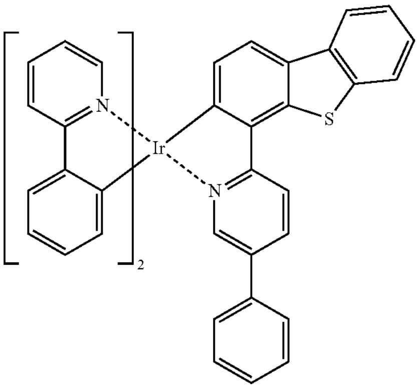
-continued
C9
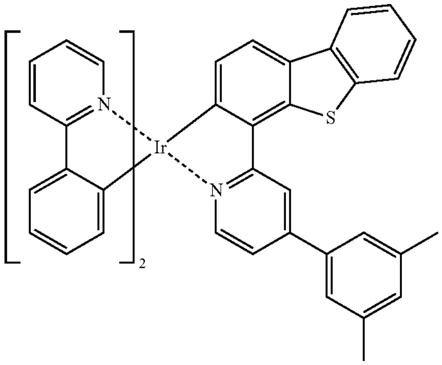
C10
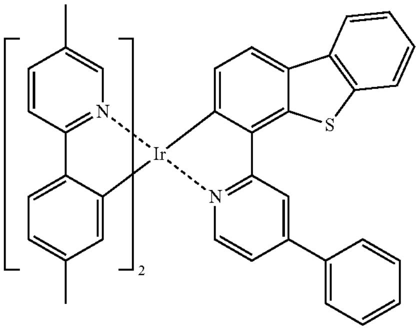
C11
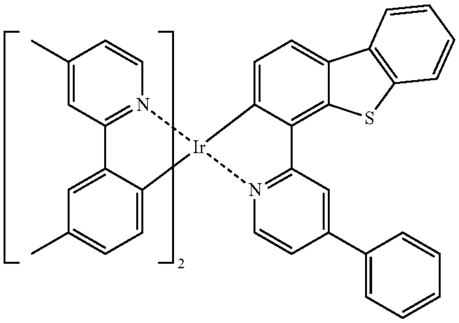
C12
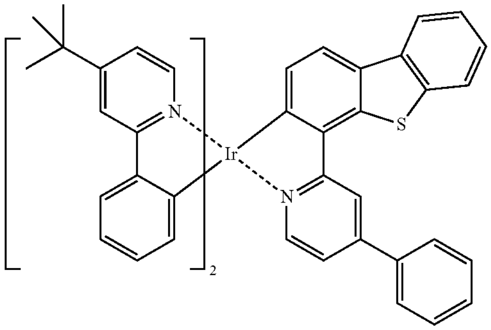

-continued

C13

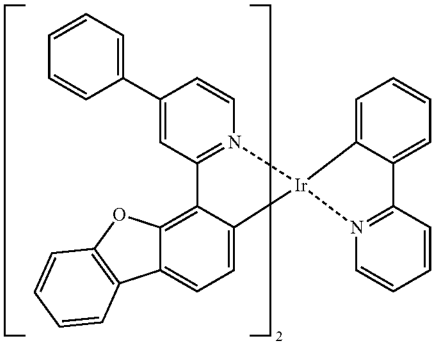

C14

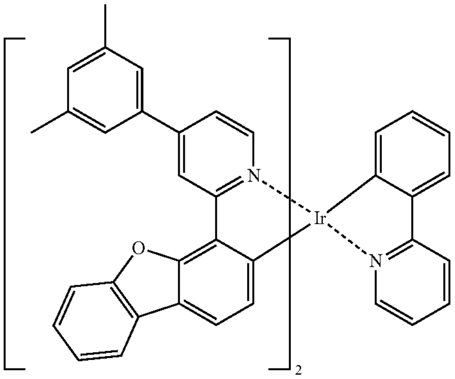

C15

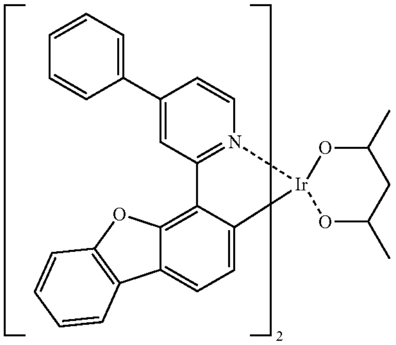

C16

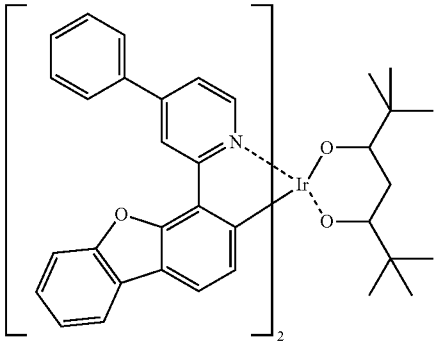

An exemplary compound belonging to the group A is an iridium complex with m=2 in the general formula [1] and is an iridium complex coordinated by two ligands with a dibenzofuran ring or a dibenzothiophene ring. The emission wavelength of these compounds is in the green color gamut. The use of these compounds (iridium complexes) can provide a light-emitting element in the green color gamut with a maximum emission wavelength in the range of 500 to 565 nm in the emission spectrum.

An exemplary compound belonging to the group B is an iridium complex with m=1 in the general formula [1] and is an iridium complex coordinated by one ligand with a dibenzofuran ring or a dibenzothiophene ring. The emission wavelength of these compounds is in the green color gamut. Due to one ligand with a dibenzofuran ring or a dibenzothiophene ring, the molecular structure has a lower molecular weight and is advantageous for vapor deposition. The use of these compounds can provide a light-emitting element in the green color gamut with a maximum emission wavelength in the range of 500 to 565 nm in the emission spectrum.

An exemplary compound belonging to the group C is an iridium complex with an aryl group bonded to the pyridine ring bonded to the dibenzofuran ring or the dibenzothiophene ring in the general formula [1] (any one of $R_7$ to $R_{10}$ denotes the aryl group). The emission wavelength of these compounds is in a yellow-green to yellow color gamut. The use of these compounds can provide a light-emitting element in the yellow-green to yellow color gamut with a maximum emission wavelength in the range of 565 to 590 nm in the emission spectrum.

In particular, the following compounds can be used.

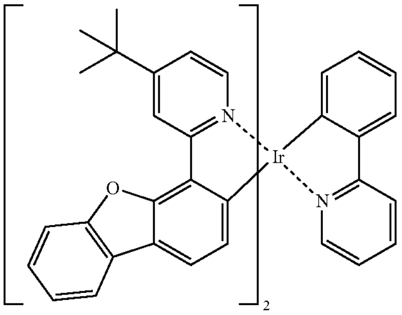

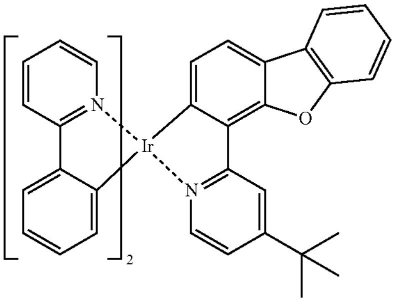

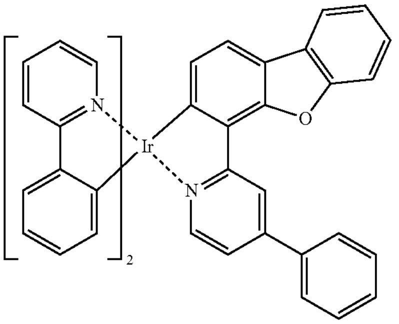

-continued

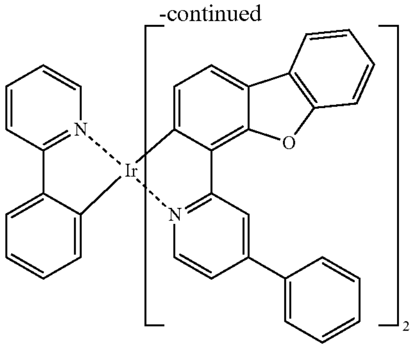

3. Host Material (Hydrocarbon Compound)

In general, a light-emitting material with an extended conjugate plane easily overlaps a host and causes large intermolecular interaction. This can result in the formation of an exciplex and reduce luminescence efficiency and durability. A carbon-carbon bond of a compound serving as a host has higher bonding strength than a carbon-nitrogen bond. For example, for 4,4'-di(9H-carbazol-9-yl)-1,1'-biphenyl (CBP), the carbon-nitrogen bond energy calculated using b3-lyp/def2-SV(P) is 3.86 eV (calculated value), as described below. On the other hand, the carbon-carbon bond energy is 5.04 eV (calculated value). Thus, the host can be composed only of a hydrocarbon compound, which is considered to have high luminescence efficiency and durability.

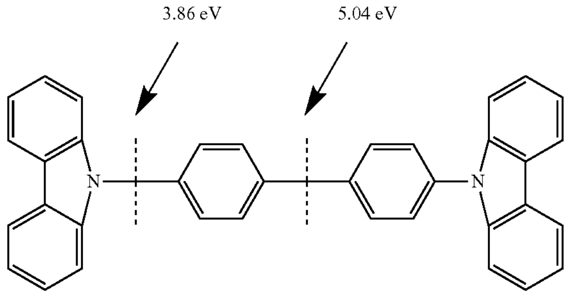

A hydrocarbon compound used as a host can be used under the following conditions.

3-1. The host material has at least one of a triphenylene ring, a phenanthrene ring, a chrysene ring, and a fluoranthene ring as a backbone.

3-2. The host material has no $sp^3$ carbon.

3-1. The Host Material has at Least One of a Triphenylene Ring, a Phenanthrene Ring, a Chrysene Ring, and a Fluoranthene Ring as a Backbone.

It is known that triplet energy utilized in a phosphorescent element is transferred by the Dexter mechanism. The Dexter mechanism includes energy transfer by intermolecular contact. More specifically, the intermolecular distance between a host material and a guest material is shortened for efficient energy transfer from the host material to the guest material.

In the present disclosure, the use of a relatively flat material as a host material shortens the intermolecular distance between a compound represented by the general formula [1] and the host material and promotes more efficient energy transfer from the host to the compound represented by the general formula [1]. Consequently, a highly efficient organic light-emitting element can be provided. Examples of the relatively flat structure include a triphenylene ring, a phenanthrene ring, a chrysene ring, and a fluoranthene ring. Using a compound with at least one of these structures as a host material, a compound represented by the general formula [1] can provide a more efficient light-emitting element.

3-2. The Host Material has no $sp^3$ Carbon.

As described in the description 3-1, a compound represented by the general formula [1] is a compound with emission properties improved via the distance from the host material. A host material with no $sp^3$ carbon can shorten the distance from a compound represented by the general formula [1].

A basic skeleton composed. only of $sp^2$ carbon atoms is considered to have a small structural change from the ground state to the charge accumulation state and the excited state. Thus, even in an unstable cationic state due to an electric charge injected from an electrode, the polycyclic aromatic hydrocarbon compound tends to be resistant to degradation. According to Stephen (Reference: ACCOUNTS OF CHEMICAL RESEARCH VOL. 36, No. 4, p. 255, 2003), a single carbon bond is 3.9 eV, and a double carbon bond is 7.5 eV. Thus, the double bond has a higher bond energy. This also shows that a compound. composed only of $sp^2$ carbon atoms is a stable compound in terms of chemical bond.

Specific examples of the host material include, but are not limited to, the following.

AA1

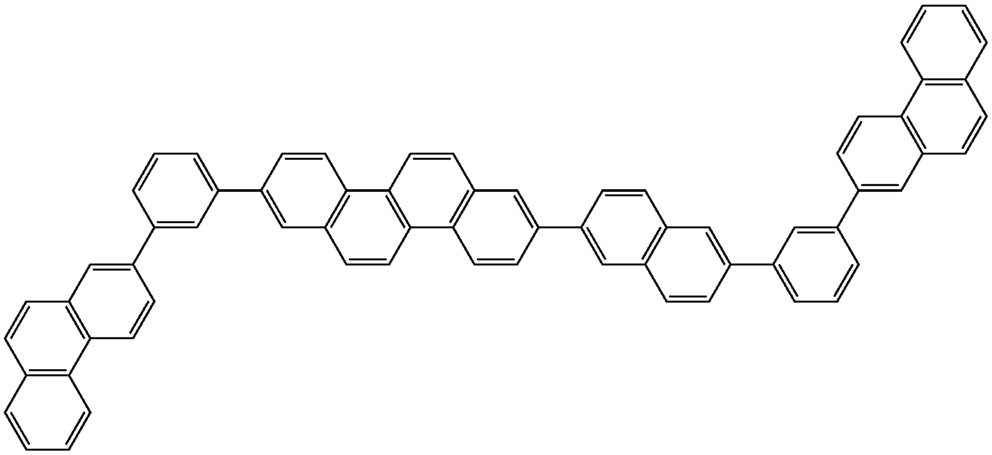

-continued
AA2
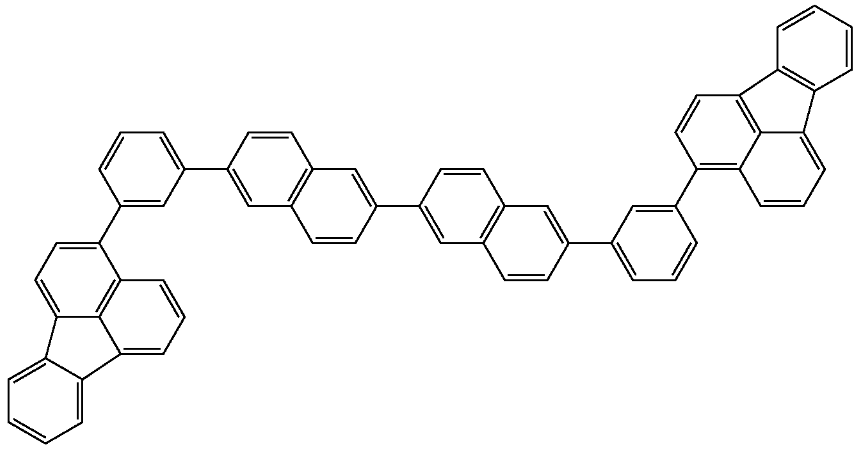
AA3
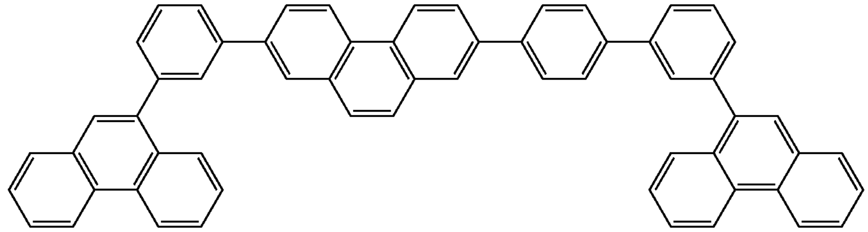
AA4
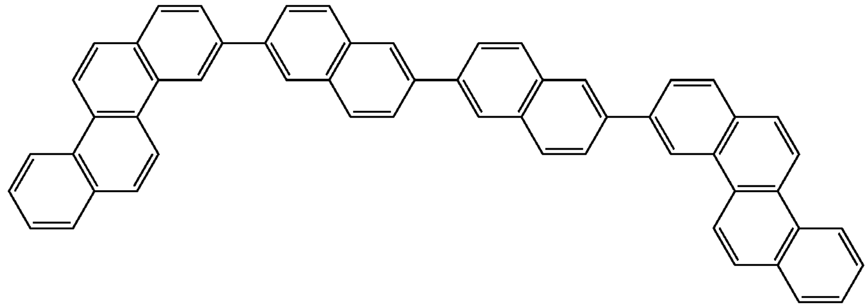
AA5
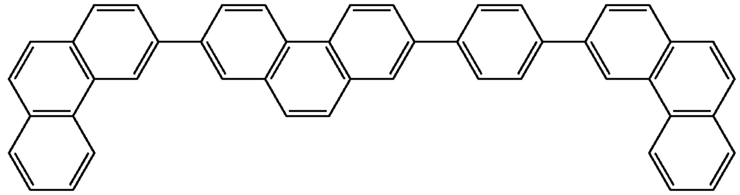
AA6
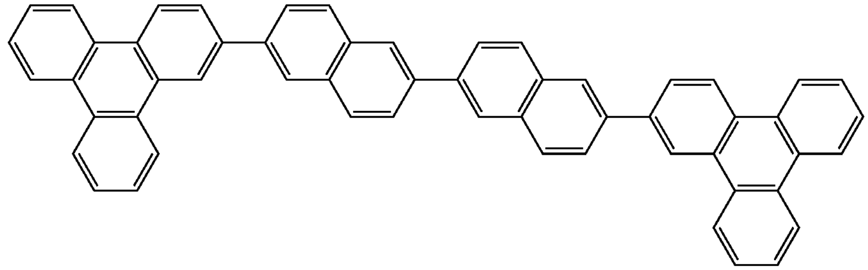

-continued
AA7
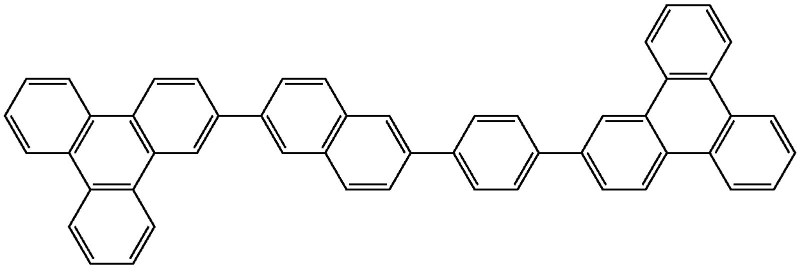
AA8
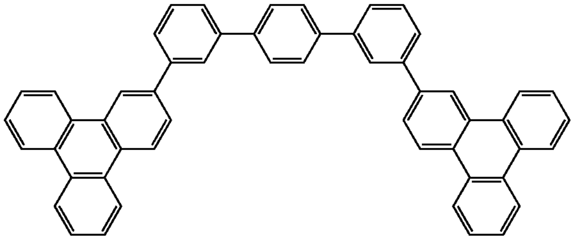
AA9
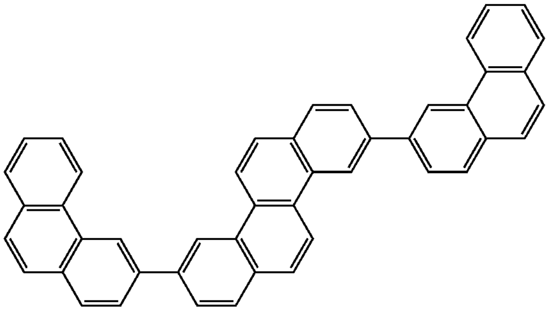
AA10
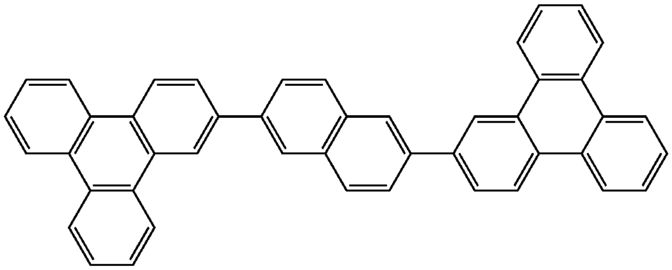
AA11
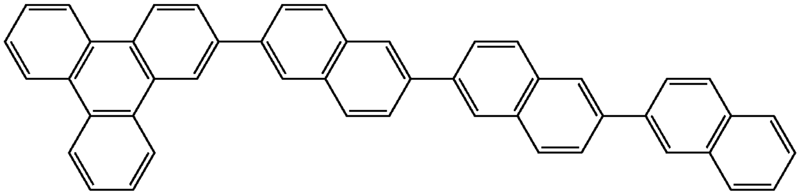
AA12
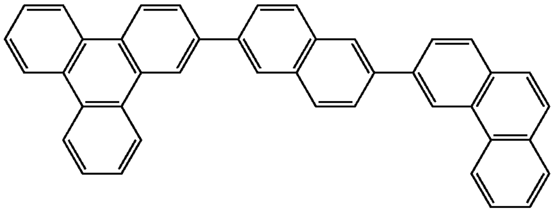
AA13
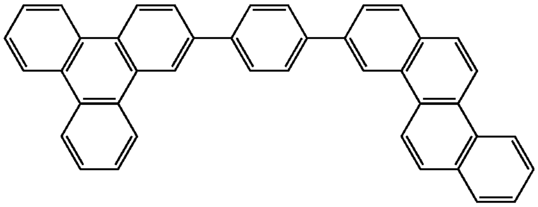
AA14
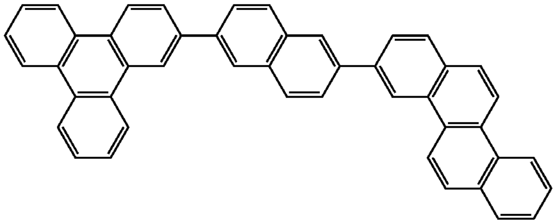
AA15
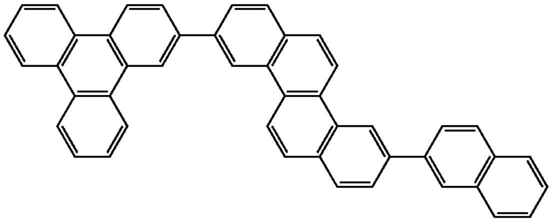

-continued
AA16
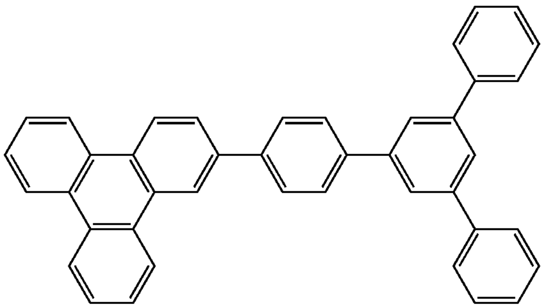
AA17
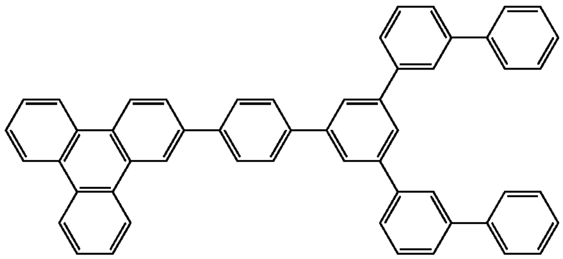
AA18
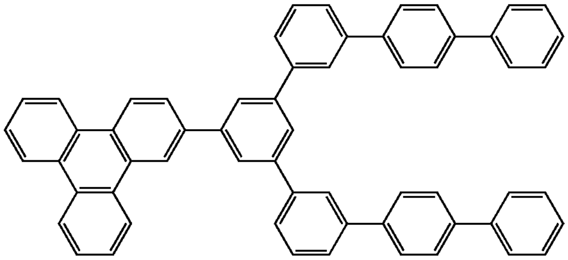
AA19
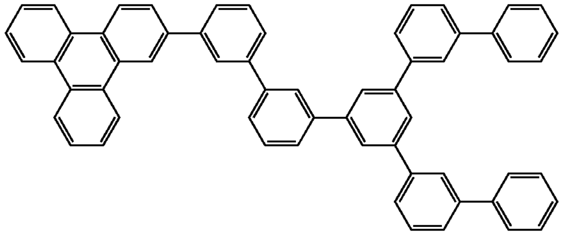
AA20
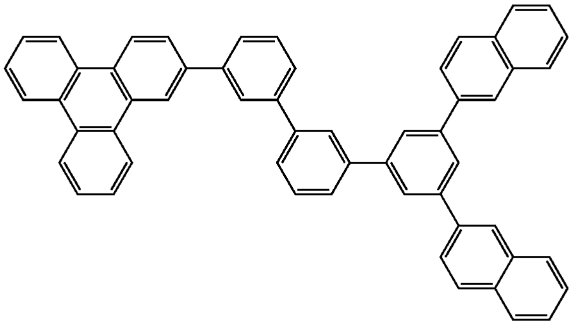
AA21
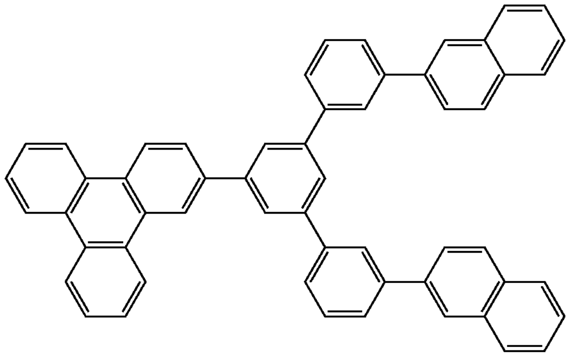
AA22
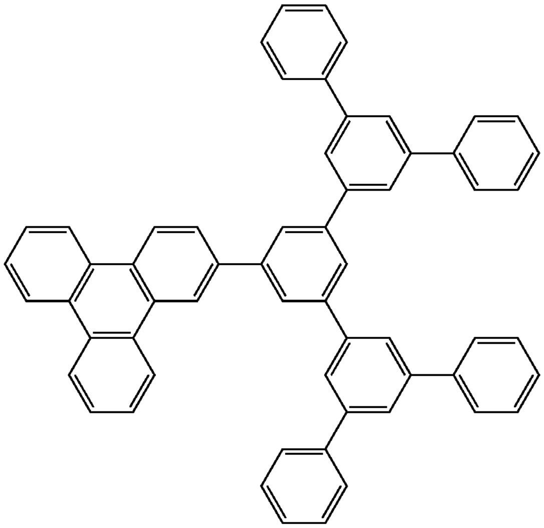
AA23
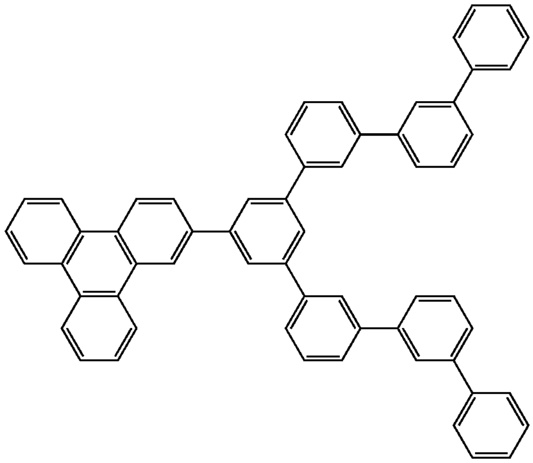

-continued
AA24
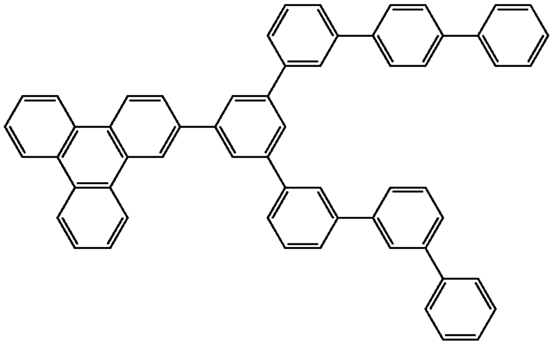
AA25
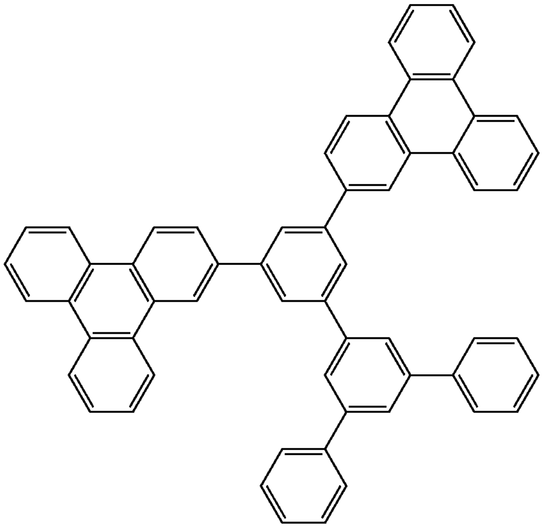
AA26
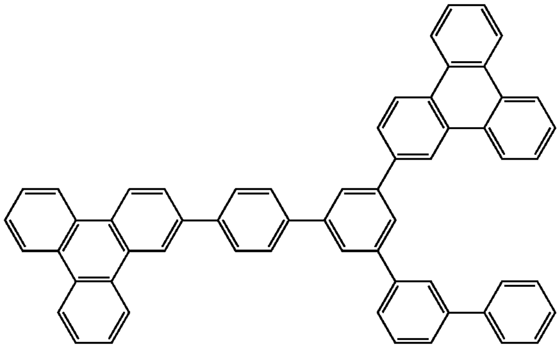
AA27
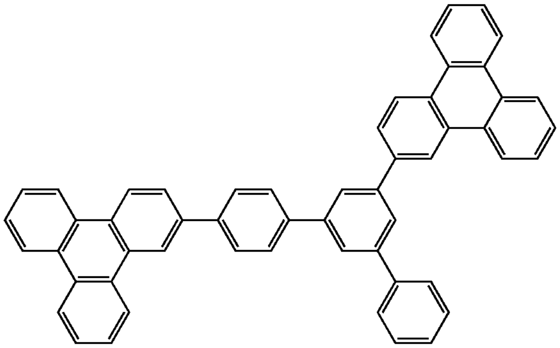
AA28
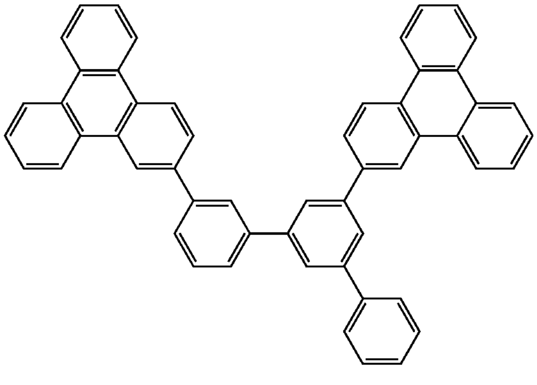
AA29
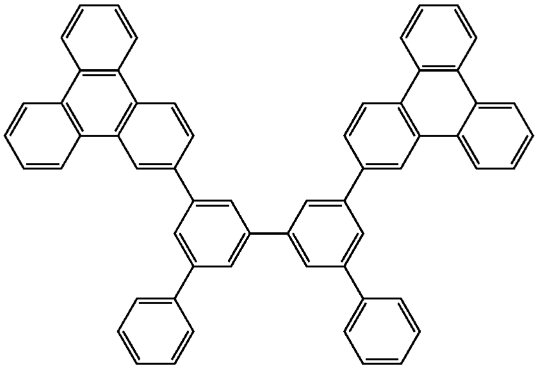

-continued
AA30
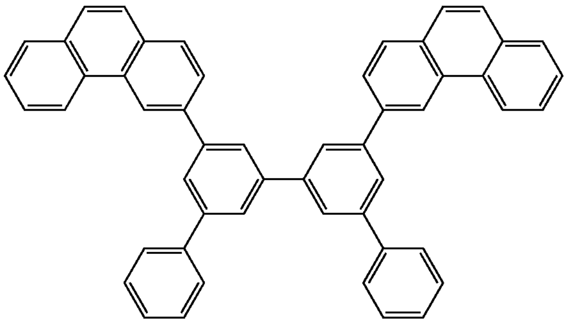
AA31
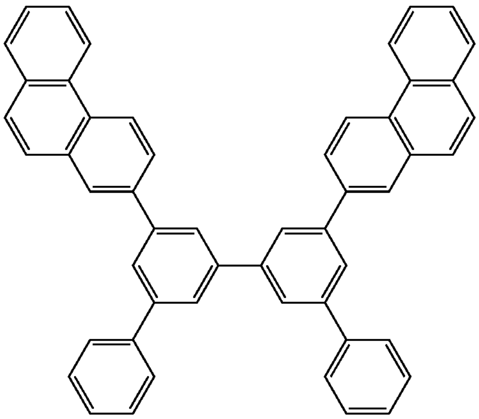
AA32
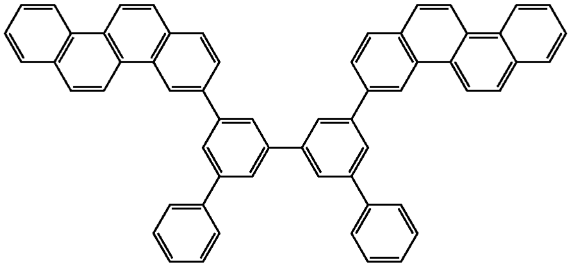
AA33
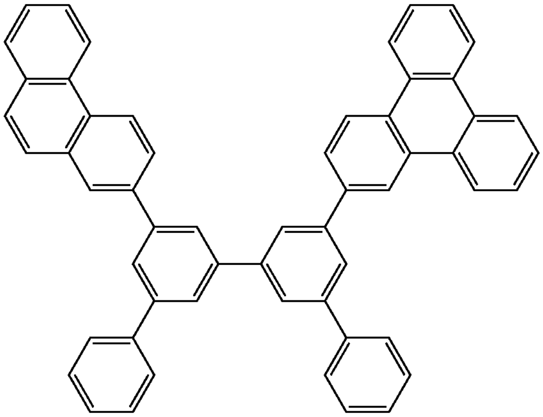
AA34
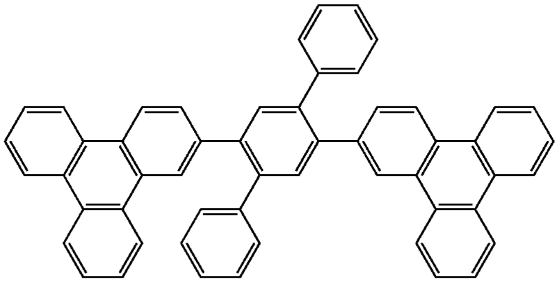
AA35
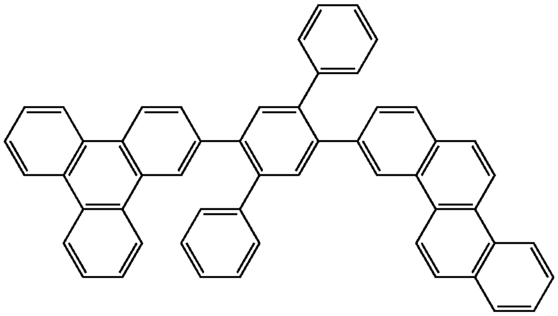
AA36
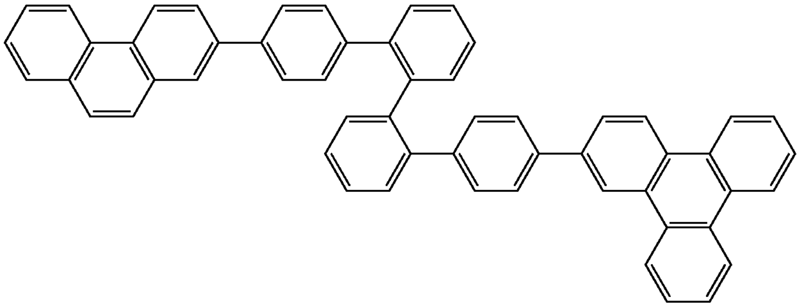

-continued

AA37

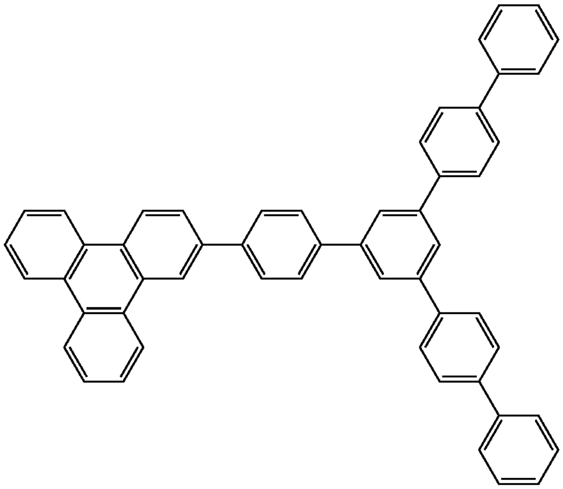

AA38

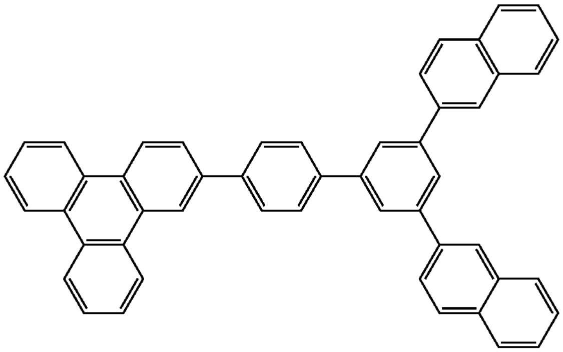

AA39

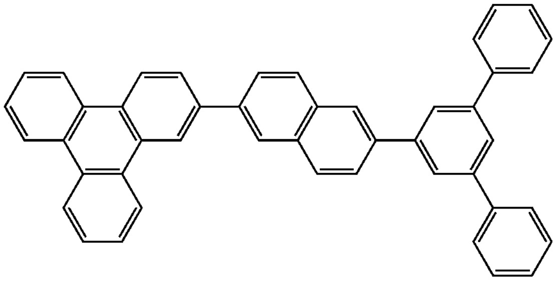

AA40

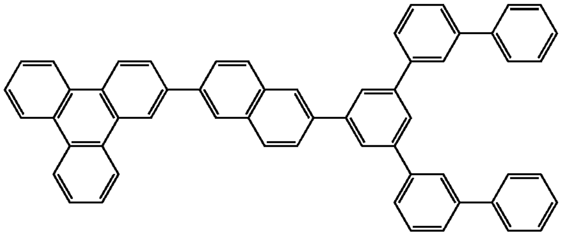

AA41

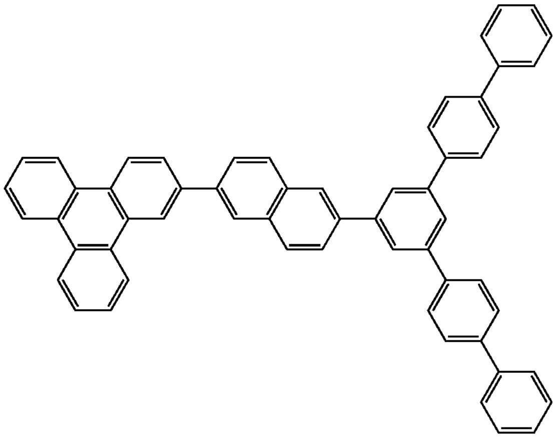

AA42

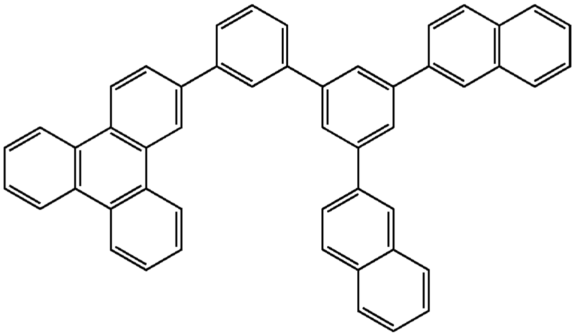

These exemplary compounds are compounds that have at least one of a triphenylene ring, a phenanthrene ring, a chrysene ring, and a fluoranthene ring as a backbone and that have no $sp^3$ carbon, Thus, these compounds can more closely approach a compound represented by the general formula [1] and therefore are host materials for efficient energy transfer to the compound represented by the general formula [1].

4. Assist Material

The assist material has a lower lowest unoccupied molecular orbital (LUMO) level than the host material (farther from the vacuum level). The assist material is a material with the following feature 4-2 and can be a material with the following features 4-1 and 4-3.

4-1. A material with a higher (shallower) highest occupied molecular orbital (HOMO) level than the host.

4-2. A material with a lower (deeper) LUMO level than the host.

4-3. A material with a higher HOMO level than the host and a lower LUMO level than the host.

Due to the shallow HOMO level, a material with the feature 4-1 facilitates hole injection and transport into a light-emitting layer. This can reduce the voltage of the element, prevent a light-emitting material from being in an excessively anionic state, and extend the life.

A material with the feature 4-2 provides a long-life element for the following reasons. That is, because a host material has a shallower LUMO level (higher energy) than a light-emitting material, the addition of an assist material with a deeper LUMO level than the host can prevent the light-emitting material from being in an excessively anionic state. This is because the LUMO level of an iridium complex represented by the general formula [1] functions as a strong trap level for electrons injected into the light-emitting layer, so that an excessively anionic state is formed. To solve this problem, a material with the feature 4-2, particularly an assist material with a level between the LUMO level of the host material and the LUMO level of an iridium complex represented by the general formula [1], is added. This contributes significantly to improvements in emission properties and the life of the element.

A material with the feature 4-3 can improve the hole injection properties and relax electron trapping by a light-emitting material, and can therefore extend the life.

The assist material can be a compound partially having any one of the following structures:

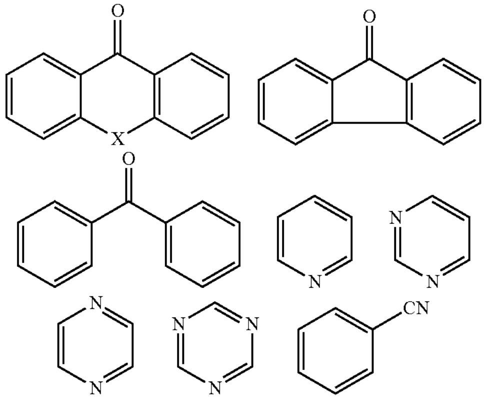

(In the structures, X denotes an oxygen atom, a sulfur atom, or a substituted or unsubstituted carbon atom.)

These structures may be unsubstituted or substituted. A carbon atom represented by X may be unsubstituted or substituted. Examples of substituents include a halogen atom, an alkyl group, an alkoxy group, an aryloxy group, a heteroaryloxy group, an aryl group, a heterocyclic group, a silyl group, and an amino group.

Examples of the halogen atom include, but are not limited to, fluorine, chlorine, bromine, and iodine.

Examples of the alkyl group include, but are not limited to, a methyl group, an ethyl group, a n-propyl group, an isopropyl group, a n-butyl group, a t-butyl group, a sec-butyl group, an octyl group, a cyclohexyl group, a 1-adamantyl group, and a 2-adamantyl group.

Examples of the alkoxy group include, but are not limited to, a methoxy group, an ethoxy group, a propoxy group, a 2-ethyl-octyloxy group, and a benzyloxy group.

Examples of the aryloxy group include, but are not limited to, a phenoxy group and a naphthoxy group.

Examples of the heteroaryloxy group include, but are not limited to, a furanyloxy group and a thienyloxy group.

Examples of the aryl group include, but are not limited to, a phenyl group, a naphthyl group, an indenyl group, a biphenyl group, a terphenyl group, a fluorenyl group, a phenanthryl group, a triphenylenyl group, a pyrenyl group, an anthranyl group, a perylenyl group, a chrysenyl group, and a fluoranthenyl group.

Examples of the heterocyclic group include, but are not limited to, a pyridyl group, a pyrimidyl group, a pyrazyl group, a triazyl group, a benzofuranyl group, a benzothiophenyl group, a dibenzofuranyl group, a dibenzothiophenyl group, an oxazolyl group, an oxadiazolyl group, a thiazolyl group, a thiadiazolyl group, a carbazolyl group, an acridinyl group, and a phenanthrolyl group.

Examples of the silyl group include, but are not limited to, a trimethylsilyl group and a triphenylsilyl group.

Examples of the amino group include, but are not limited to, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-t-butylphenyl)amino group, an N-phenyl-N-(4-trifluoromethylphenyl)amino group, an N-piperidyl group, a carbazolyl group, and an acridyl group.

Examples of optional substituents of the alkyl group, the alkoxy group, the amino group, the aryl group, the heterocyclic group, the aryloxy group, and the silyl group include, but are not limited to, deuterium, alkyl groups, such as a methyl group, an ethyl group, a n-propyl group, an isopropyl group, a n-butyl group, and a t-butyl group; aralkyl groups, such as a benzyl group; aryl groups, such as a phenyl group and a biphenyl group; heterocyclic groups, such as a pyridyl group and a pyrrolyl group; amino groups, such as a dimethylamino group, a diethylamino group, a dibenzylamino group, a diphenylamino group, and a ditolylamino group; alkoxy groups, such as a methoxy group, an ethoxy group, and a propoxy group; aryloxy groups, such as a phenoxy group; halogen atoms, such as fluorine, chlorine, bromine, and iodine; and a cyano group.

Specific examples of the assist material include, but are not limited to, the following.

BB1

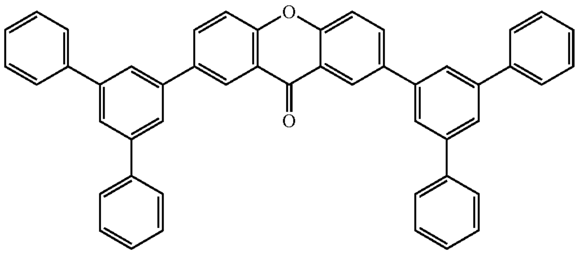

BB2

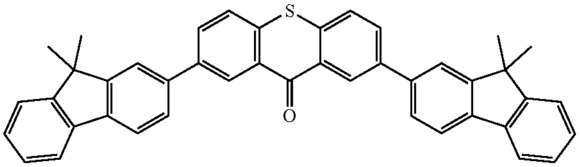

BB3

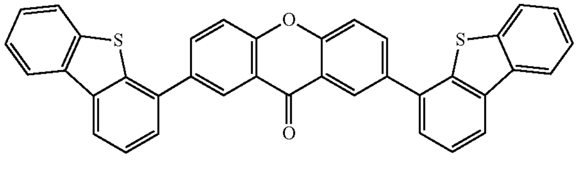

-continued
BB4
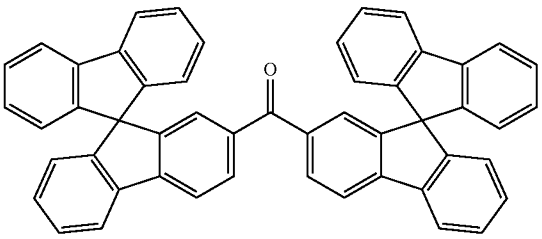
BB5
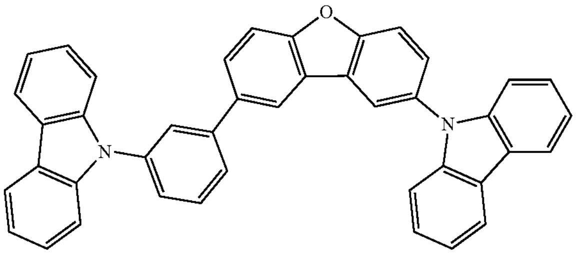
BB6
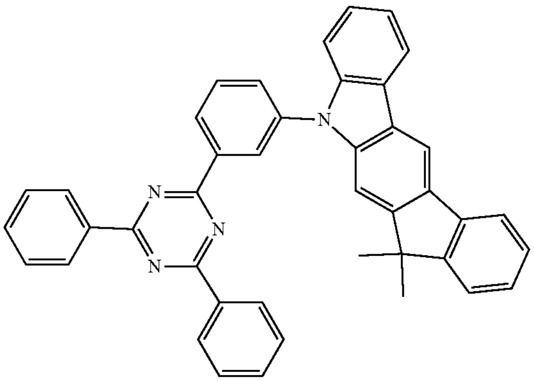
BB7
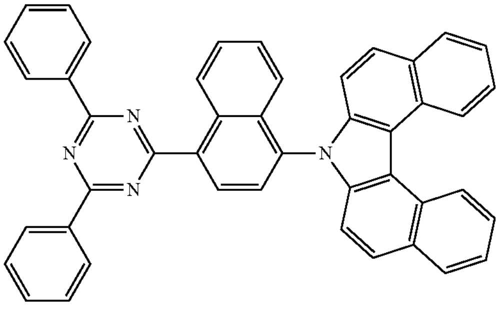
BB8
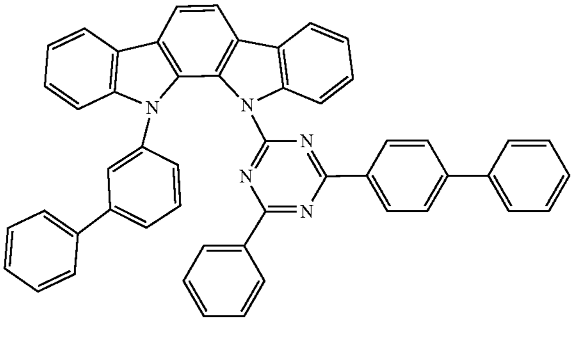
-continued
BB9
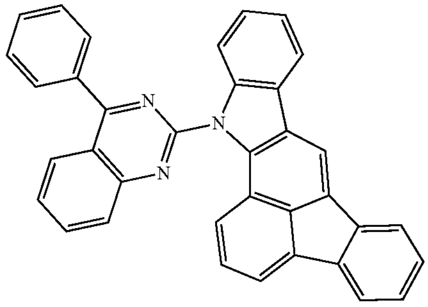
BB10
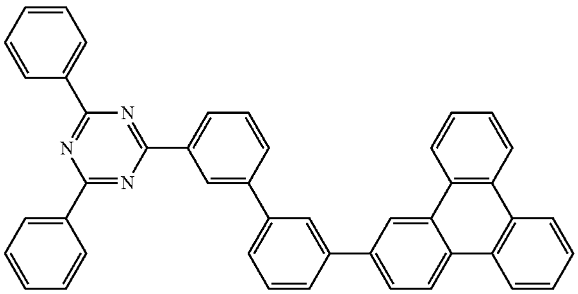
BB11
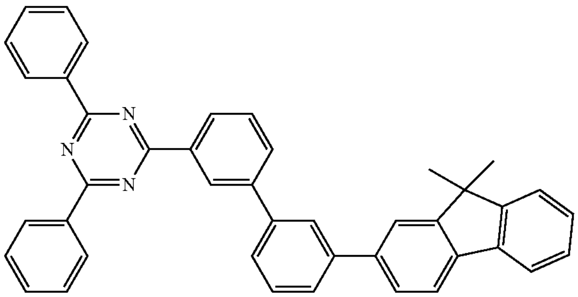
BB12
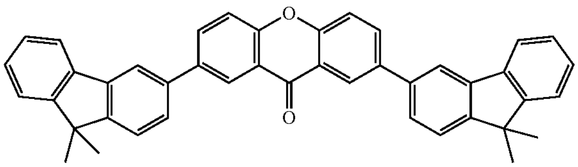
BB13
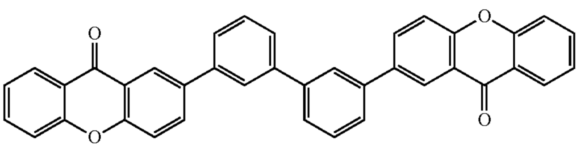
BB14
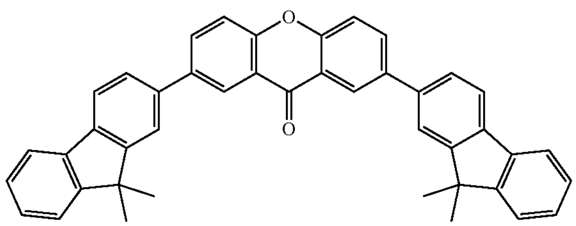

-continued
BB15
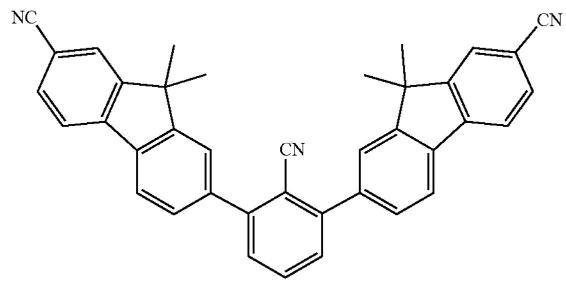
BB16
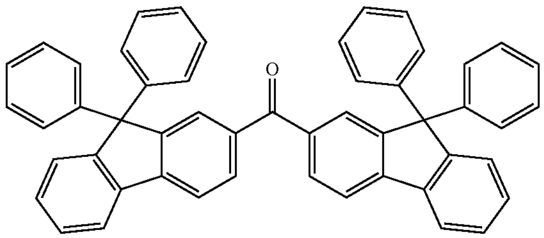
BB17
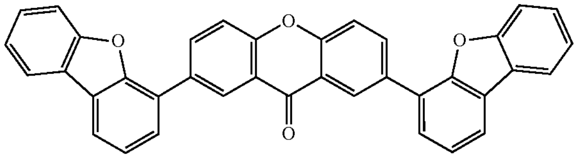
BB18
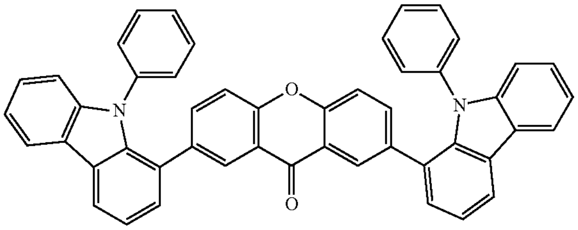
BB19
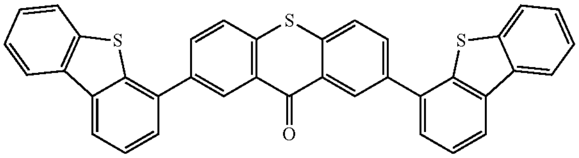
BB20
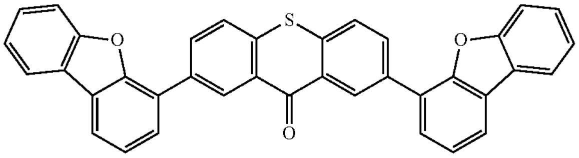
BB21
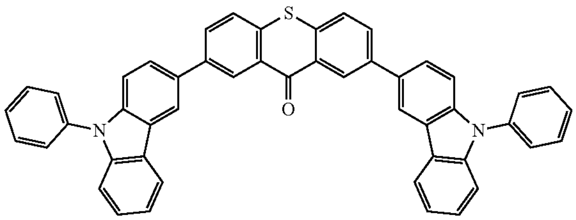
-continued
BB22
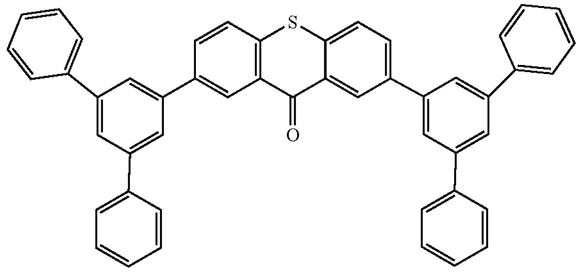
BB23
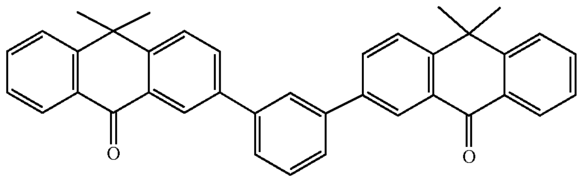
BB24
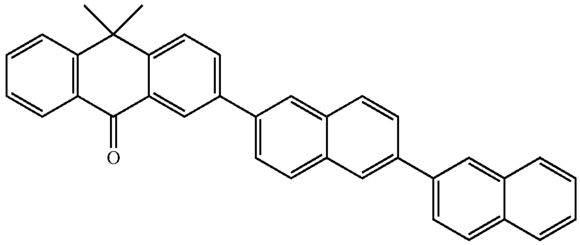
BB25
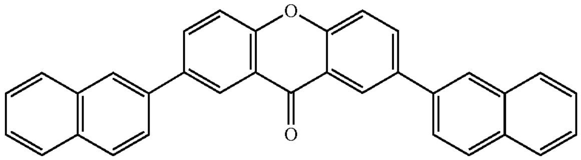
BB26
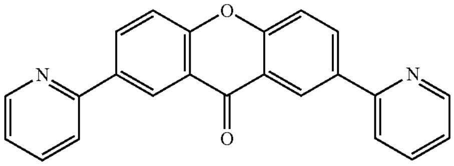
BB27
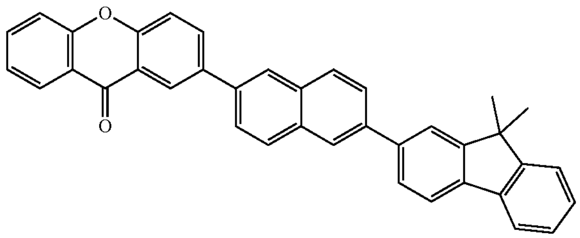
BB28
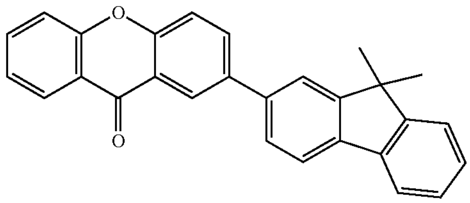

-continued

BB29

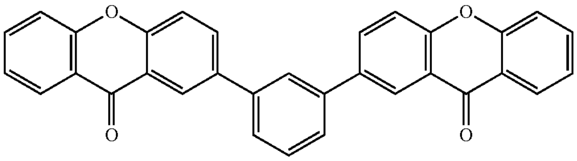

BB30

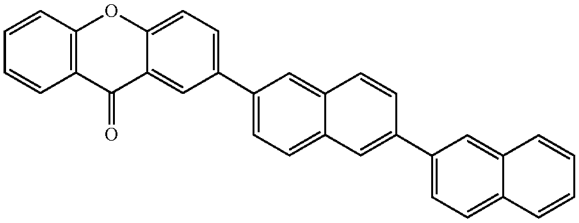

BB31

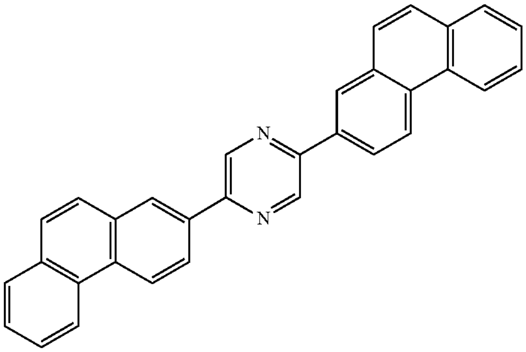

BB32

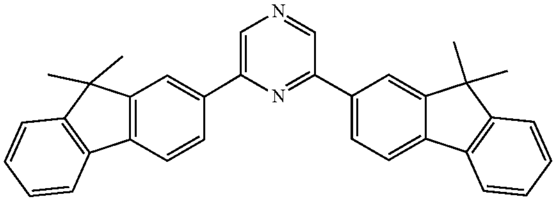

BB33

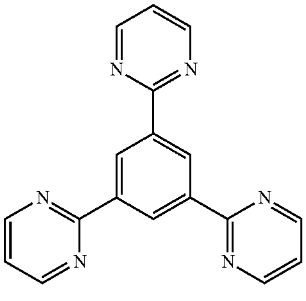

-continued

BB34

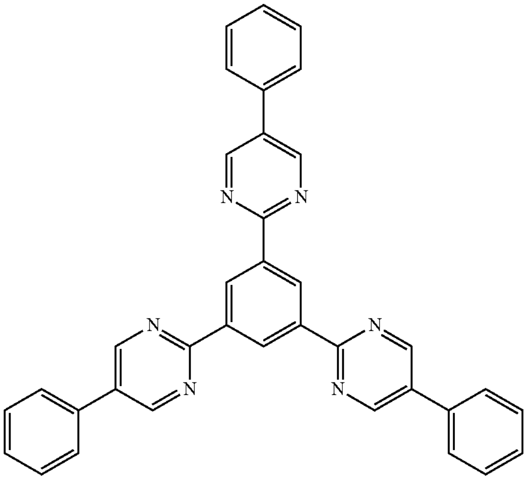

BB35

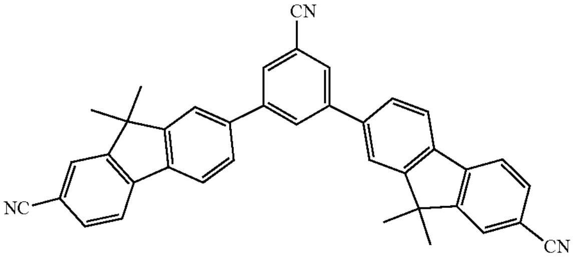

BB36

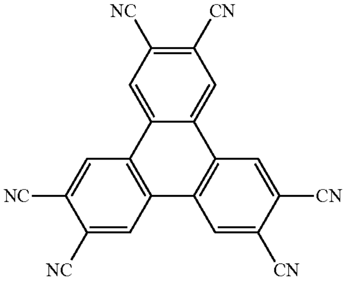

5. Other Constituent Materials

As described above, in an organic light-emitting element according to the present disclosure, the light-emitting layer contains at least an iridium complex represented by the general formula [1], a host material, and an assist material. In the present disclosure, in addition to these compounds, known low-molecular-weight and high-molecular-weight materials may be used as required. More specifically, a hole-injection/transport material, a host, an assist material, or an electron-injection/transport material can be used together with the iridium complex and the hydrocarbon compound.

An organic light-emitting element according to the present embodiment includes at least a first electrode, a second electrode, and an organic compound layer between these electrodes. One of the first electrode and the second electrode is a positive electrode, and the other is a negative electrode. In the organic light-emitting element according to the present embodiment, the organic compound layer may be a single layer or a laminate of a plurality of layers, provided that the organic compound layer has a light-emitting layer. When the organic compound layer is a laminate of a plurality of layers, the organic compound layer may have a hole-injection layer, a hole-transport layer, an electron-blocking layer, a hole/exciton-blocking layer, an electron-transport layer, and/or an electron-injection layer, in addition to the light-emitting layer. The light-emitting layer may be a single layer or a laminate of a plurality of layers.

In the organic light-emitting element according to the present embodiment, at least one organic compound layer contains a compound represented by the general formula [1]. More specifically, a compound represented by the general formula [1] is contained in one of the light-emitting layer, the hole-injection layer, the hole-transport layer, the electron-blocking layer, the hole/exciton-blocking layer, the electron-transport layer, the electron-injection layer, and the like. A compound represented by the general formula [1] can be contained in the light-emitting layer.

In the organic light-emitting element according to the present embodiment, when the light-emitting layer contains a compound represented by the general formula [1], the light-emitting layer may be a layer composed only of the compound represented by the general formula [1] or a layer composed of the compound represented by the general formula [1] and another compound. For a light-emitting layer composed of a compound represented by the general formula [1] and another compound, the compound represented by the general formula [1] may be used as a host or a guest of the light-emitting layer. The compound may also be used as an assist material that may be contained in the light-emitting layer. The host is a compound with the highest mass ratio among the compounds constituting the light-emitting layer. The guest is a compound that has a lower mass ratio than the host among the compounds constituting the light-emitting layer and that is a principal light-emitting compound. The assist material is a compound that has a lower mass ratio than the host among the compounds constituting the light-emitting layer and that assists the guest in emitting light. The assist material is also referred to as a second host. The host material may also be referred to as a first compound, and the assist material may also be referred to as a second compound.

When a compound represented by the general formula [1] is used as a guest in the light-emitting layer, the concentration of the guest preferably ranges from 0.1% to 30% by mass, more preferably 1% to 30% by mass, still more preferably 1% to 15% by mass, of the entire light-emitting layer.

The present inventors have conducted various studies and have found that a compound represented by the general formula [1] can be used as a host or a guest of a light-emitting layer, particularly as a guest of the light-emitting layer, to provide an element that can efficiently emit bright light and that has very high durability. The light-emitting layer may be monolayer or multilayer or may contain a light-emitting material with another emission color to mix the emission color with the emission color of the present embodiment, green to yellow. The term "multilayer", as used herein, refers to a laminate of a light-emitting layer and another light-emitting layer. In this case, the emission color of the organic light-emitting element is not limited to green to yellow. More specifically, the emission color may be white or a neutral color. For white color emission, another light-emitting layer emits light of a color other than green to yellow, such as blue or red. Such a layer is formed by vapor deposition or coating. This is described in detail below in exemplary embodiments.

A compound represented by the general formula [1] can be used as a constituent material of an organic compound layer other than the light-emitting layer constituting the organic light-emitting element according to the present embodiment. More specifically, a compound represented by the general formula [1] may be used as a constituent material of an electron-transport layer, an electron-injection layer, a hole-transport layer, a hole-injection layer, and/or a hole-blocking layer. In this case, the emission color of the organic light-emitting element is not limited to green to yellow. More specifically, the emission color may be white or a neutral color.

If necessary, a compound represented by the general formula [1] may be used in combination with a known low-molecular-weight or high-molecular-weight hole-injection compound or hole-transport compound, host compound, light-emitting compound, electron-injection compound, or electron-transport compound. Examples of these compounds are described below.

The hole-injection/transport material can be a material with high hole mobility so that holes can be easily injected from a positive electrode and the injected holes can be transported to a light-emitting layer. Furthermore, a material with a high glass transition temperature can be used to reduce degradation of film quality, such as crystallization, in an organic light-emitting element. Examples of the low-molecular-weight or high-molecular-weight material with hole-injection/transport ability include, but are not limited to, triarylamine derivatives, aryl carbazole derivatives, phenylenediamine derivatives, stilbene derivatives, phthalocyanine derivatives, porphyrin derivatives, polyvinylcarbazole, polythiophene, and other electrically conductive polymers. The hole-injection/transport material is also suitable for an electron-blocking layer. Specific examples of compounds that can be used as hole-injection/transport materials include, but are not limited to, the following.

HT1

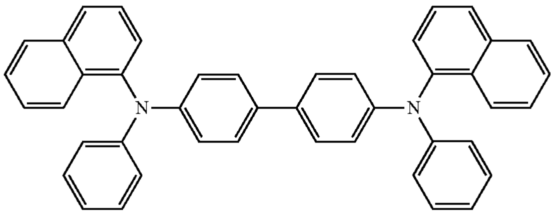

HT2

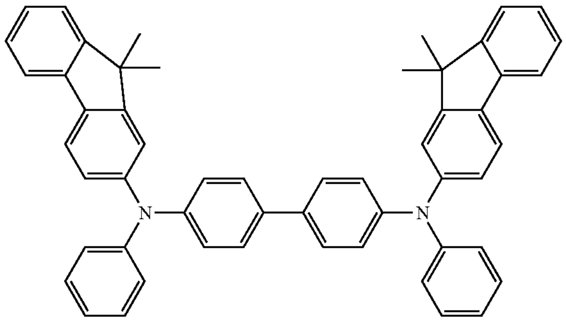

-continued
HT3
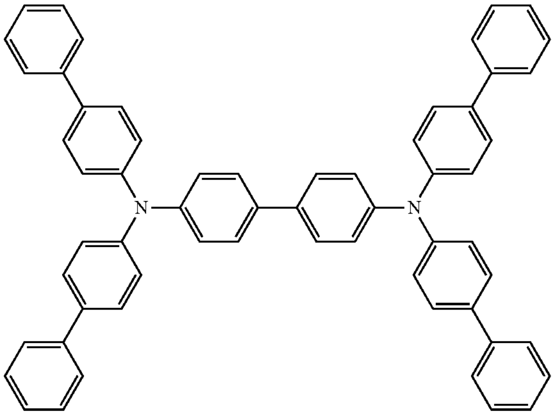
HT4
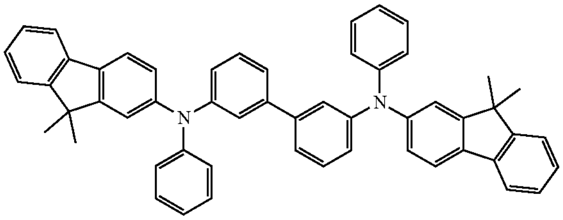
HT5
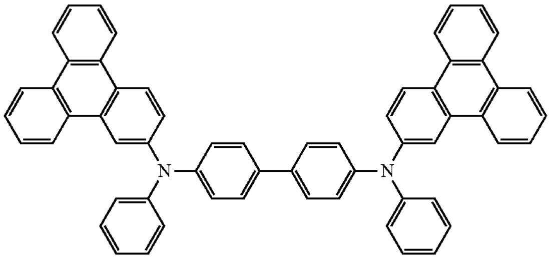
HT6
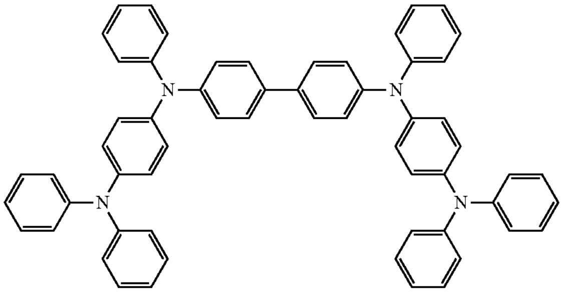
HT7
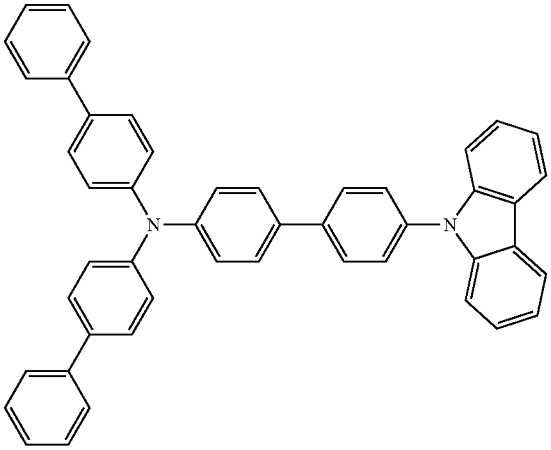
HT8
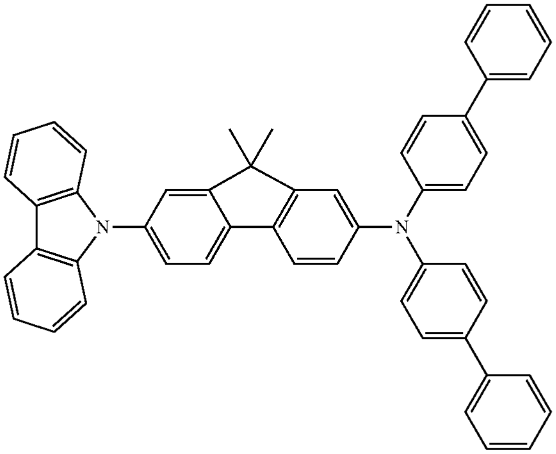

-continued
HT9
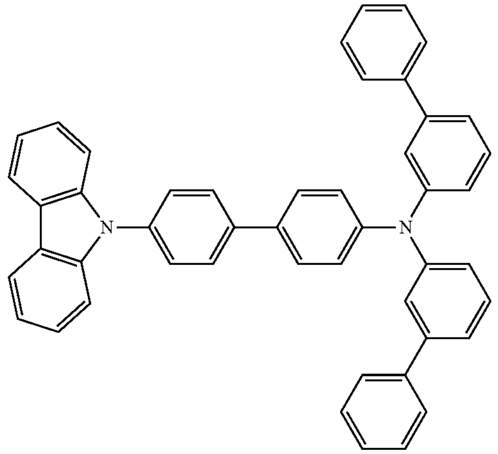
HT10
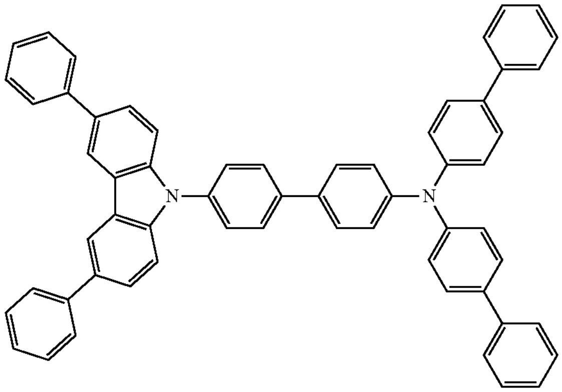
HT11
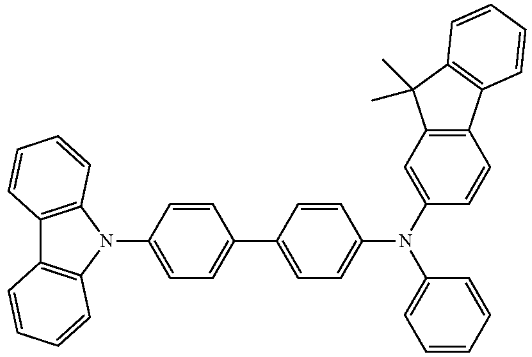
HT12
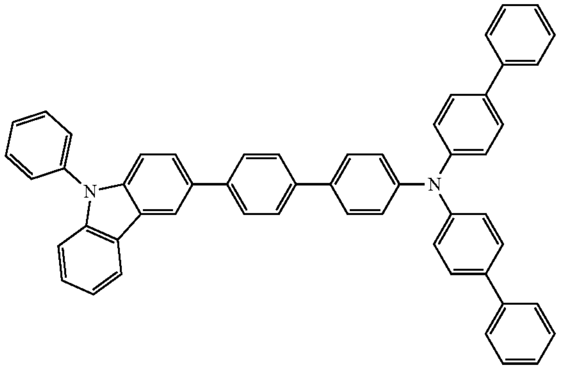
HT13
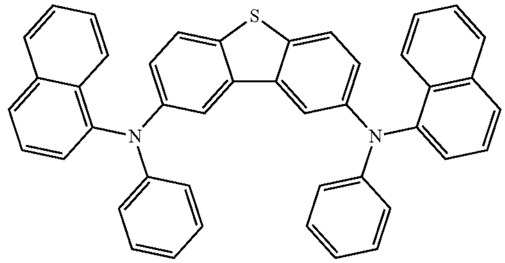
HT14
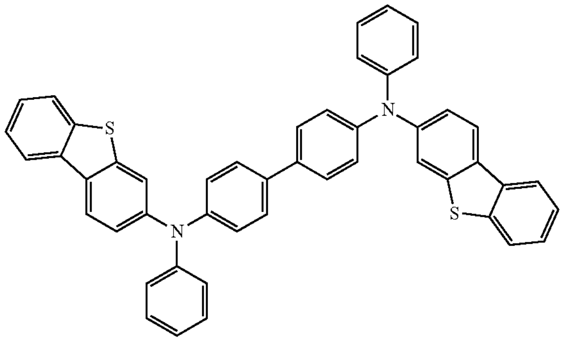
HT15
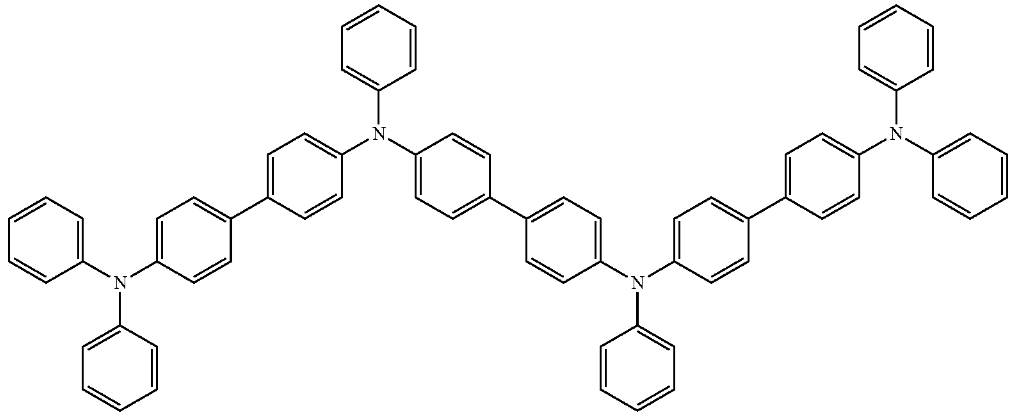

-continued

HT16

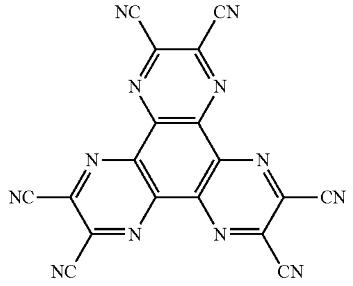

HT17

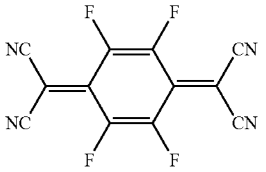

HT18

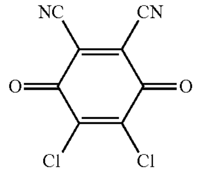

HT19

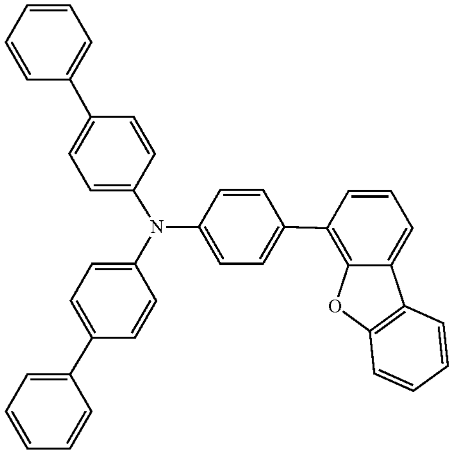

Examples of a light-emitting material mainly related to the light-emitting function include, in addition to a compound represented by the general formula [1], fused-ring compounds (for example, fluorene derivatives, naphthalene derivatives, pyrene derivatives, perylene derivatives, tetracene derivatives, anthracene derivatives, rubrene, etc.), quinacridone derivatives, coumarin derivatives, stilbene derivatives, organoaluminum complexes, such as tris(8-quinolinolato)aluminum, iridium complexes, platinum complexes, rhenium complexes, copper complexes, europium complexes, ruthenium complexes, and polymer derivatives, such as poly(phenylene vinylene) derivatives, polyfluorene derivatives, and polyphenylene derivatives. Specific examples of compounds that can be used as light-emitting materials include, but are not limited to, the following.

BD1

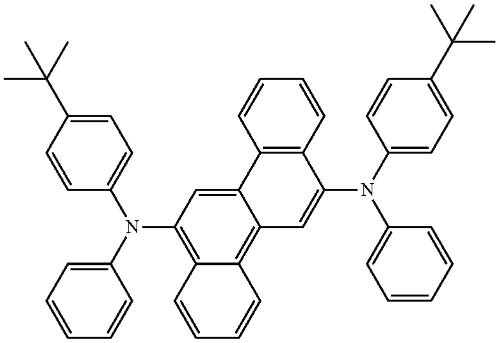

-continued

BD2

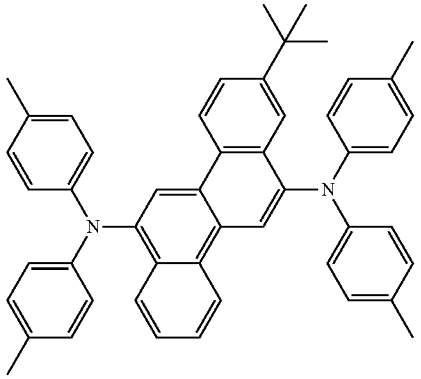

BD3

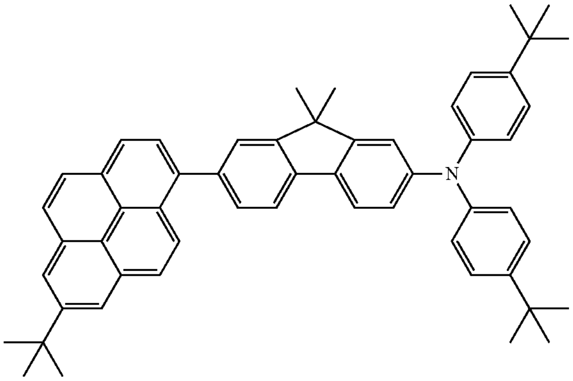

-continued
BD4
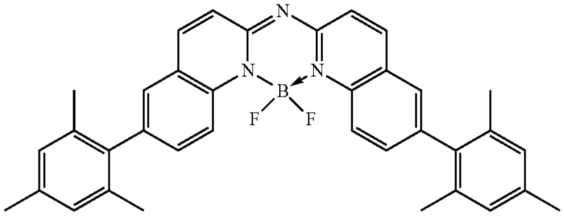
BD5
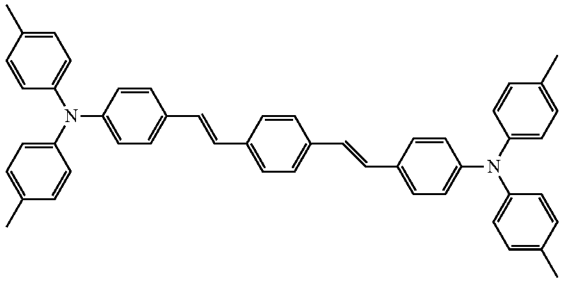
BD6
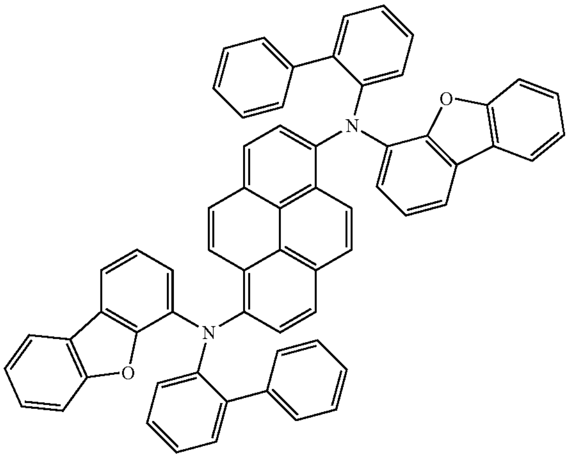
BD7
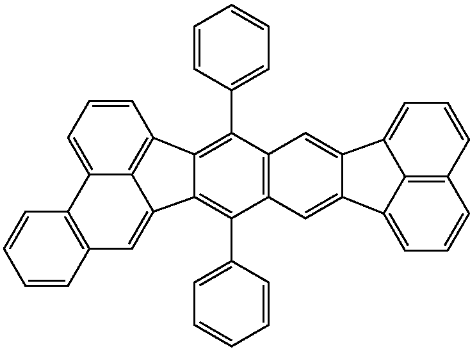
-continued
BD8
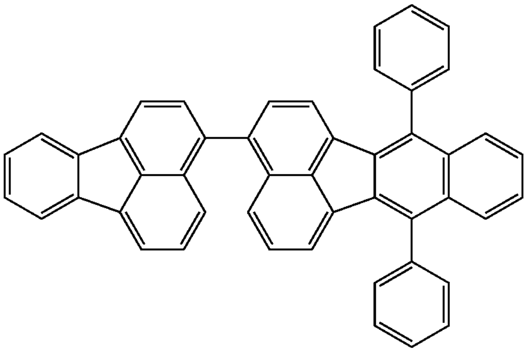
BD9
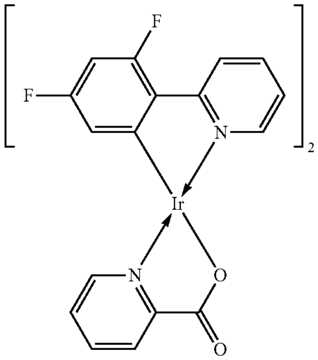
BD10
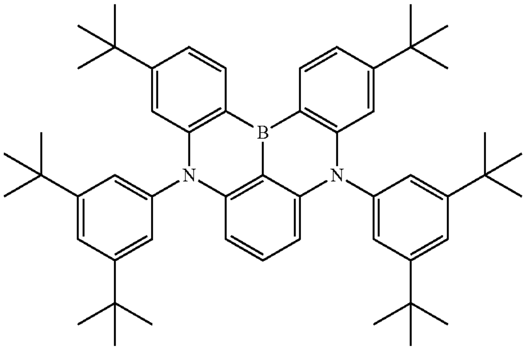
GD1
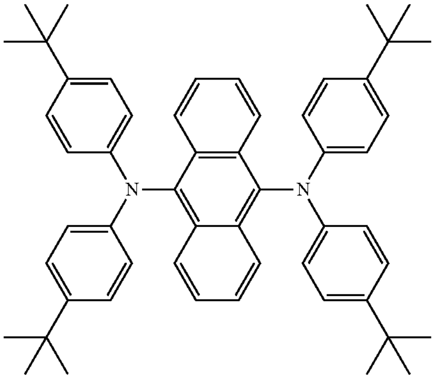

-continued
GD2
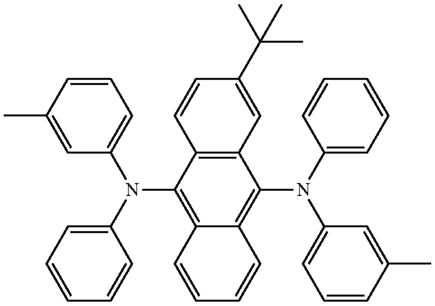
GD3
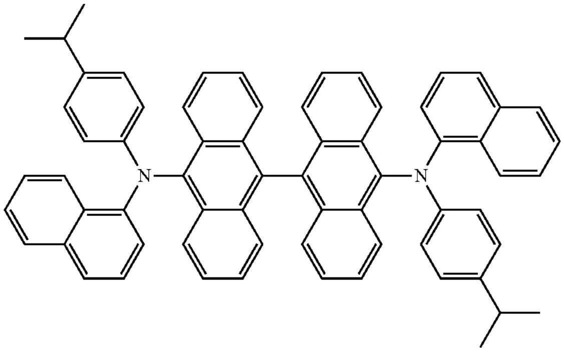
GD4
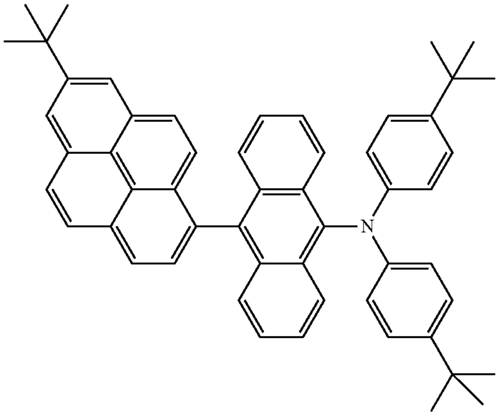
GD5
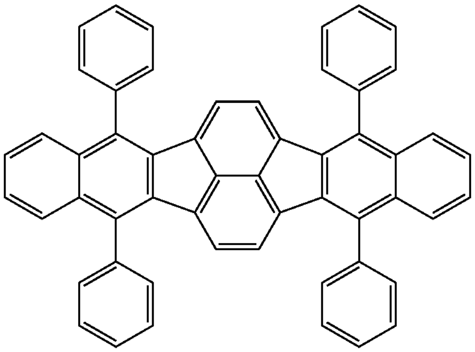
-continued
GD6
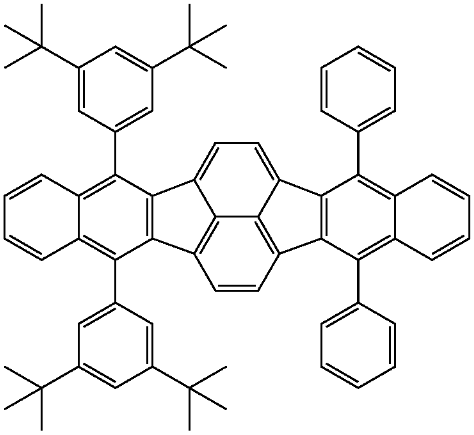
GD7
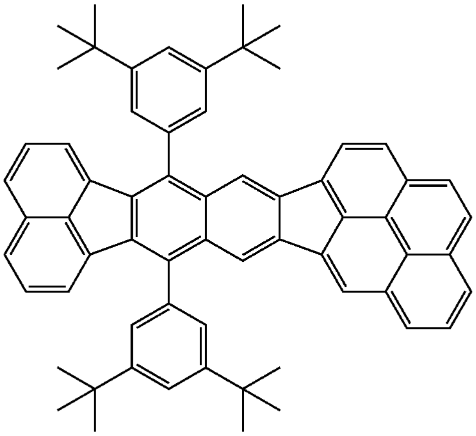
GD8
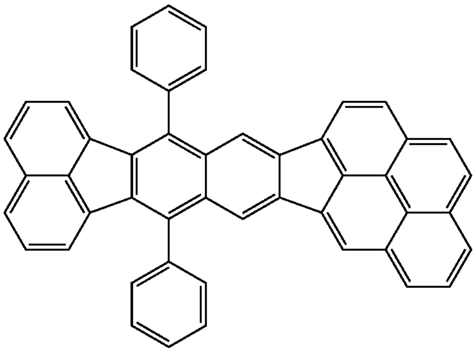

-continued
GD9
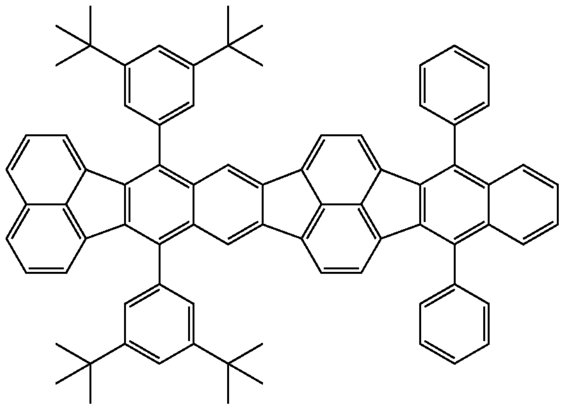
GD10
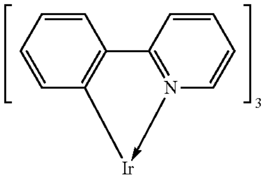
GD11
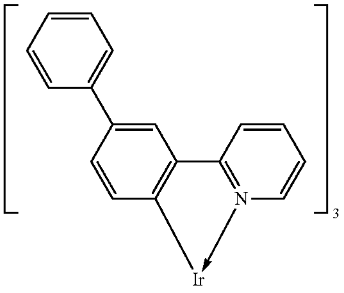
GD12
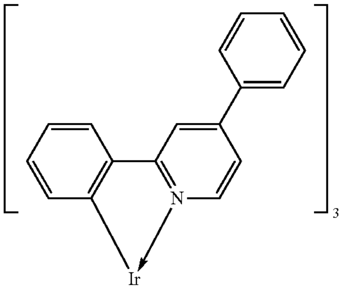
GD13
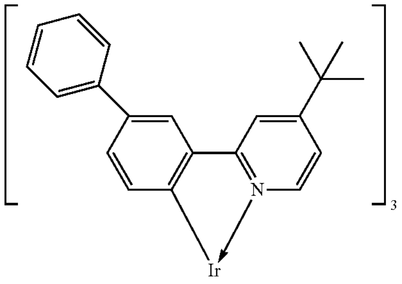
-continued
GD14
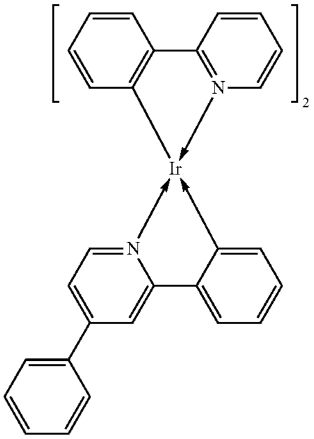
RD1
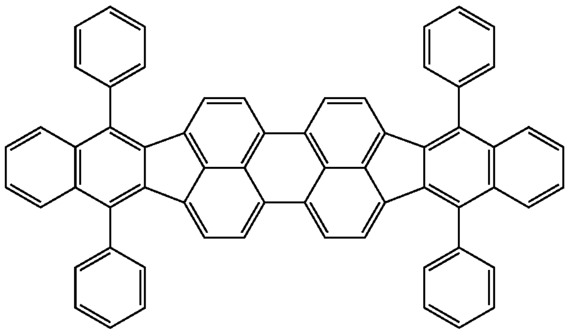
RD2
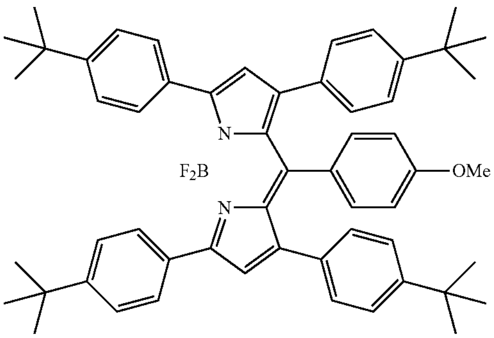
RD3
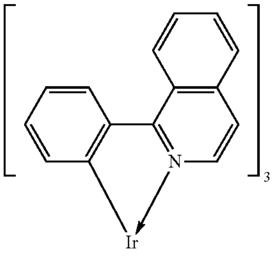

-continued

RD4

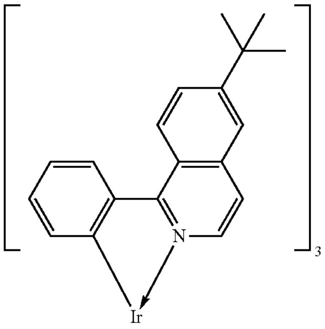

RD5

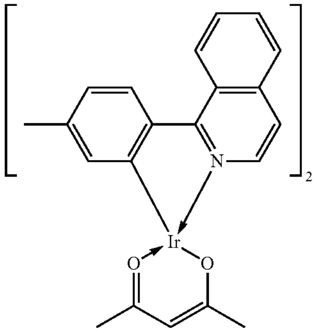

RD6

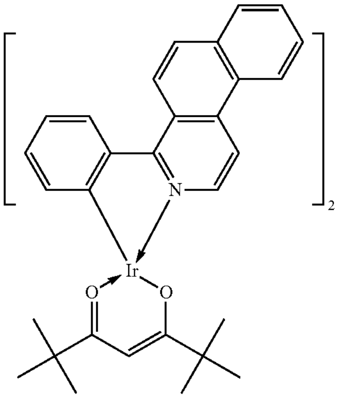

RD7

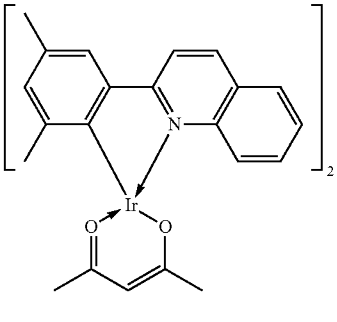

-continued

RD8

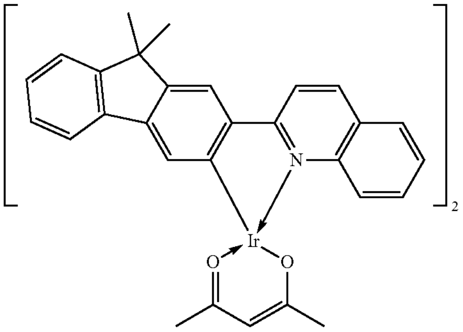

RD9

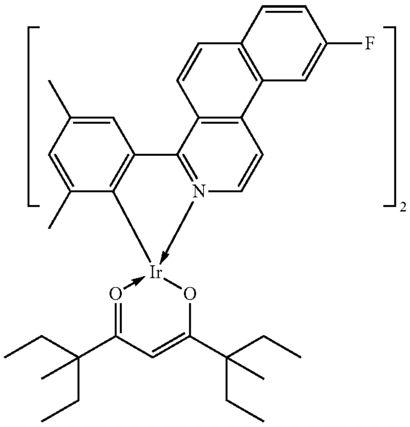

RD10

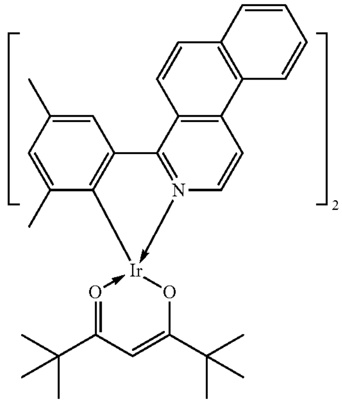

Examples of a light-emitting layer host or a light-emitting assist material in a light-emitting layer include aromatic hydrocarbon compounds and derivatives thereof, carbazole derivatives, dibenzofuran derivatives, dibenzothiophene derivatives, organoaluminum complexes, such as tris(8-quinolinolato)aluminum, and organoberyllium complexes. Specific examples of a compound that can be used as a light-emitting layer host or a light-emitting assist material in a light-emitting layer include, but are not limited to, the following.

EM1
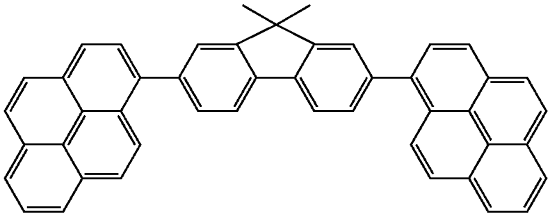
EM2
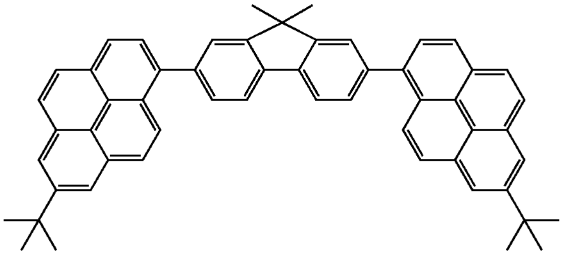
EM3
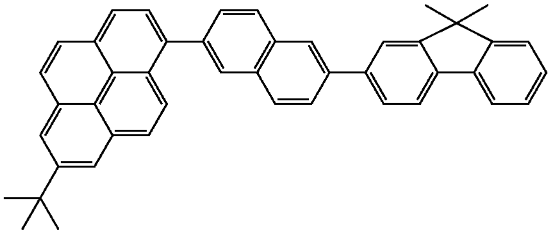
EM4
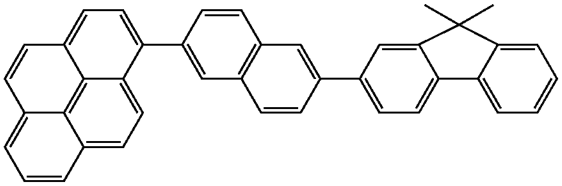
EM5
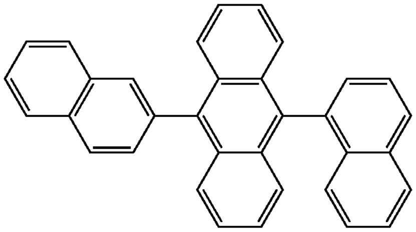
EM6
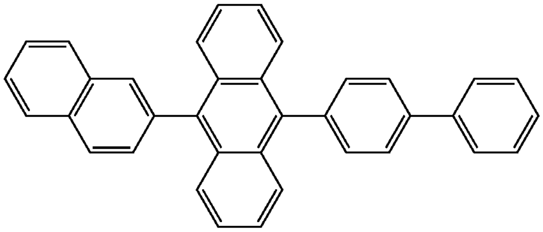
EM7
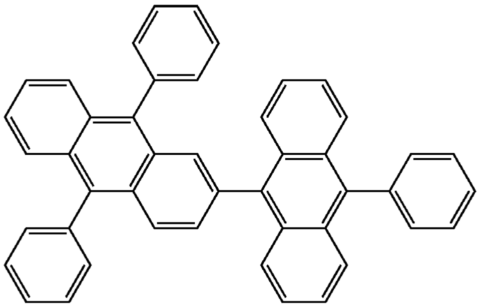
EM8
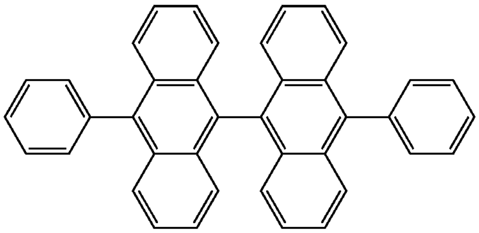
EM9
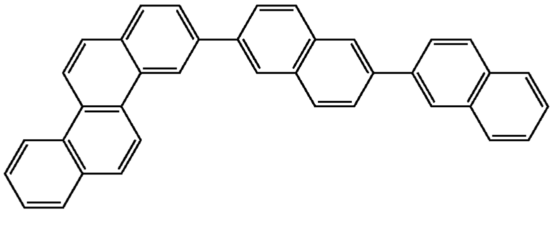
EM10
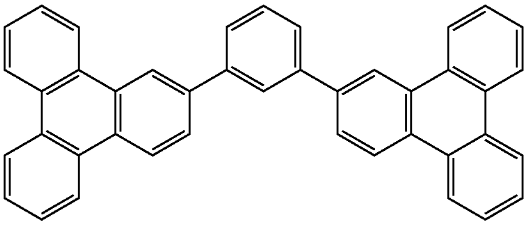
EM11
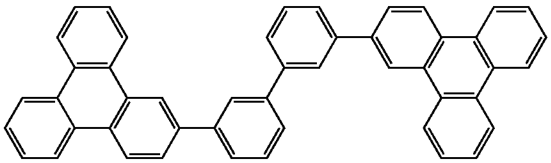
EM12
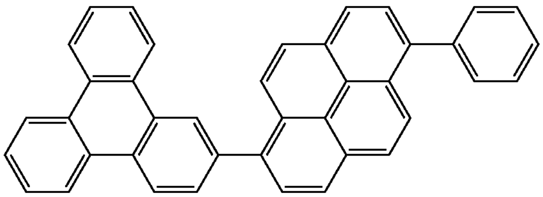

-continued
EM13
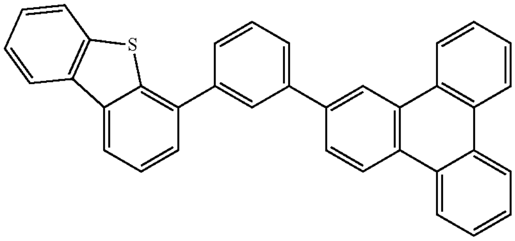
EM14
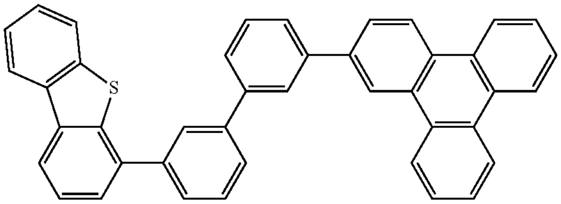
EM15
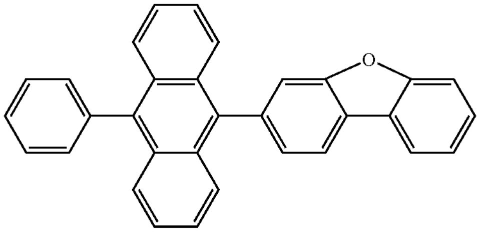
EM16
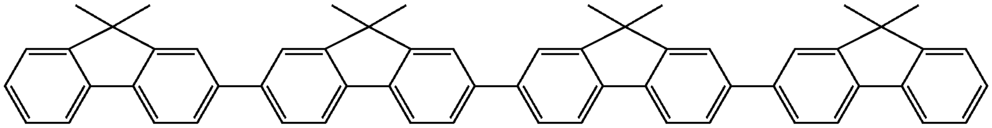
EM17
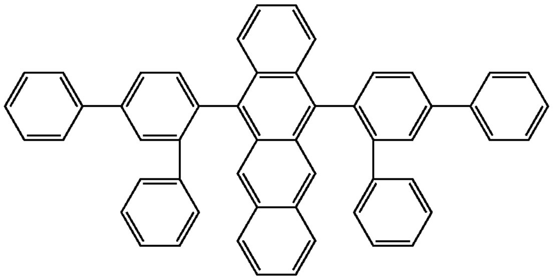
EM18
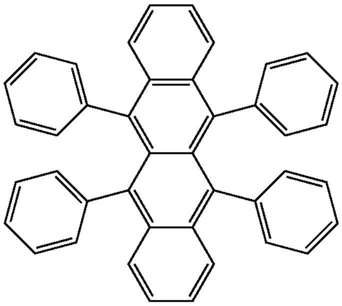
EM19
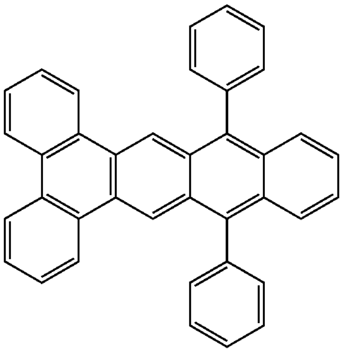
EM20
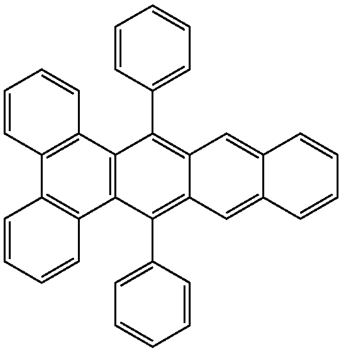

-continued
EM21
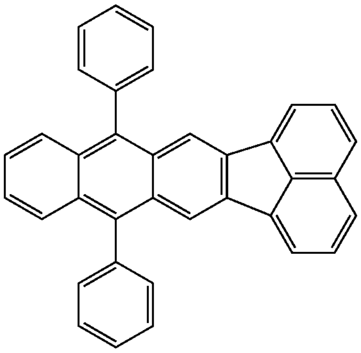
EM22
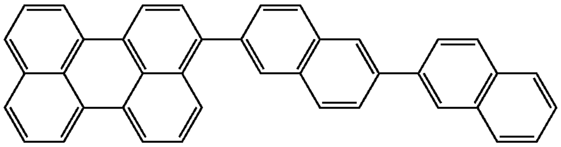
EM23
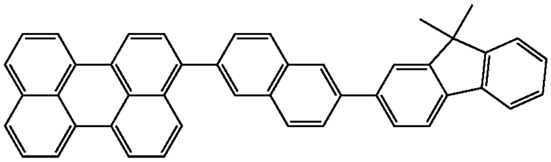
EM24
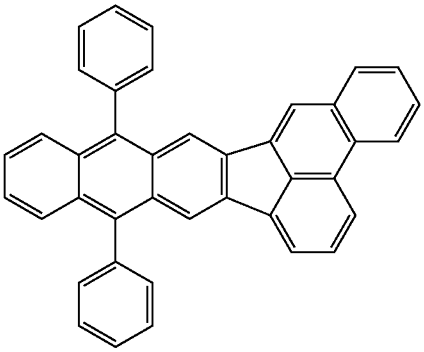
EM25
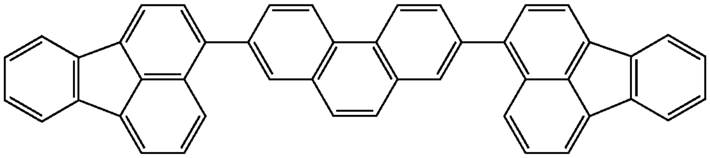
EM26
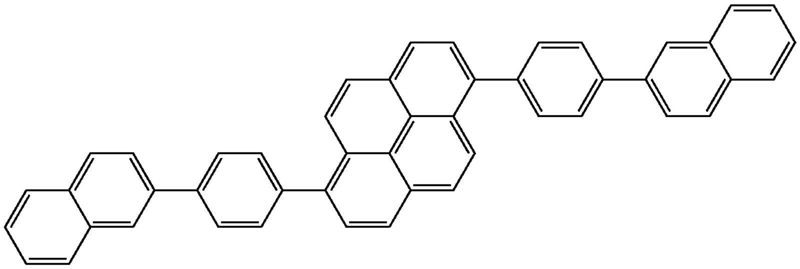
EM27
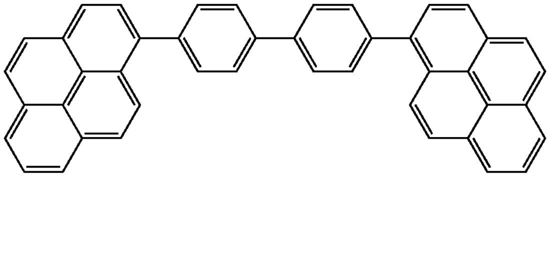
EM28
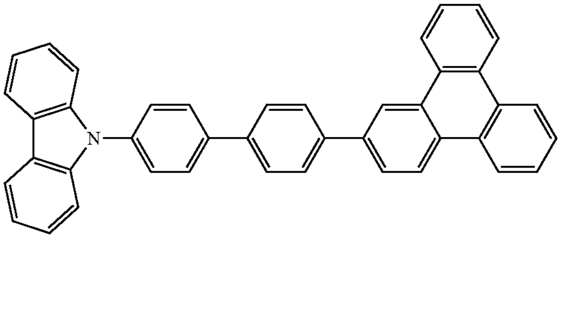

-continued

EM29

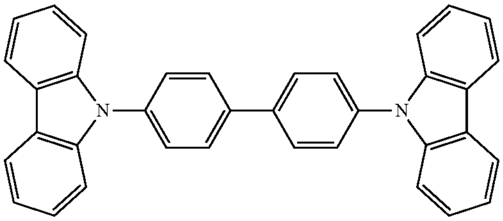

An electron-transport material can be selected from materials that can transport electrons injected from a negative electrode to a light-emitting layer and is selected in consideration of the balance with the hole mobility of a hole-transport material and the like. Examples of materials with electron-transport ability include, but are not limited to, oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused-ring compounds (for example, fluorene derivatives, naphthalene derivatives, chrysene derivatives, and anthracene derivatives). Furthermore, the electron-transport material is also suitable for a hole-blocking layer. Specific examples of compounds that can be used as electron-transport materials include, but are not limited to, the following.

ET1

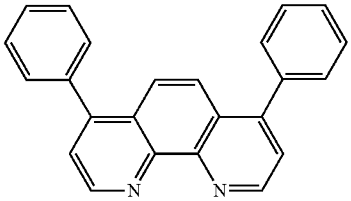

ET2

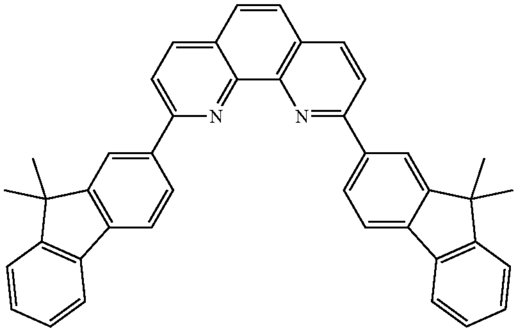

ET3

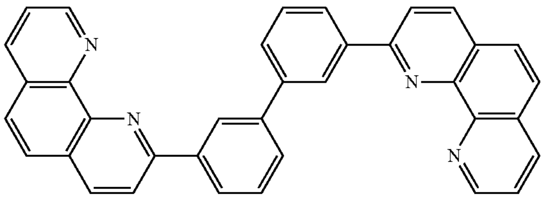

-continued

ET4

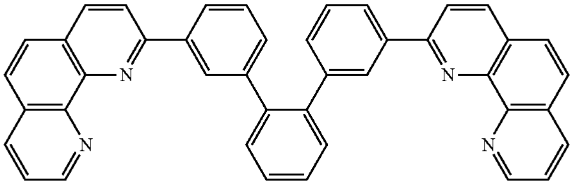

ET5

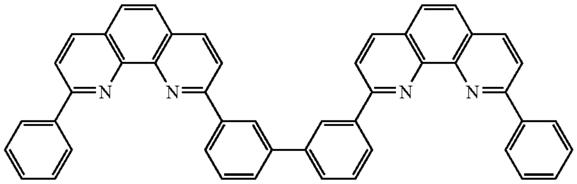

ET6

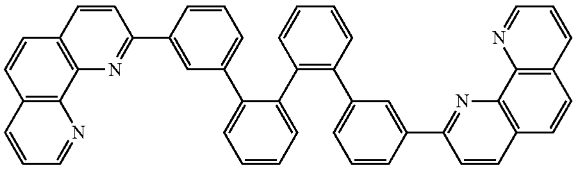

ET7

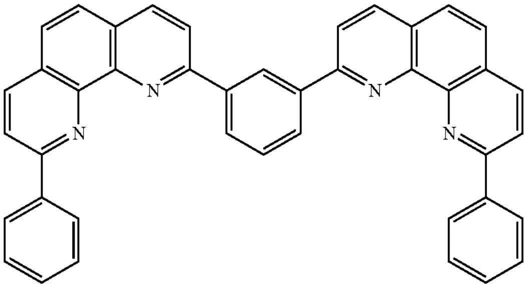

ET8

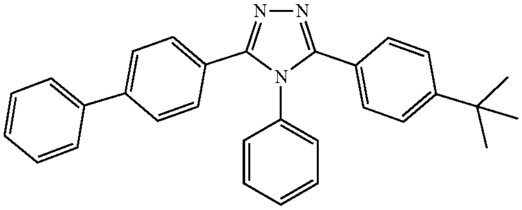

ET9

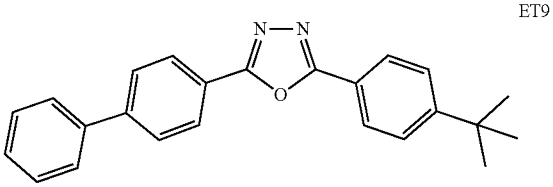

-continued
ET10
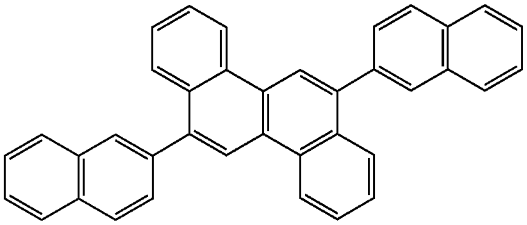
ET11
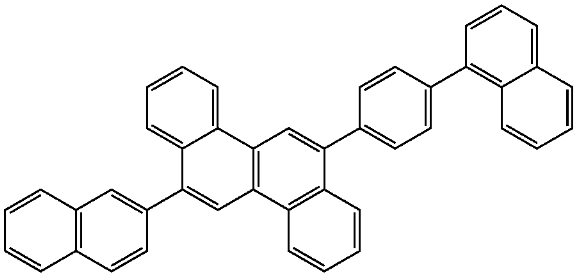
ET12
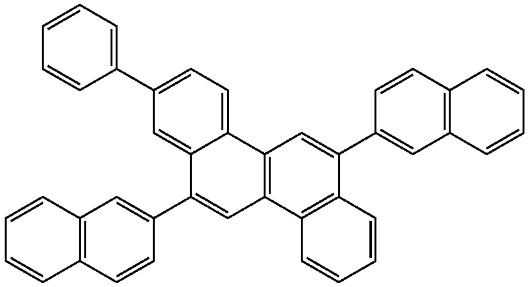
ET13
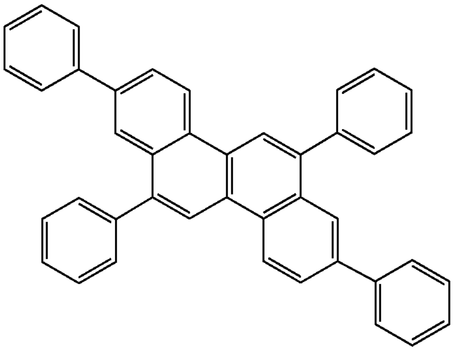
ET14
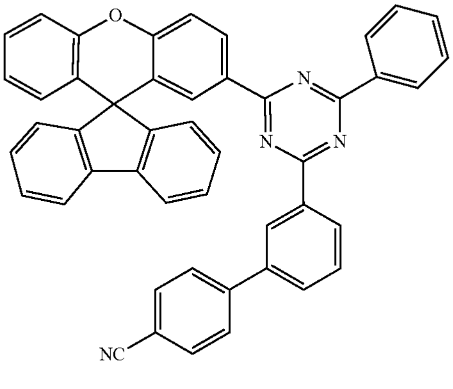
-continued
ET15
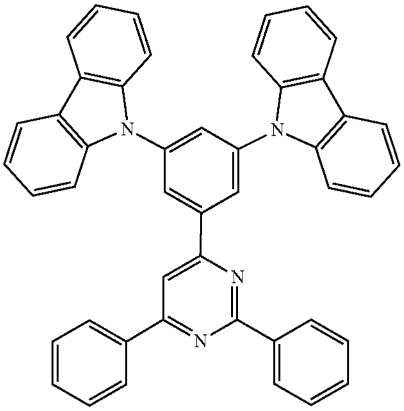
ET16
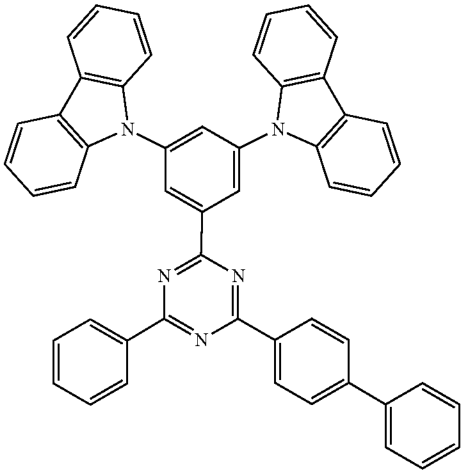
ET17
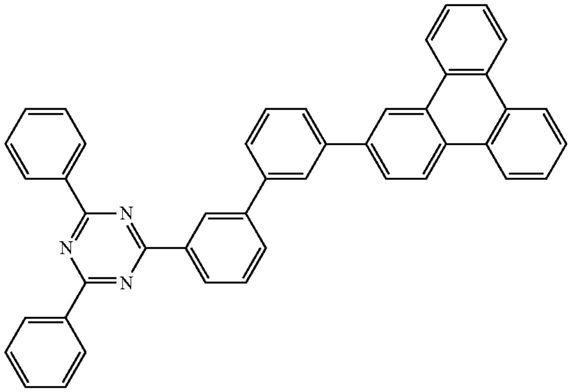
ET18
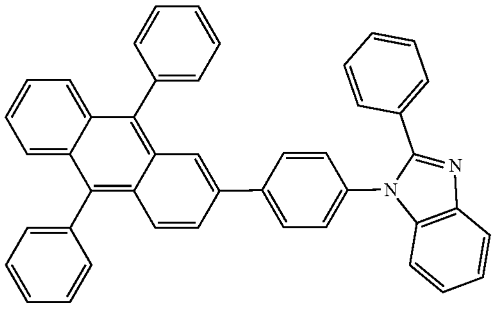

-continued
ET19
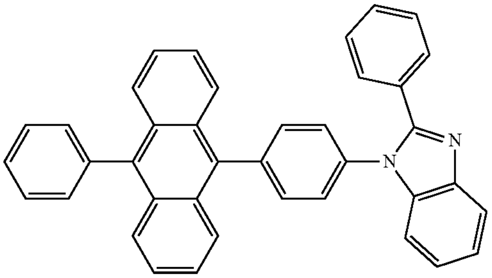
ET20
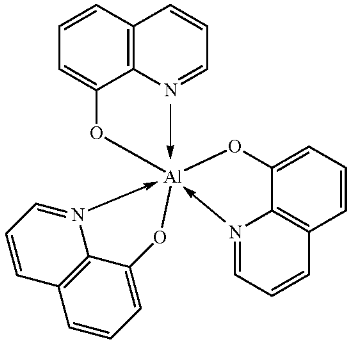
ET21
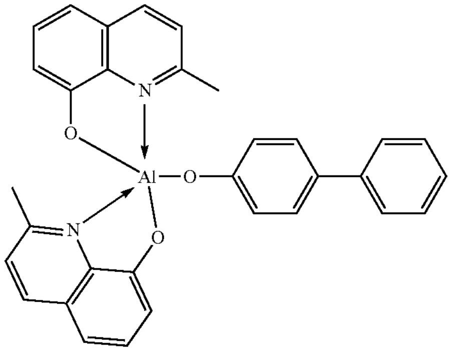
ET22
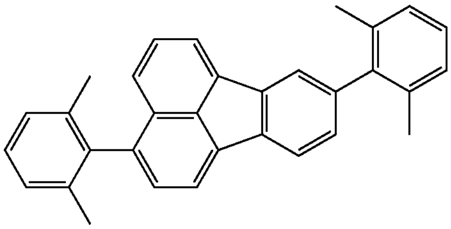
ET23
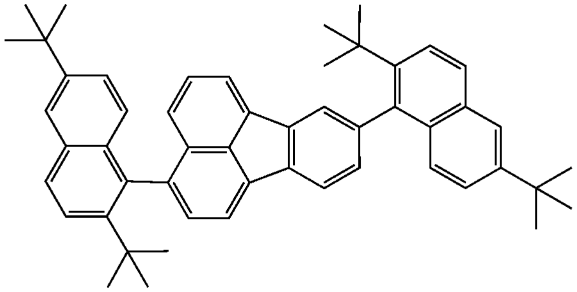
-continued
ET24
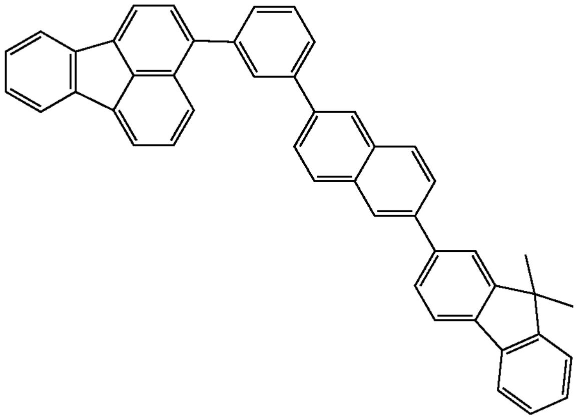
ET25
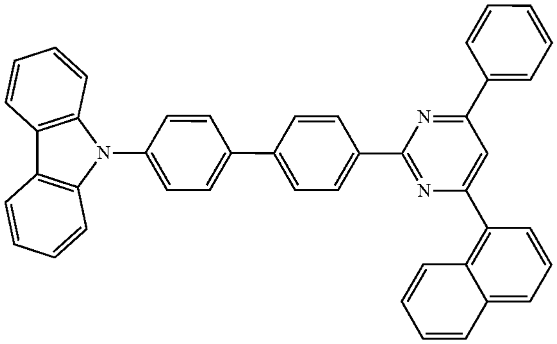
ET26
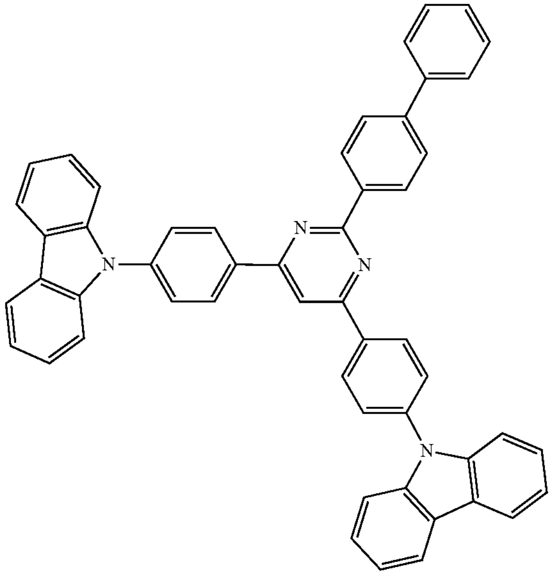

-continued

ET27

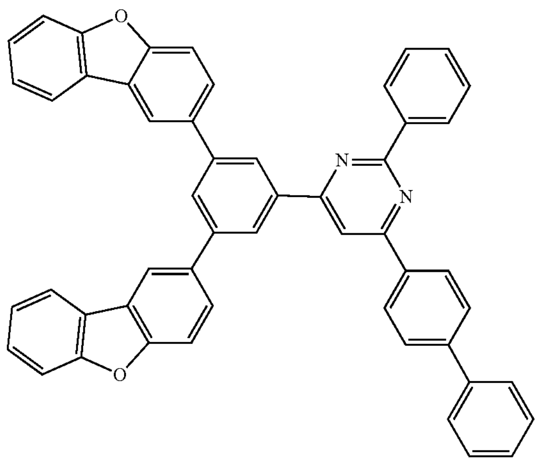

Structure of Organic Light-Emitting Element

An organic light-emitting element includes an insulating layer, a first electrode, an organic compound layer, and a second electrode on a substrate. A protective layer, a color filter, a microlens, or the like may be provided on the second electrode. When a color filter is provided, a planarization layer may be provided between the color filter and a protective layer. The planarization layer may be composed of an acrylic resin or the like. The same applies to a planarization layer provided between a color filter and a microlens.

Substrate

The substrate may be formed of quartz, glass, silicon wafer, resin, metal, or the like. The substrate may have a switching element, such as a transistor, and a wire, on which an insulating layer may be provided. The insulating layer may be composed of any material, provided that the insulating layer can have a contact hole for wiring between the insulating layer and the first electrode and is insulated from unconnected wires. For example, the insulating layer may be formed of a resin, such as polyimide, silicon oxide, or silicon nitride.

Electrodes

A pair of electrodes can be used as electrodes. The pair of electrodes may be a positive electrode and a negative electrode. When an electric field is applied in a direction in which the organic light-emitting element emits light, an electrode with a high electric potential is a positive electrode, and the other electrode is a negative electrode. In other words, the electrode that supplies holes to the light-emitting layer is a positive electrode, and the electrode that supplies electrons is a negative electrode.

A constituent material of the positive electrode can have as large a work function as possible. Examples of the constituent material include metal elements, such as gold, platinum, silver, copper, nickel, palladium, cobalt, selenium, vanadium, and tungsten, mixtures thereof, alloys thereof, and metal oxides, such as tin oxide, zinc oxide, indium oxide, indium tin oxide (ITO), and indium zinc oxide. Electrically conductive polymers, such as polyaniline, polypyrrole, and polythiophene, may also be used.

These electrode materials may be used alone or in combination. The positive electrode may be composed of a single layer or a plurality of layers.

When used as a reflective electrode, for example, chromium, aluminum, silver, titanium, tungsten, molybdenum, an alloy thereof, or a laminate thereof can be used. These materials can also function as a reflective film that does not have a role as an electrode. When used as a transparent electrode, an oxide transparent conductive layer, such as indium tin oxide (ITO) or indium zinc oxide, can be used. However, the present disclosure is not limited thereto. The electrodes may be formed by photolithography.

A constituent material of the negative electrode can be a material with a small work function. For example, an alkali metal, such as lithium, an alkaline-earth metal, such as calcium, a metal element, such as aluminum, titanium, manganese, silver, lead, or chromium, or a mixture thereof may be used. An alloy of these metal elements may also be used. For example, magnesium-silver, aluminum-lithium, aluminum-magnesium, silver-copper, or zinc-silver may be used. A metal oxide, such as indium tin oxide (ITO), may also be used. These electrode materials may be used alone or in combination. The negative electrode may be composed of a single layer or a plurality of layers. Among them, silver can be used, and a silver alloy can be used to reduce the aggregation of silver. As long as the aggregation of silver can be reduced, the alloy may have any ratio. For example, the ratio of silver to another metal may be 1:1, 3:1, or the like.

The negative electrode may be, but is not limited to, an oxide conductive layer, such as ITO, for a top emission element or a reflective electrode, such as aluminum (Al), for a bottom emission element. The negative electrode may be formed by any method. A direct-current or alternating-current sputtering method can achieve good film coverage and easily decrease resistance.

Organic Compound Layer

The organic compound layer may be formed of a single layer or a plurality of layers. Depending on their functions, a plurality of layers may be referred to as a hole-injection layer, a hole-transport layer, an electron-blocking layer, a light-emitting layer, a hole-blocking layer, an electron-transport layer, or an electron-injection layer. The organic compound layer is composed mainly of an organic compound and may contain an inorganic atom or an inorganic compound. For example, the compound layer may contain copper, lithium, magnesium, aluminum, iridium, platinum, molybdenum, zinc, or the like. The organic compound layer may be located between the first electrode and the second electrode and may be in contact with the first electrode and the second electrode.

An organic compound layer (a hole-injection layer, a hole-transport layer, an electron-blocking layer, a light-emitting layer, a hole-blocking layer, an electron-transport layer, an electron-injection layer, etc.) constituting an organic light-emitting element according to an embodiment of the present disclosure is formed by the following method.

An organic compound layer constituting an organic light-emitting element according to an embodiment of the present disclosure can be formed by a dry process, such as a vacuum evaporation method, an ionized deposition method, sputtering, or plasma. Instead of the dry process, a wet process may also be employed in which a layer is formed by a known coating method (for example, spin coating, dipping, a casting method, an LB method, an ink jet method, etc.) using an appropriate solvent.

A layer formed by a vacuum evaporation method, a solution coating method, or the like undergoes little crystallization or the like and has high temporal stability. When a film is formed by a coating method, the film may also be formed in combination with an appropriate binder resin.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

These binder resins may be used alone as a homopolymer or a copolymer or may be used in combination. If necessary, an additive agent, such as a known plasticizer, an oxidation inhibitor, and/or an ultraviolet absorbent, may also be used.

Protective Layer

A protective layer may be provided on the second electrode. For example, a glass sheet with a moisture absorbent may be attached to the second electrode to decrease the amount of water or the like entering the organic compound layer and reduce the occurrence of display defects. In another embodiment, a passivation film, such as silicon nitride, may be provided on the second electrode to decrease the amount of water or the like entering the organic compound layer. For example, after the second electrode is formed, the second electrode is transferred to another chamber without breaking the vacuum, and a silicon nitride film with a thickness of 2 μm may be formed as a protective layer by a CVD method. The protective layer may be formed by the CVD method followed by an atomic layer deposition (ALD) method. A film formed by the ALD method may be formed of any material such as silicon nitride, silicon oxide, or aluminum oxide. Silicon nitride may be further deposited by the CND method on the film formed by the ALD method. The film formed by the ALD method may have a smaller thickness than the film formed by the CVD method. More specifically, the thickness may be 50% or less or even 10% or less.

Color Filter

A color filter may be provided on the protective layer. For example, a color filter that matches the size of the organic light-emitting element may be provided on another substrate and may be bonded to the substrate on which the organic light-emitting element is provided, or a color filter may be patterned on the protective layer by photolithography. The color filter may be composed of a polymer.

Planarization Layer

A planarization layer may be provided between the color filter and the protective layer. The planarization layer is provided to reduce the roughness of the underlayer. The planarization layer is sometimes referred to as a material resin layer with any purpose. The planarization layer may be composed of an organic compound and can be composed of a high-molecular-weight compound, though it may be composed of a low-molecular-weight compound.

The planarization layer may be provided above and below the color filter, and the constituent materials thereof may be the same or different. Specific examples include polyvinylcarbazole resins, polycarbonate resins, polyester resins, ABS resins, acrylic resins, polyimide resins, phenolic resins, epoxy resins, silicone resins, and urea resins.

Microlens

An organic light-emitting element or an organic light-emitting apparatus may include an optical member, such as a microlens, on the light output side. The microlens may be composed of an acrylic resin, an epoxy resin, or the like. The microlens may be used to increase the amount of light extracted from the organic light-emitting element or the organic light-emitting apparatus and control the direction of the extracted light. The microlens may have a hemispherical shape. For a hemispherical microlens, the vertex of the microlens is a contact point between the hemisphere and a tangent line parallel to the insulating layer among the tangent lines in contact with the hemisphere. The vertex of the microlens in a cross-sectional view can be determined in the same manner. More specifically, the vertex of the microlens in a cross-sectional view is a contact point between the semicircle of the microlens and a tangent line parallel to the insulating layer among the tangent lines in contact with the semicircle.

The midpoint of the microlens can also be defined. In a cross section of the microlens, a midpoint of a line segment from one end point to the other end point of the arc can be referred to as a midpoint of the microlens. A cross section in which the vertex and the midpoint are determined may be perpendicular to the insulating layer.

Opposite Substrate

An opposite substrate may be provided on the planarization layer. The opposite substrate is so called because it faces the substrate. The opposite substrate may be composed of the same material as the substrate. When the substrate is a first substrate, the opposite substrate may be a second substrate.

Pixel Circuit

An organic light-emitting apparatus including an organic light-emitting element may include a pixel circuit coupled to the organic light-emitting element. The pixel circuit may be of an active matrix type, which independently controls the light emission of a first light-emitting element and a second light-emitting element. The active-matrix circuit may be of voltage programming or current programming. The drive circuit has a pixel circuit for each pixel. The pixel circuit may include a light-emitting element, a transistor for controlling the luminance of the light-emitting element, a transistor for controlling light emission timing, a capacitor for holding the gate voltage of the transistor for controlling the luminance, and a transistor for GND connection without through the light-emitting element.

A light-emitting apparatus includes a display region and a peripheral region around the display region. The display region includes the pixel circuit, and the peripheral region includes a display control circuit. The mobility of a transistor constituting the pixel circuit may be smaller than the mobility of a transistor constituting the display control circuit. The gradient of the current-voltage characteristics of a transistor constituting the pixel circuit may be smaller than the gradient of the current-voltage characteristics of a transistor constituting the display control circuit. The gradient of the current-voltage characteristics can be determined by so-called Vg-Ig characteristics. A transistor constituting the pixel circuit is a transistor coupled to a light-emitting element, such as a first light-emitting element.

Pixel

An organic light-emitting apparatus including an organic light-emitting element may have a plurality of pixels. Each pixel has subpixels that emit light of different colors. For example, the subpixels may have RGB emission colors.

In each pixel, a region also referred to as a pixel aperture emits light. This region is the same as the first region. The pixel aperture may be 15 μm or less or 5 μm or more, more specifically, 11 μm, 9.5 μm, 7.4 μm, 6.4 μm, or the like. The distance between the subpixels may be 10 μm or less, more specifically, 8 μm, 7.4 μm, or 6.4 μm.

The pixels may be arranged in a known form in a plan view. Examples include stripe arrangement, delta arrangement, PenTile arrangement, and Bayer arrangement. Each subpixel may have any known shape in a plan view. Examples include quadrangles, such as a rectangle and a rhombus, and a hexagon. As a matter of course, a figure that is not strictly rectangular but is close to rectangular is also included in the rectangle. The shape of each subpixel and the pixel array can be used in combination.

Applications of Organic Light-Emitting Element According to Present Embodiment

An organic light-emitting element according to the present embodiment can be used as a constituent of a display apparatus or a lighting apparatus. Other applications include an exposure light source of an electrophotographic image-forming apparatus, a backlight of a liquid crystal display, and a light-emitting apparatus with a color filter in a white light source.

The display apparatus may be an image-information-processing apparatus that includes an image input unit for inputting image information from an area CCD, a linear CCD, a memory card, or the like, includes an information processing unit for processing the input information, and displays an input image on a display unit. The display apparatus may have a plurality of pixels, and at least one of the pixels includes the organic light-emitting element according to the present embodiment and a transistor coupled to the organic light-emitting element.

A display unit of an imaging apparatus or an ink jet printer may have a touch panel function. A driving system of the touch panel function may be, but is not limited to, an infrared radiation system, an electrostatic capacitance system, a resistive film system, or an electromagnetic induction system. The display apparatus may be used for a display unit of a multifunction printer.

Figure 2A:
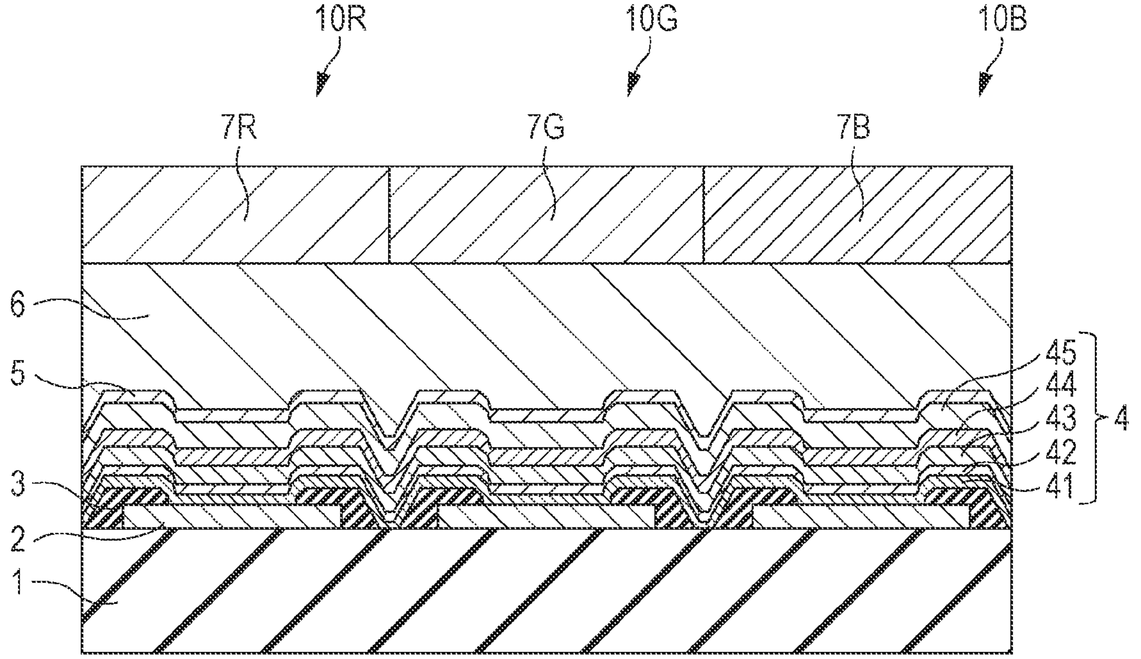
FIG. 2A is a schematic cross-sectional view of an example of a pixel of a display apparatus according to an embodiment of the present disclosure.
Figure 2B:
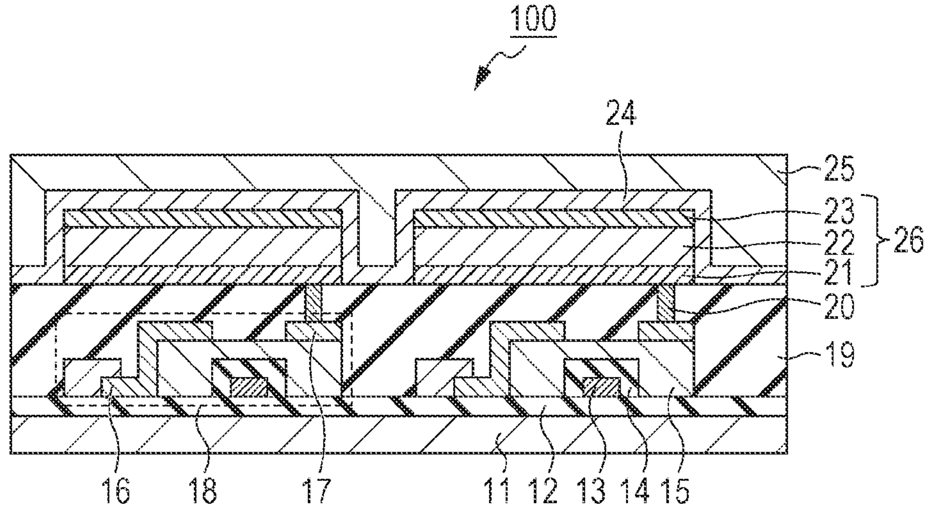
FIG. 2B is a schematic cross-sectional view of an example of a display apparatus including an organic light-emitting element according to an embodiment of the present disclosure.

Next, the display apparatus according to the present embodiment is described with reference to the accompanying drawings. FIGS. 2A and 2B are schematic cross-sectional views of a display apparatus that includes an organic light-emitting element and a transistor coupled to the organic light-emitting element. The transistor is an example of an active element. The transistor may be a thin-film transistor (TFT).

FIG. 2A illustrates a pixel serving as a constituent of the display apparatus according to the present embodiment. The pixel has subpixels 10. The subpixels are 10R, 10G, and 10B with different emission colors. The emission colors may be distinguished by the wavelength emitted from the light-emitting layer, or light emitted from each subpixel may be selectively transmitted or color-converted with a color filter or the like. Each of the subpixels 10 includes a reflective electrode serving as a first electrode 2, an insulating layer 3 covering an end of the first electrode 2, organic compound layers 4 covering the first electrode 2 and the insulating layer 3, a transparent electrode serving as a second electrode 5, a protective layer 6, and a color filter 7 on an interlayer insulating layer 1.

A transistor and/or a capacitor element may be provided under or inside the interlayer insulating layer 1. The transistor and the first electrode 2 may be electrically connected via a contact hole (not shown) or the like.

The insulating layer 3 is also referred to as a bank or a pixel separation film. The insulating layer 3 covers the ends of the first electrode 2 and surrounds the first electrode 2. A portion not covered with the insulating layer 3 is in contact with the organic compound layers 4 and serves as a light-emitting region.

The organic compound layers 4 include a hole-injection layer 41, a hole-transport layer 42, a first light-emitting layer 43, a second light-emitting layer 44, and an electron-transport layer 45.

The second electrode 5 may be a transparent electrode, a reflective electrode, or a semitransparent electrode.

The protective layer 6 reduces the penetration of moisture into the organic compound layers 4. The protective layer 6 is illustrated as a single layer but may be a plurality of layers. The protective layer may include an inorganic compound layer and an organic compound layer.

The color filter 7 is divided into 7R, 7G, and 7B according to the color. The color filter 7 may be formed on a planarizing film (not shown). Furthermore, a resin protective layer (not shown) may be provided on the color filter 7. The color filter 7 may be formed on the protective layer 6. Alternatively, the color filter 7 may be bonded after being provided on an opposite substrate, such as a glass substrate.

A display apparatus 100 in FIG. 2B includes an organic light-emitting element 26 and a TFT 18 as an example of a transistor. A substrate 11 made of glass, silicon, or the like and an insulating layer 12 are provided on the substrate 11. An active element, such as the TFT 18, and a gate electrode 13, a gate-insulating film 14, and a semiconductor layer 15 of the active element are provided on the insulating layer 12. The TFT 18 is also composed of a drain electrode 16 and a source electrode 17. The TFT 18 is covered with an insulating film 19. A positive electrode 21 of the organic light-emitting element 26 is coupled to the source electrode 17 through a contact hole 20 formed in the insulating film 19.

The method for electrically connecting the electrodes (the positive electrode 21 and a negative electrode 23) of the organic light-emitting element 26 to the electrodes (the source electrode 17 and the drain electrode 16) of the TFT 18 is not limited to the embodiment illustrated in FIG. 2B. More specifically, it is only necessary to electrically connect either the positive electrode 21 or the negative electrode 23 to either the source electrode 17 or the drain electrode 16 of the TFT 18. TFT refers to a thin-film transistor.

Although an organic compound layer 22 is a single layer in the display apparatus 100 illustrated in FIG. 2B, the organic compound layer 22 may be composed of a plurality of layers. The negative electrode 23 is covered with a first protective layer 24 and a second protective layer 25 for preventing degradation of the organic light-emitting element 26.

The transistor used as a switching element in the display apparatus 100 illustrated in FIG. 2B may be replaced with another switching element.

The transistor used in the display apparatus 100 in FIG. 2B is not limited to a transistor including a single crystal silicon wafer and may also be a thin-film transistor including an active layer on an insulating surface of a substrate. The active layer may be single-crystal silicon, non-single-crystal silicon, such as amorphous silicon or microcrystalline silicon, or a non-single-crystal oxide semiconductor, such as indium zinc oxide or indium gallium zinc oxide. The thin-film transistor is also referred to as a TFT element.

The transistor in the display apparatus 100 of FIG. 2B may be formed within a substrate, such as a Si substrate. The phrase "formed within a substrate" means that the substrate, such as a Si substrate, itself is processed to form the transistor. Thus, the transistor within the substrate can be considered that the substrate and the transistor are integrally formed.

In the organic light-emitting element according to the present embodiment, the luminance is controlled with the TFT, which is an example of a switching element. The organic light-emitting element can be provided on a plurality of planes to display an image at each luminance. The switching element according to the present embodiment is not limited to the TFT and may be a transistor formed of low-temperature polysilicon or an active-matrix driver formed on a substrate, such as a Si substrate. "On a substrate" may also be referred to as "within a substrate". Whether a transistor is provided within a substrate or a TFT is used depends on the size of a display unit. For example, for an approximately 0.5-inch display unit, an organic light-emitting element can be provided on a Si substrate.

Figure 3:
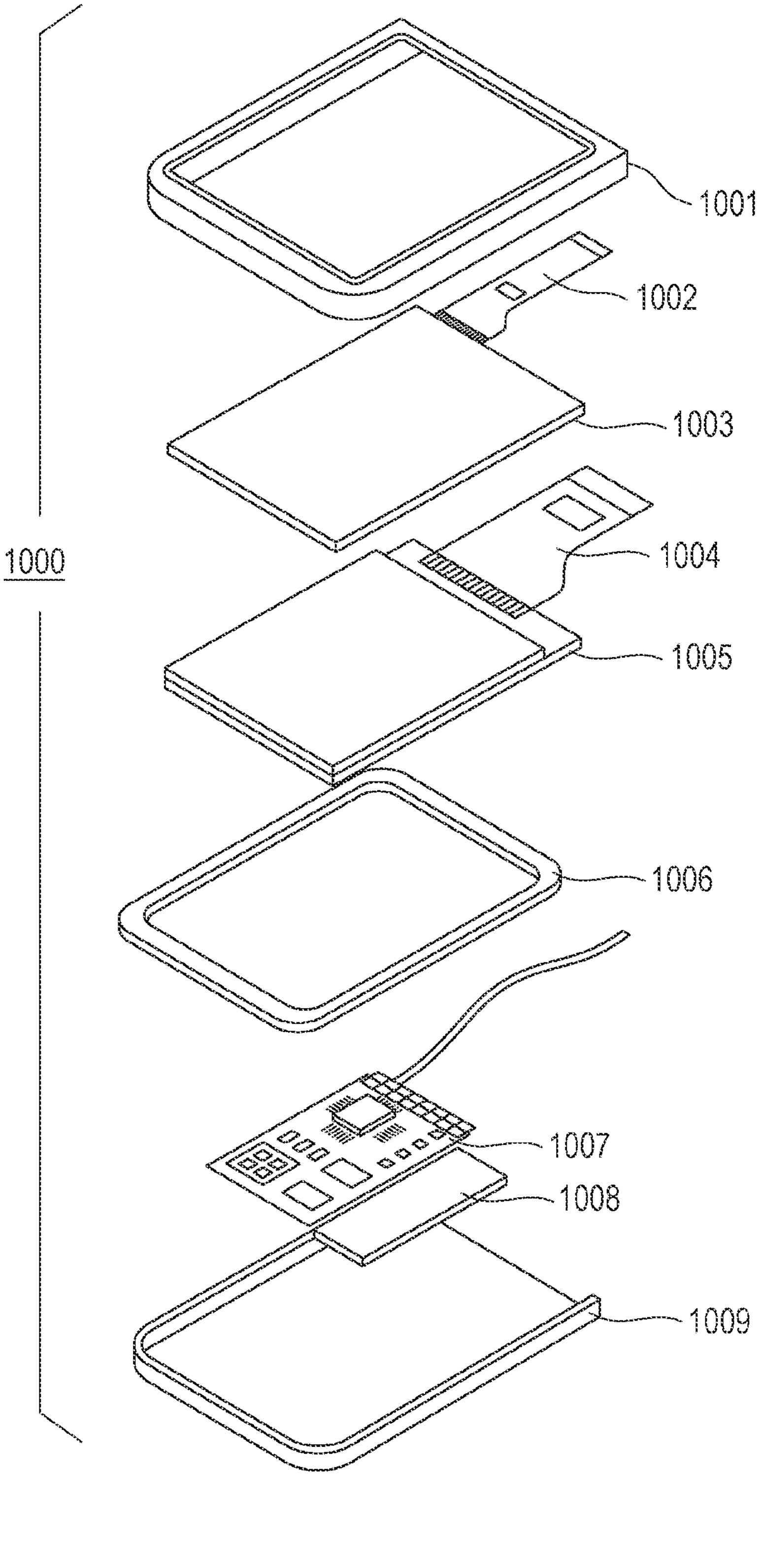
FIG. 3 is a schematic view of an example of a display apparatus according to an embodiment of the present disclosure.

FIG. 3 is a schematic view of an example of the display apparatus according to the present embodiment. A display apparatus 1000 may include a touch panel 1003, a display panel 1005, a frame 1006, a circuit substrate 1007, and a battery 1008 between an upper cover 1001 and a lower cover 1009. The touch panel 1003 and the display panel 1005 are coupled to flexible print circuits FPC 1002 and 1004, respectively. Transistors are printed on the circuit substrate 1007. The battery 1008 may not be provided when the display apparatus is not a mobile device, or may be provided at another position even when the display apparatus is a mobile device.

The display apparatus according to the present embodiment may include color filters of red, green, and blue colors. The color filters may be arranged such that the red, green, and blue colors are arranged in a delta arrangement.

The display apparatus according to the present embodiment may be used for a display unit of a mobile terminal. Such a display apparatus may have both a display function and an operation function. Examples of the mobile terminal include mobile phones, such as smartphones, tablets, and head-mounted displays.

The display apparatus according to the present embodiment may be used for a display unit of an imaging apparatus that includes an optical unit with a plurality of lenses and an imaging element for receiving light passing through the optical unit. The imaging apparatus may include a display unit for displaying information acquired by the imaging element. The display unit may be a display unit exposed outside from the imaging apparatus or a display unit located in a finder. The imaging apparatus may be a digital camera or a digital video camera.

Figure 4A:
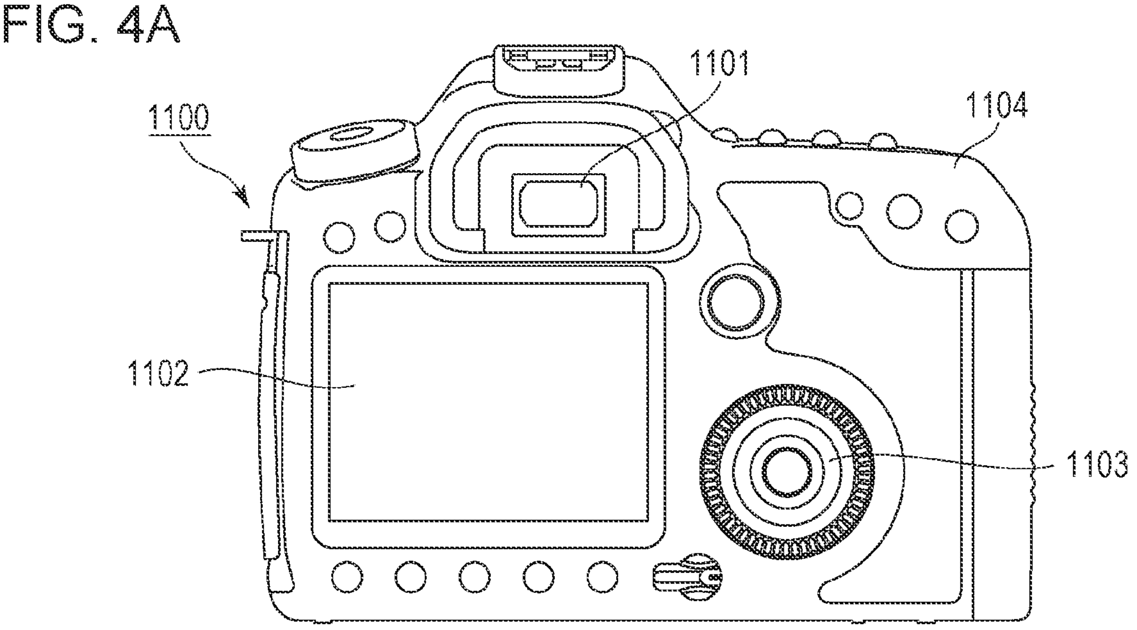
FIG. 4A is a schematic view of an example of an imaging apparatus according to an embodiment of the present disclosure.

FIG. 4A is a schematic view of an example of an imaging apparatus according to the present embodiment. An imaging apparatus 1100 may include a viewfinder 1101, a rear display 1102, an operating unit 1103, and a housing 1104. The viewfinder 1101 may include the display apparatus according to the present embodiment. In such a case, the display apparatus may display environmental information, imaging instructions, and the like as well as an image to be captured. The environmental information may include the intensity of external light, the direction of external light, the travel speed of the photographic subject, and the possibility that the photographic subject is shielded by a shield.

Because the appropriate timing for imaging is a short time, it is better to display information as soon as possible. Thus, a display apparatus including the organic light-emitting element according to the present embodiment can be used. This is because the organic light-emitting element has a high response speed. A display apparatus including the organic light-emitting element can be more suitably used than these apparatuses and liquid crystal displays that require a high display speed.

The imaging apparatus 1100 includes an optical unit (not shown). The optical unit has a plurality of lenses and focuses an image on an imaging element in the housing 1104. The focus of the lenses can be adjusted by adjusting their relative positions. This operation can also be automatically performed. The imaging apparatus may also be referred to as a photoelectric conversion apparatus. The photoelectric conversion apparatus can have, as an imaging method, a method of detecting a difference from a previous image or a method of cutting out a permanently recorded image, instead of taking an image one after another.

Figure 4B:
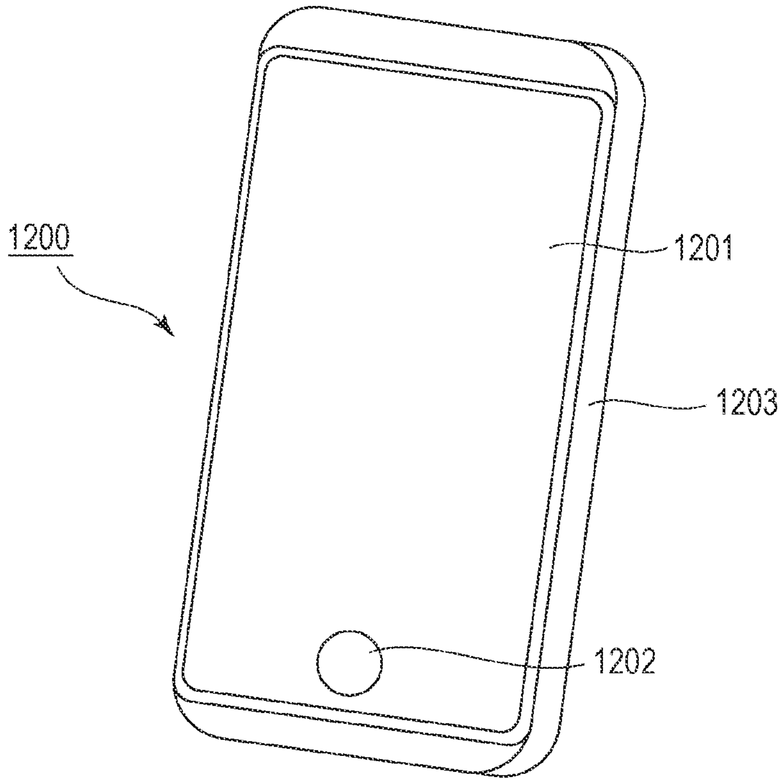
FIG. 4B is a schematic view of an example of electronic equipment according to an embodiment of the present disclosure.

FIG. 4B is a schematic view of an example of electronic equipment according to the present embodiment. Electronic equipment 1200 includes a display unit 1201, an operating unit 1202, and a housing 1203. The housing 1203 may include a circuit, a printed circuit board including the circuit, a battery, and a communication unit. The operating unit 1202 may be a button or a touch panel response unit. The operating unit 1202 may be a biometric recognition unit that recognizes a fingerprint and releases the lock. Electronic equipment with a communication unit may also be referred to as communication equipment. The electronic equipment 1200 may have a lens and an imaging element and thereby further have a camera function. An image captured by the camera function is displayed on the display unit 1201. The electronic equipment 1200 may be a smartphone, a notebook computer, or the like.

Figure 5A:
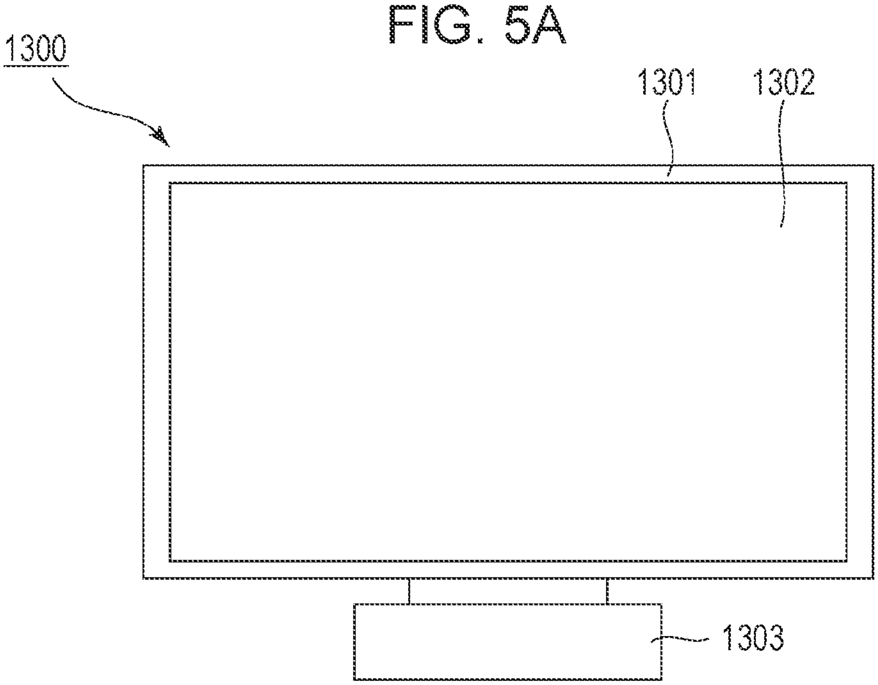
FIG. 5A is a schematic view of an example of a display apparatus according to an embodiment of the present disclosure.
Figure 5B:
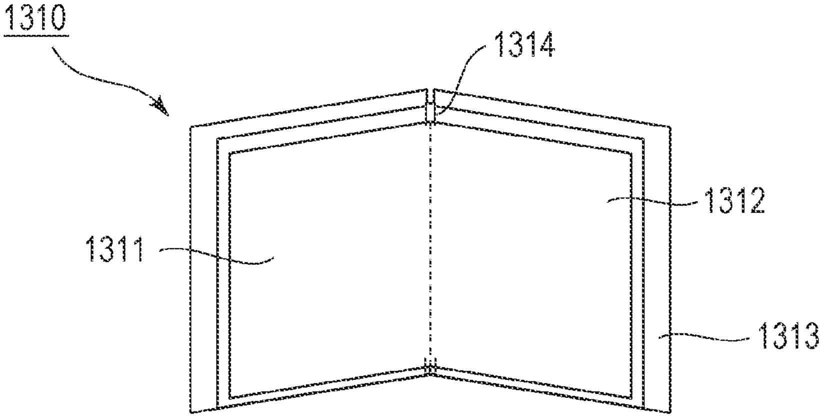
FIG. 5B is a schematic view of an example of a foldable display apparatus.

FIGS. 5A and 5B are schematic views of examples of the display apparatus according to the present embodiment. FIG. 5A illustrates a display apparatus, such as a television monitor or a PC monitor. A display apparatus 1300 includes a frame 1301 and a display unit 1302. The light-emitting element according to the present embodiment may be used for the display unit 1302. The frame 1301 and the display unit 1302 are supported by a base 1303. The base 1303 is not limited to the structure illustrated in FIG. 5A. The lower side of the frame 1301 may also serve as the base. The frame 1301 and the display unit 1302 may be bent. The radius of curvature may range from 5000 to 6000 mm.

FIG. 5B is a schematic view of another example of the display apparatus according to the present embodiment. A display apparatus 1310 in FIG. 5B is configured to be foldable and is a so-called foldable display apparatus. The display apparatus 1310 includes a first display unit 1311, a second display unit 1312, a housing 1313, and a folding point 1314. The first display unit 1311 and the second display unit 1312 may include the light-emitting element according to the present embodiment. The first display unit 1311 and the second display unit 1312 may be a single display apparatus without a joint. The first display unit 1311 and the second display unit 1312 can be divided by a folding point. The first display unit 1311 and the second display unit 1312 may display different images or one image.

Figure 6A:
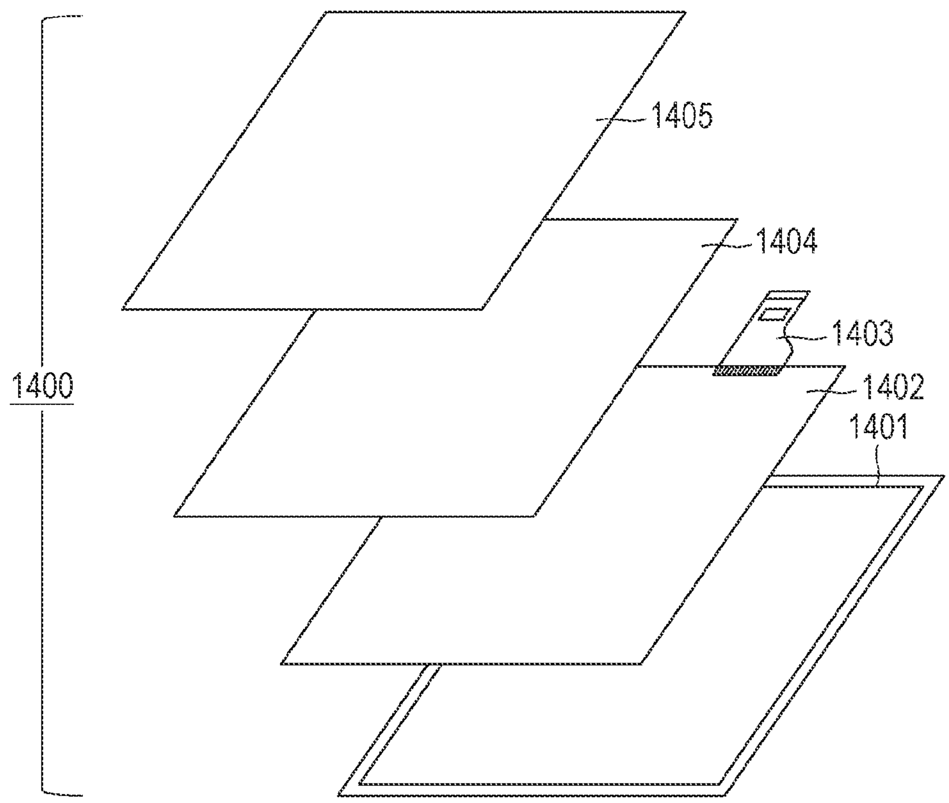
FIG. 6A is a schematic view of an example of a lighting apparatus according to an embodiment of the present disclosure.

FIG. 6A is a schematic view of an example of a lighting apparatus according to the present embodiment. A lighting apparatus 1400 may include a housing 1401, a light source 1402, a circuit substrate 1403, an optical filter 1404 that transmits light emitted by the light source 1402, and a light-diffusing unit 1405. The light source 1402 may include the organic light-emitting element according to the present embodiment. The optical filter 1404 may be a filter that improves the color rendering properties of the light source. The light-diffusing unit 1405 can effectively diffuse light from the light source and widely spread light as in illumination. The optical filter 1404 and the light-diffusing unit 1405 may be provided on the light output side of the illumination. If necessary, a cover may be provided on the outermost side.

For example, the lighting apparatus is an interior lighting apparatus. The lighting apparatus may emit white light, neutral white light, or light of any color from blue to red. The lighting apparatus may have a light control circuit for controlling such light. The lighting apparatus may include the organic light-emitting element according to the present embodiment and a power supply circuit coupled thereto. The power supply circuit is a circuit that converts an AC voltage to a DC voltage. White has a color temperature of 4200 K, and neutral white has a color temperature of 5000 K. The lighting apparatus may have a color filter.

The lighting apparatus according to the present embodiment may include a heat dissipation unit. The heat dissipation unit releases heat from the apparatus to the outside and may be a metal or liquid silicon with a high specific heat.

Figure 6B:
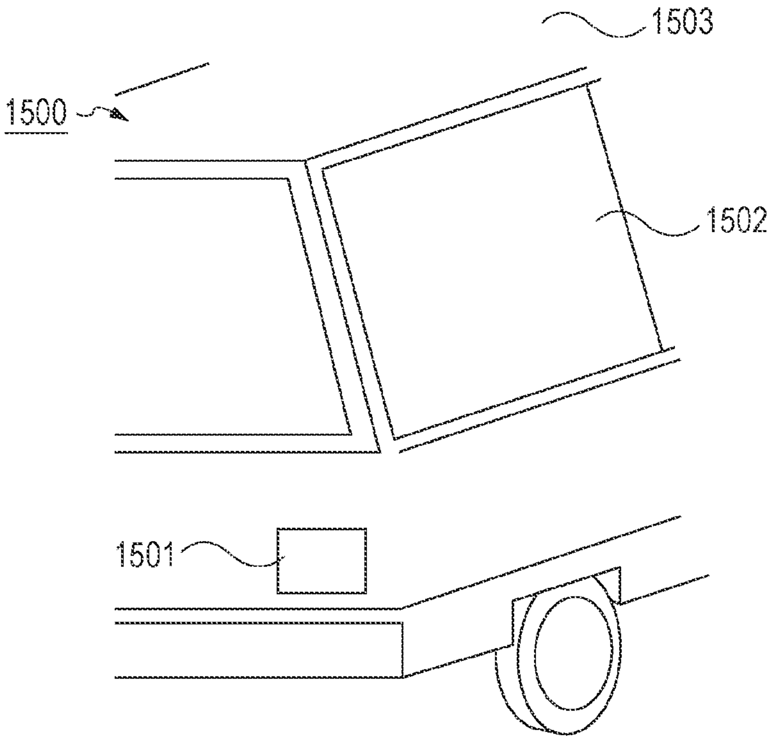
FIG. 6B is a schematic view of an example of a moving body with a vehicle lamp according to an embodiment of the present disclosure.

FIG. 6B is a schematic view of an automobile as an example of a moving body according to the present embodiment. The automobile has a taillight as an example of a lamp. An automobile 1500 may have a taillight 1501, which comes on when a brake operation or the like is performed.

The taillight 1501 may include the organic light-emitting element according to the present embodiment. The taillight 1501 may include a protective member for protecting the organic light-emitting element. The protective member may be formed of any transparent material with moderately high strength and can be formed of polycarbonate or the like. The polycarbonate may be mixed with a furan dicarboxylic acid derivative, an acrylonitrile derivative, or the like.

The automobile 1500 may have a body 1503 and a window 1502 on the body 1503. The window 1502 may be a transparent display as long as it is not a window for checking the front and rear of the automobile. The transparent display may include the organic light-emitting element according to the present embodiment. In such a case, constituent materials, such as electrodes, of the organic light-emitting element are transparent materials.

The moving body according to the present embodiment may be a ship, an aircraft, a drone, or the like. The moving body may include a body and a lamp provided on the body. The lamp may emit light to indicate the position of the body. The lamp includes the organic light-emitting element according to the present embodiment.

Application examples of the display apparatus according to each of the embodiments are described below with reference to FIGS. 7A and 7B. The display apparatus can be applied to a system that can be worn as a wearable device, such as smart glasses, a head-mounted display (HMD), or smart contact lenses. An imaging and displaying apparatus used in such an application includes an imaging apparatus that can photoelectrically convert visible light and a display apparatus that can emit visible light.

Figure 7A:
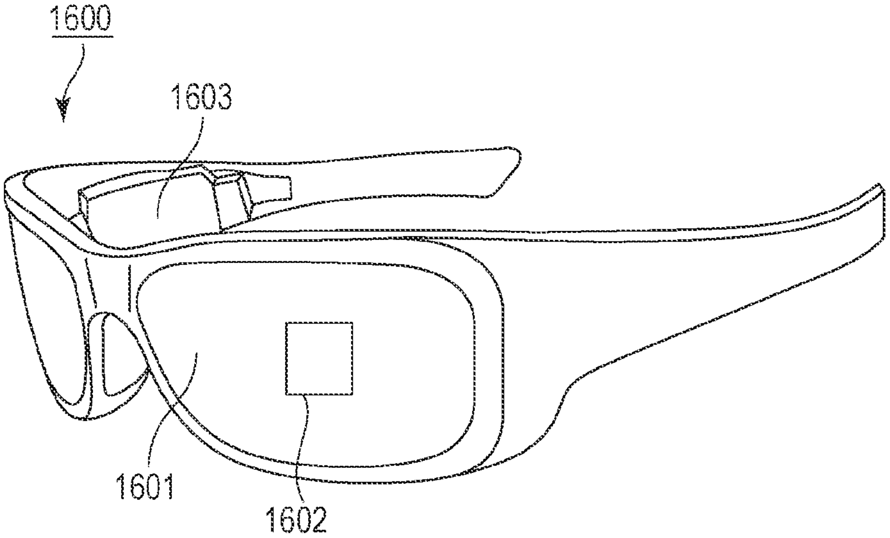
FIG. 7A is a schematic view of an example of a wearable device according to an embodiment of the present disclosure.

FIG. 7A is a schematic view of an example of a wearable device according to an embodiment of the present disclosure. Glasses 1600 (smart glasses) according to one application example are described below with reference to FIG. 7A. An imaging apparatus 1602, such as a complementary metal-oxide semiconductor (CMOS) sensor or a single-photon avalanche photodiode (SPAD), is provided on the front side of a lens 1601 of the glasses 1600. The display apparatus according to one of the embodiments is provided on the back side of the lens 1601.

The glasses 1600 further include a controller 1603. The controller 1603 functions as a power supply for supplying power to the imaging apparatus 1602 and the display apparatus. The controller 1603 controls the operation of the imaging apparatus 1602 and the display apparatus. The lens 1601 has an optical system for focusing light on the imaging apparatus 1602.

Figure 7B:
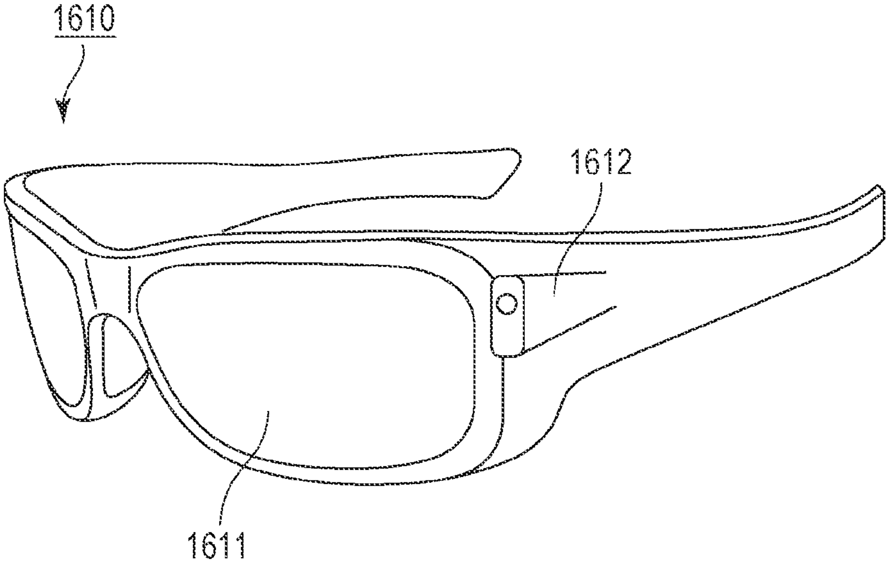
FIG. 7B is a schematic view of another example of a wearable device according to an embodiment of the present disclosure.

FIG. 7B is a schematic view of another example of a wearable device according to an embodiment of the present disclosure. Glasses 1610 (smart glasses) according to one application example are described below with reference to FIG. 7B. The glasses 1610 have a controller 1612, which includes an imaging apparatus corresponding to the imaging apparatus 1602 of FIG. 7A and a display apparatus. A lens 1611 includes an optical system for projecting light from the imaging apparatus and the display apparatus of the controller 1612, and an image is projected on the lens 1611. The controller 1612 functions as a power supply for supplying power to the imaging apparatus and the display apparatus and controls the operation of the imaging apparatus and the display apparatus.

The controller 1612 may include a line-of-sight detection unit for detecting the line of sight of the wearer. Infrared radiation may be used to detect the line of sight. An infrared radiation unit emits infrared light to an eyeball of a user who is gazing at a display image. Reflected infrared light from the eyeball is detected by an imaging unit including a light-receiving element to capture an image of the eyeball. A reduction unit for reducing light from the infrared radiation unit to a display unit in a plan view is provided to reduce degradation in image quality. The line of sight of the user for the display image is detected from the image of the eyeball captured by infrared imaging. Any known technique can be applied to line-of-sight detection using the image of the eyeball. For example, it is possible to use a line-of-sight detection method based on a Purkinje image obtained by reflection of irradiation light by the cornea. More specifically, a line-of-sight detection process based on a pupil-corneal reflection method is performed. The line of sight of the user is detected by calculating a line-of-sight vector representing the direction (rotation angle) of an eyeball on the basis of an image of a pupil and a Purkinje image included in a captured image of the eyeball using the pupil-corneal reflection method.

A display apparatus according to an embodiment of the present disclosure may include an imaging apparatus including a light-receiving element and may control a display image on the basis of line-of-sight information of a user from the imaging apparatus. More specifically, on the basis of the line-of-sight information, the display apparatus determines a first visibility region at which the user gazes and a second visibility region other than the first visibility region. The first visibility region and the second visibility region may be determined by the controller of the display apparatus or may be received from an external controller. In the display region of the display apparatus, the first visibility region may be controlled to have higher display resolution than the second visibility region. In other words, the second visibility region may have lower resolution than the first visibility region.

The display region has a first display region and a second display region different from the first display region, and the priority of the first display region and the second display region depends on the line-of-sight information. The first visibility region and the second visibility region may be determined by the controller of the display apparatus or may be received from an external controller. A region with a higher priority may be controlled to have higher resolution than another region. In other words, a region with a lower priority may have lower resolution.

The first visibility region or a region with a higher priority may be determined by artificial intelligence (AI). The AI may be a model configured to estimate the angle of the line of sight and the distance to a target ahead of the line of sight from an image of an eyeball using the image of the eyeball and the direction in which the eyeball actually viewed in the image as teaching data. The AI program may be stored in the display apparatus, the imaging apparatus, or an external device. The AI program stored in an external device is transmitted to the display apparatus via communication.

For display control based on visual recognition detection, the present disclosure can be applied to smart glasses further having an imaging apparatus for imaging the outside. Smart glasses can display captured external information in real time.

Figure 8A:
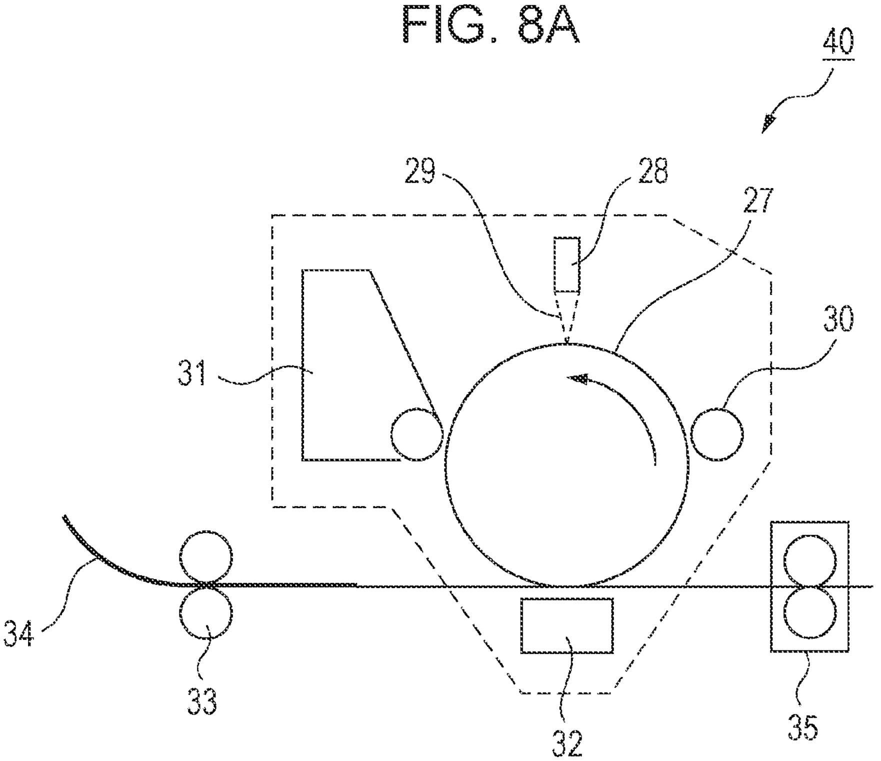
FIG. 8A is a schematic view of an example of an image-forming apparatus according to an embodiment of the present disclosure.

FIG. 8A is a schematic view of an example of an image-forming apparatus according to an embodiment of the present disclosure. An image-forming apparatus 40 is an electrophotographic image-forming apparatus and includes a photosensitive unit 27, an exposure light source 28, a charging unit 30, a developing unit 31, a transfer unit 32, a conveying roller 33, and a fixing unit 35. The exposure light source 28 emits light 29, and an electrostatic latent image is formed on the surface of the photosensitive unit 27. The exposure light source 28 includes the organic light-emitting element according to the present embodiment. The developing unit 31 contains toner and the like. The charging unit 30 electrifies the photosensitive unit 27. The transfer unit 32 transfers a developed image onto a recording medium 34. The conveying roller 33 conveys the recording medium 34. The recording medium 34 is paper, for example. The fixing unit 35 fixes an image on the recording medium 34.

Figure 8B:
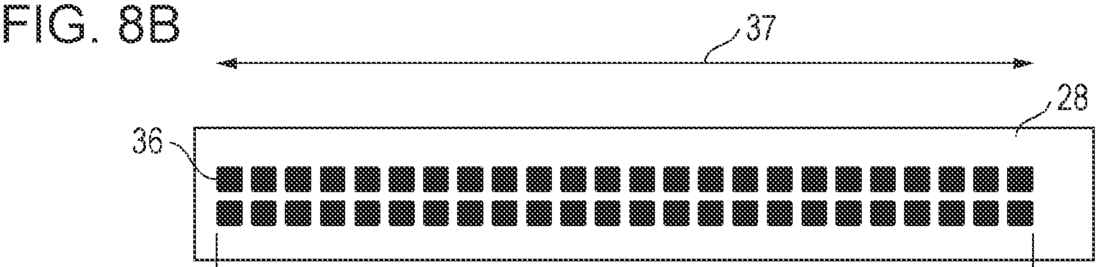
FIG. 8B is a schematic view of an example of an exposure light source of an image-forming apparatus according to an embodiment of the present disclosure.
Figure 8C:
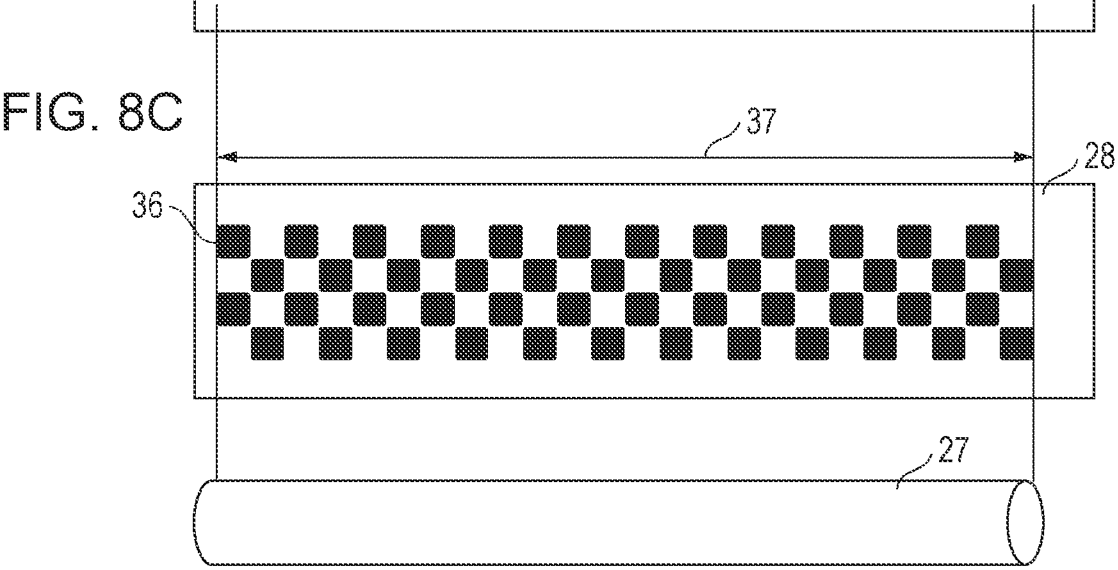
FIG. 8C is a schematic view of an example of an exposure light source of an image-forming apparatus according to an embodiment of the present disclosure.

FIGS. 8B and 8C are schematic views of the exposure light source 28, wherein a plurality of light-emitting portions 36 are arranged on a long substrate. An arrow 37 indicates a direction parallel to the axis of the photosensitive unit and indicates a longitudinal direction in which the organic light-emitting elements are arranged. The longitudinal direction is the same as the direction of the rotation axis of the photosensitive unit 27. This direction can also be referred to as the major-axis direction of the photosensitive unit 27. In FIG. 8B, the light-emitting portions 36 are arranged in the major-axis direction of the photosensitive unit 27. In FIG. 8C, unlike FIG. 8B, the light-emitting portions 36 are alternately arranged in the longitudinal direction in the first and second rows. The first row and the second row are arranged at different positions in the transverse direction. In the first row, the light-emitting portions 36 are arranged at intervals. In the second row, the light-emitting portions 36 are arranged at positions corresponding to the spaces between the light-emitting portions 36 of the first row. Thus, the light-emitting portions 36 are also arranged at intervals in the transverse direction. The arrangement in FIG. 8C can be referred to as a grid-like pattern, a staggered pattern, or a checkered pattern, for example.

As described above, an apparatus including the organic light-emitting element according to the present embodiment can be used to stably display a high-quality image for extended periods.

Exemplary Embodiments

The present disclosure is described below with exemplary embodiments. However, the present disclosure is not limited these exemplary embodiments.

Exemplary Embodiment 1 (Synthesis of Exemplary Compound A3)

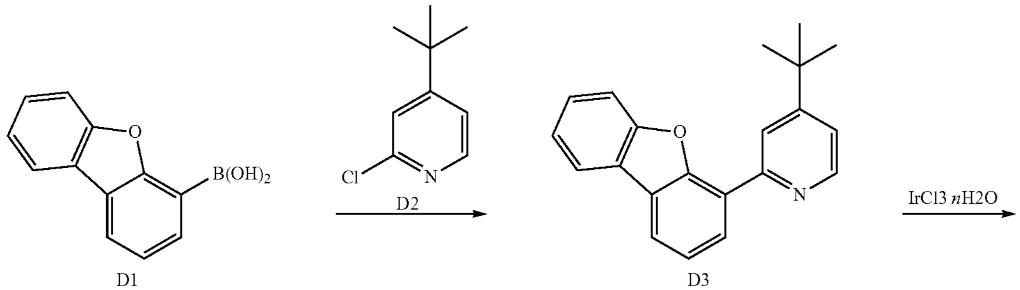

D1 D3

-continued
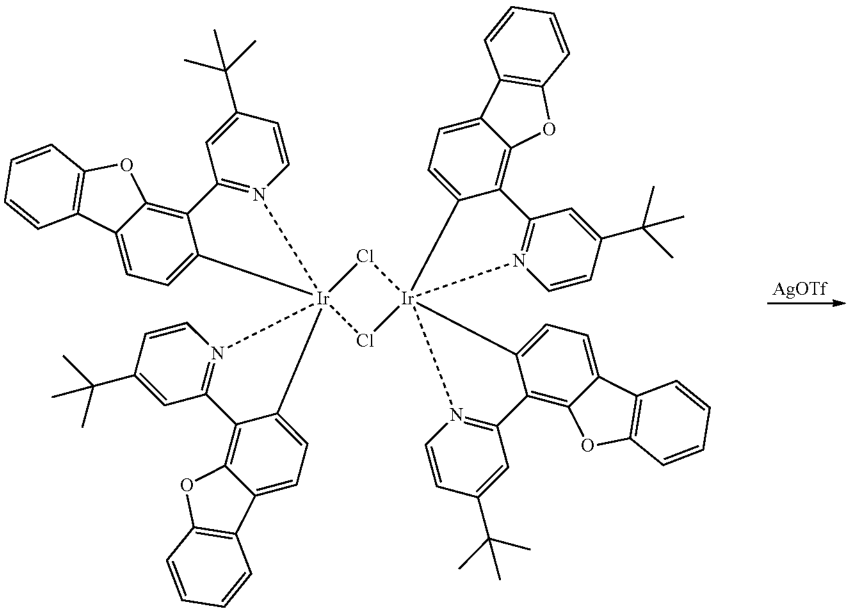
D4
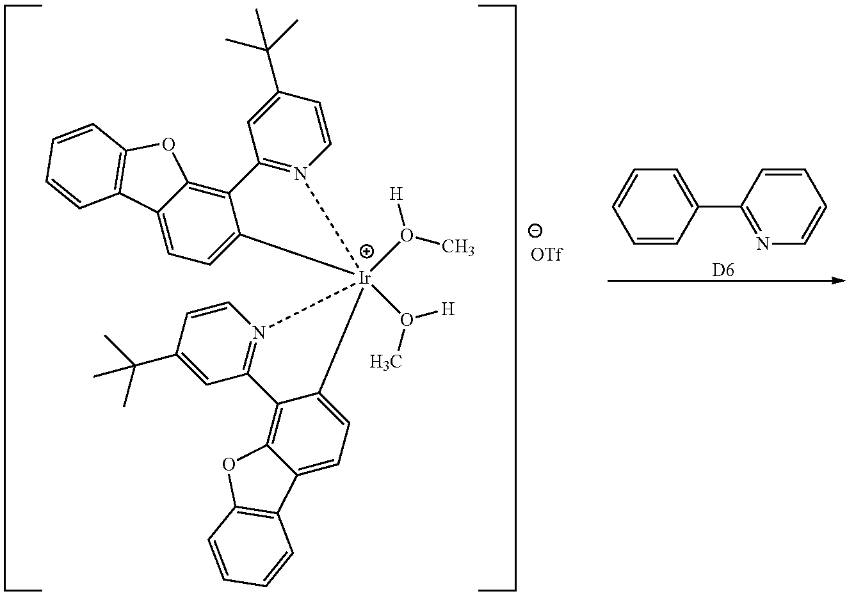
D5

-continued

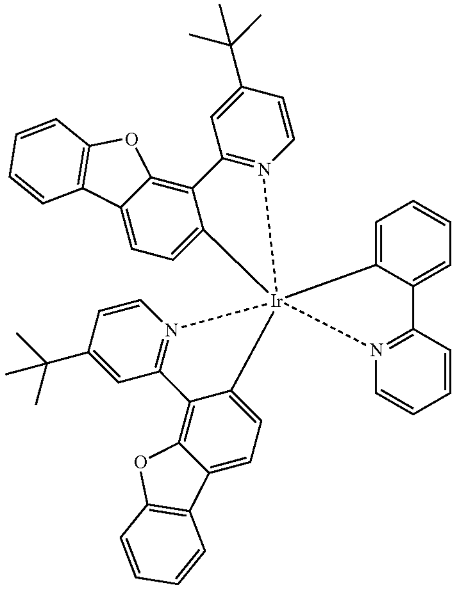

A2

A 500-ml recovery flask was charged with 6.0 g (28.3 mmol) of D1, 4.8 g (28.3 mmol) of D2, 4.5 g (42.4 mmol) of sodium carbonate dissolved in 180 ml of water, 90 ml of toluene, and 90 ml of ethanol, was degassed, and was purged with nitrogen. Subsequently, 980 mg of $Pd(PPh_3)_4$ was added, and the reaction solution was heated and stirred in a nitrogen stream at 90° C. for 3 hours. After completion of the reaction, the organic layer was extracted with toluene and was concentrated to dryness. The resulting solid was purified by silica gel column chromatography (toluene:ethyl acetate mixture) to yield 6.8 g of a white solid D3 (yield: 80%).

After degassing a 2-ethoxyethanol (10 ml) solvent, 0.31 g (0.88 mmol) of iridium (III) chloride hydrate was added and stirred at room temperature for 30 minutes. Subsequently, 1.06 g (3.52 mmol) of D3 was added, and the mixture was heated to 120° C. and was stirred for 6 hours. After cooling, water was added to the product, and the product was filtered and washed with water. The product was dried to yield 0.70 g of a yellowish brown solid D4 (yield: 48%).

After degassing a dichloromethane (35 ml) solvent, 0.70 g (0.42 mmol) of D4 and 0.2 g (0.83 mmol) of AgOTf were added and stirred, and then methanol (9 ml) was added and stirred at room temperature for 3 hours. The solvent was evaporated to yield 1.00 g of D5.

After degassing an ethanol (18 ml) solvent, 0.60 g (0.60 mmol) of D5 and 0.15 g (0.99 mmol) of D6 were added to another vessel and were stirred under reflux for 3 hours. After cooling, the product was filtered and purified by column chromatography using a chloroform/heptane mixed solvent. After the solvent was evaporated, methanol was added to the product, and the product was filtered and washed with methanol. The product was dried to yield 0.40 g of a dark yellow solid A3 (yield: 70%).

An emission spectrum of a $1\times10^{-5}$ mol/L toluene solution of the exemplary compound A3 was measured by photoluminescence at an excitation wavelength of 350 nm with F-4500 manufactured by Hitachi, Ltd. The emission spectrum had the maximum intensity at 530 nm.

The exemplary compound A3 was subjected to mass spectrometry with MALDI-TOF-MS (Autoflex LRF manufactured by Bruker).

MALDI-TOF-MS

Actual value: m/z=947 Calculated value: $C_{53}H_{44}IrN_3O_2$=947

Exemplary Embodiments 2 to 20 (Synthesis of Exemplary Compounds)

As shown in Tables 1 to 4, exemplary compounds according to Exemplary Embodiments 2 to 20 were synthesized in the same manner as in Exemplary Embodiment 1 except that the raw materials D1, D2, and D6 were replaced with raw materials 1, 2, and 3. respectively. Actual values m/z measured by mass spectrometry in the same manner as in Exemplary Embodiment 1 are also shown.

TABLE 1
| Exemplary embodiment | Exemplary compound | Raw material 1 | Raw material 2 | Raw material 3 | m/z |
|---|---|---|---|---|---|
| 2 | A4 | 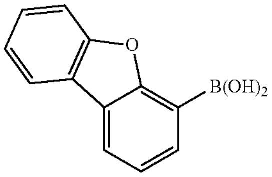 [SMILES: OB(O)c1cccc2c1oc1ccccc12] | 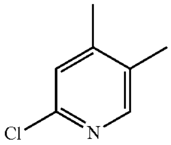 | 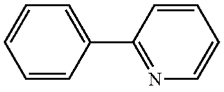 | 891 |
| 3 | A9 | 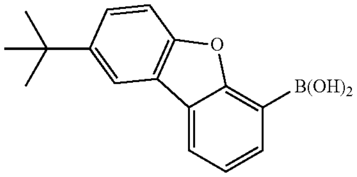 [SMILES: CC(C)(C)c1ccc2oc3c(B(O)O)cccc3c2c1] | 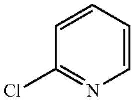 | 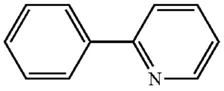 | 947 |
| 4 | A10 | 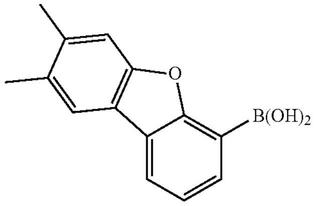 [SMILES: Cc1cc2oc3c(B(O)O)cccc3c2cc1C] | 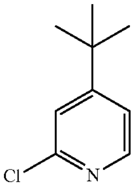 | 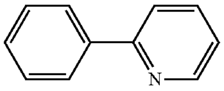 [SMILES: c1ccc(-c2ccccn2)cc1] | 935 |
| 5 | A15 | 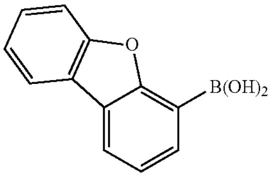 [SMILES: OB(O)c1cccc2c1oc1ccccc12] | 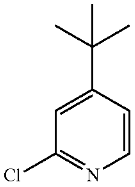 | 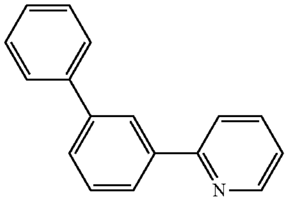 [SMILES: c1ccc(-c2cccc(-c3ccccn3)c2)cc1] | 1023 |
| 6 | A16 | 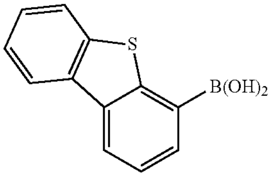 [SMILES: OB(O)c1cccc2c1sc1ccccc12] | 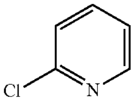 | 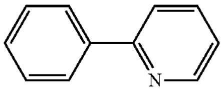 | 867 |
| 7 | A18 | 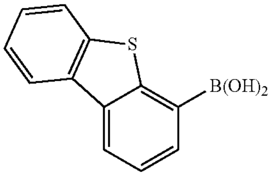 [SMILES: OB(O)c1cccc2c1sc1ccccc12] | 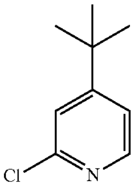 | 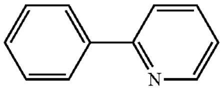 | 979 |

TABLE 2
| Exemplary embodiment | Exemplary compound | Raw material 1 | Raw material 2 | Raw material 3 | m/z |
|---|---|---|---|---|---|
| 8 | B1 | 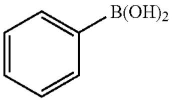 | 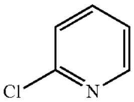 | 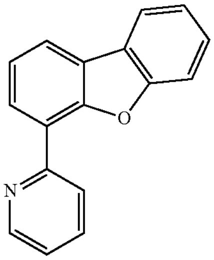 [SMILES: c1ccc(-c2cccc3c2oc2ccccc23)nc1] | 761 |
| 9 | B3 | 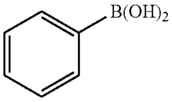 | 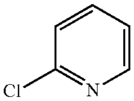 | 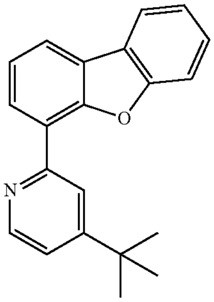 [SMILES: CC(C)(C)c1ccnc(-c2cccc3c2oc2ccccc23)c1] | 801 |
| 10 | B9 | 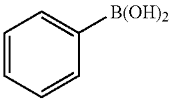 | 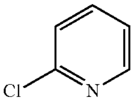 | 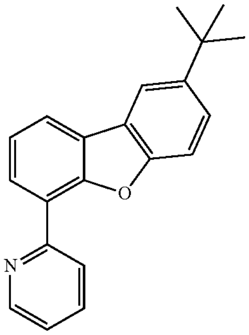 [SMILES: CC(C)(C)c1ccc2oc3c(-c4ccccn4)cccc3c2c1] | 801 |
| 11 | B10 | 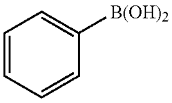 | 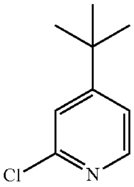 | 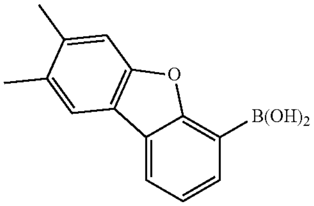 [SMILES: Cc1cc2oc3c(B(O)O)cccc3c2cc1C] | 795 |
| 12 | B19 | 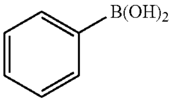 | 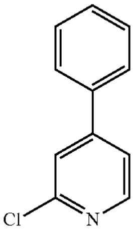 [SMILES: Clc1cc(-c2ccccc2)ccn1] | 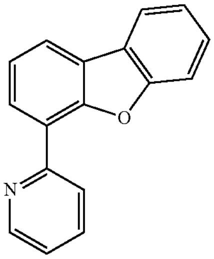 [SMILES: c1ccc(-c2cccc3c2oc2ccccc23)nc1] | 897 |

TABLE 2-continued
| Exemplary embodiment | Exemplary compound | Raw material 1 | Raw material 2 | Raw material 3 | m/z |
|---|---|---|---|---|---|
| 13 | B25 | 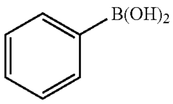 | 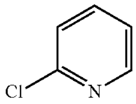 | 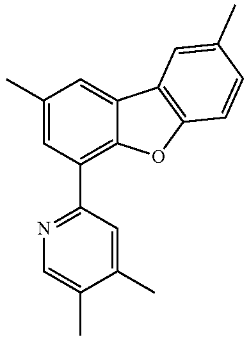 [SMILES: Cc1ccc2oc3c(-c4cc(C)c(C)cn4)cc(C)cc3c2c1] | 801 |
TABLE 3
| Exemplary embodiment | Exemplary compound | Exemplary compound 1 | Exemplary compound 2 | Exemplary compound 3 | m/z |
|---|---|---|---|---|---|
| 14 | B30 | 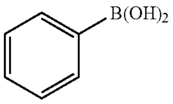 | 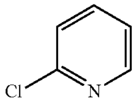 | 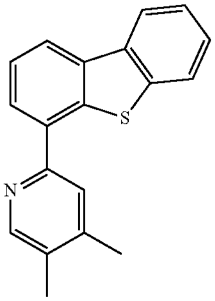 [SMILES: Cc1cnc(-c2cccc3c2sc2ccccc23)cc1C] | 817 |
| 15 | B31 | 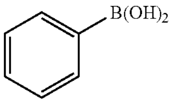 | 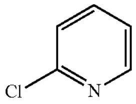 | 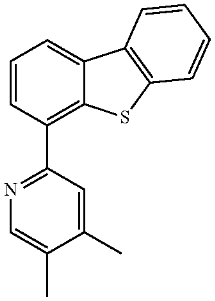 [SMILES: Cc1cnc(-c2cccc3c2sc2ccccc23)cc1C] | 789 |
| 16 | B35 | 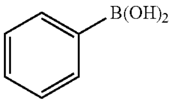 | 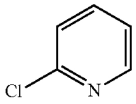 | 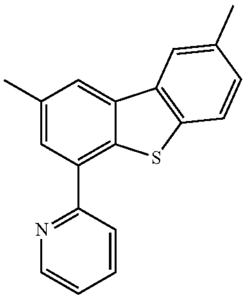 [SMILES: Cc1ccc2sc3c(-c4ccccn4)cc(C)cc3c2c1] | 789 |

TABLE 3-continued

| Exemplary embodiment | Exemplary compound | Exemplary compound 1 | Exemplary compound 2 | Exemplary compound 3 | m/z |
|---|---|---|---|---|---|
| 17 | B41 | 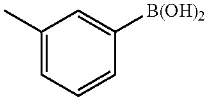 | 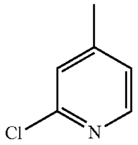 | 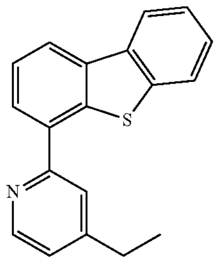 [SMILES: CCc1ccnc(-c2cccc3c2sc2ccccc23)c1] | 845 |

TABLE 4

| Exemplary embodiment | Exemplary compound | Raw material 1 | Raw material 2 | Raw material 3 | m/z |
|---|---|---|---|---|---|
| 18 | C1 | 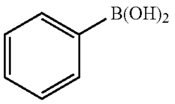 | 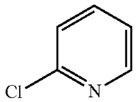 | 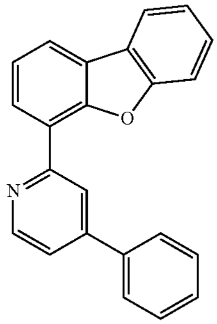 [SMILES: c1ccc(-c2ccnc(-c3cccc4c3oc3ccccc34)c2)cc1] | 821 |
| 19 | C5 | 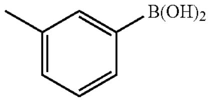 | 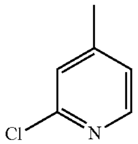 | 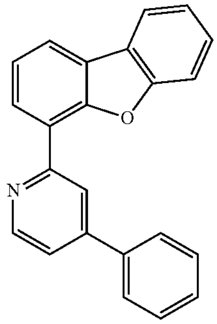 [SMILES: c1ccc(-c2ccnc(-c3cccc4c3oc3ccccc34)c2)cc1] | 877 |
| 20 | C6 | 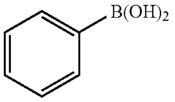 | 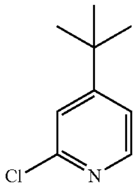 | 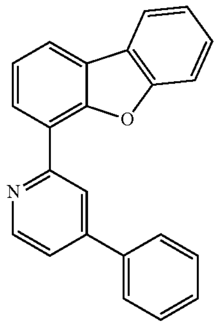 [SMILES: c1ccc(-c2ccnc(-c3cccc4c3oc3ccccc34)c2)cc1] | 933 |

Exemplary Embodiment 21

An organic light-emitting element of a bottom emission type was produced. The organic light-emitting element included a positive electrode, a hole-injection layer, a hole-transport layer, an electron-blocking layer, a light-emitting layer, a hole-blocking layer, an electron-transport layer, an electron-injection layer, and a negative electrode sequentially formed on a substrate.

First, an ITO film was formed on a glass substrate and was subjected to desired patterning to form an ITO electrode (positive electrode). The ITO electrode had a thickness of 100 nm. The substrate on which the ITO electrode was formed was used as an ITO substrate in the following process. Vacuum evaporation was then performed by resistance heating in a vacuum chamber at $1.33\times10^{-4}$ Pa to continuously form an organic compound layer and an electrode layer shown in Table 5 on the ITO substrate. The counter electrode (a metal electrode layer, a negative electrode) had an electrode area of 3 $mm^2$.

TABLE 5

| | | | Material | Thickness (nm) |
|---|---|---|---|---|
| Negative electrode | | | Al | 100 |
| Electron-injection layer (EIL) | | | LiF | 1 |
| Electron-transport layer (ETL) | | | ET2 | 20 |
| Hole-blocking layer (HBL) | | | ET11 | 20 |
| Light-emitting layer (EML) | Guest | A3 | Weight ratio | 20 |
| | Host | AA18 | A3:AA18:BB1 = | |
| | Assist | BB1 | 10:60:30 | |
| Electron-blocking layer (EBL) | | | HT19 | 15 |
| Hole-transport layer (HTL) | | | HT3 | 30 |
| Hole-injection layer (HIL) | | | HT16 | 5 |

The characteristics of the element were measured and evaluated. The light-emitting element had the maximum emission wavelength of 532 nm and an efficiency (cd/A) of 58. A continuous operation test was performed at a current density of 100 $mA/cm^2$ to measure the time when the luminance degradation rate reached 5%. The time when the luminance degradation rate of Comparative Example 1 reached 5% was taken to be 1.0. The present exemplary embodiment had a luminance degradation rate ratio of 1.9.

In the present exemplary embodiment, with respect to measuring apparatuses, more specifically, the current-voltage characteristics were measured with a microammeter 4140B manufactured by Hewlett-Packard Co., and the luminance was measured with a BM7 manufactured by Topcon Corporation.

Exemplary Embodiments 22 to 31, Comparative Examples 1 to 5

Organic light-emitting elements according to Exemplary Embodiments 22 to 31 and Comparative Examples 1 to 5 were prepared in the same manner as in Exemplary Embodiment 21 except that the compounds shown in Table 6 were appropriately used. The characteristics of the elements were measured and evaluated in the same manner as in Exemplary Embodiment 21. Table 6 shows the measurement results.

TABLE 6

| | | | | EML | | | | | Efficiency | Luminance degradation |
|---|---|---|---|---|---|---|---|---|---|---|
| | HIL | HTL | EBL | Guest | Host | Assist | HBL | ETL | Cd/A | rate ratio |
| Exemplary embodiment 22 | HT16 | HT3 | HT19 | A1 | AA18 | BB1 | ET12 | ET15 | 54 | 1.4 |
| Exemplary embodiment 23 | HT16 | HT2 | HT15 | A28 | AA19 | BB4 | ET12 | ET2 | 58 | 1.6 |
| Exemplary embodiment 24 | HT16 | HT2 | HT15 | B3 | AA22 | BB1 | ET11 | ET2 | 57 | 1.9 |
| Exemplary embodiment 25 | HT16 | HT3 | HT19 | B4 | AA19 | BB13 | ET12 | ET15 | 56 | 1.8 |
| Exemplary embodiment 26 | HT16 | HT3 | HT19 | A3 | AA18 | BB13 | ET12 | ET15 | 55 | 1.8 |
| Exemplary embodiment 27 | HT16 | HT3 | HT19 | A4 | AA22 | BB6 | ET11 | ET15 | 58 | 1.6 |
| Exemplary embodiment 28 | HT16 | HT3 | HT19 | B43 | AA23 | BB16 | ET12 | ET2 | 56 | 1.6 |
| Exemplary embodiment 29 | HT16 | HT2 | HT15 | B22 | AA40 | BB16 | ET12 | ET15 | 54 | 1.3 |
| Exemplary embodiment 30 | HT16 | HT3 | HT19 | B2 | AA19 | BB6 | ET12 | ET15 | 58 | 1.7 |
| Exemplary embodiment 31 | HT16 | HT2 | HT15 | A15 | AA19 | BB13 | ET12 | ET2 | 57 | 1.9 |
| Comparative example 1 | HT16 | HT3 | HT19 | B3 | AA18 | — | ET12 | ET2 | 38 | 1.0 |
| Comparative example 2 | HT16 | HT3 | HT19 | B3 | AA18 | EM10 | ET12 | ET2 | 42 | 0.9 |
| Comparative example 3 | HT16 | HT3 | HT19 | B3 | AA18 | EM11 | ET12 | ET2 | 41 | 0.9 |
| Comparative example 4 | HT16 | HT3 | HT19 | B3 | AA18 | HT7 | ET11 | ET15 | 43 | 0.8 |
| Comparative example 5 | HT16 | HT2 | HT15 | B3 | AA18 | HT8 | ET12 | ET2 | 44 | 0.7 |

Table 7 shows the LUMO levels of the host materials used in Exemplary Embodiments 21 to 31 and Comparative Examples 1 to 5 and the assist materials used in Exemplary Embodiments 21 to 31. The LUMO levels of the host materials and the assist materials are calculated by determining ionization potential (IP) using an atmospheric photoelectron spectrometer AC-3 manufactured by Riken Keiki Co., Ltd. and subtracting the photonic band gap (BG) determined with an ultraviolet-visible spectrophotometer manufactured by JASCO Corporation.

TABLE 7

| Host material | LUMO level (eV) | Assist material | LUMO level (eV) |
|---|---|---|---|
| AA18 | 2.8 | BB1 | 3.4 |
| AA19 | 2.8 | BB4 | 3.2 |

TABLE 7-continued

| Host material | LUMO level (eV) | Assist material | LUMO level (eV) |
|---|---|---|---|
| AA22 | 2.8 | BB6 | 3.6 |
| AA23 | 2.7 | BB13 | 3.5 |
| AA40 | 2.6 | BB16 | 3.4 |

Table 6 shows that Comparative Example 1 had an efficiency (cd/A) of 38, which is lower than the luminescence efficiencies of the light-emitting elements of the exemplary embodiments. This means that the element structures according to the present disclosure have higher efficiency. Furthermore, Comparative Examples 2 to 5 had a luminance degradation rate ratio in the range of 0.7 to 0.9, and the light-emitting elements according to the exemplary embodiments had a longer life. The LUMO levels of the assist materials used in Comparative Examples 2 and 3 are 2.7 eV, which is almost the same as the LUMO levels of the host materials. The LUMO levels of the assist materials used in Comparative Examples 4 and 5 are 2.5 eV, which is shallower than the LUMO levels of the host materials. This shows that the LUMO level of an assist material deeper (lower) than the LUMO level of a host material can result in a high-durability green-light-emitting element with a maximum emission wavelength in the range of 500 to 565 nm.

Exemplary Embodiments 32 to 36 and Comparative Examples 6 to 8

Organic light-emitting elements were prepared in the same manner as in Exemplary Embodiment 21 except that the compounds shown in Table 8 were appropriately used in Exemplary Embodiments 32 to 36 and Comparative Examples 6 to 8. The characteristics of the elements were measured and evaluated in the same manner as in Exemplary Embodiment 21. Table 8 shows the measurement results. The LUMO levels of the host materials used in Exemplary Embodiments 32 to 36 and Comparative Examples 6 to 8 and the assist materials used in Exemplary Embodiments 32 to 36 are shown in Table 7.

TABLE 8

| | | | | EML | | | | | Efficiency | Luminance degradation |
|---|---|---|---|---|---|---|---|---|---|---|
| | HIL | HTL | EBL | Guest | Host | Assist | HBL | ETL | Cd/A | rate ratio |
| Exemplary embodiment 32 | HT16 | HT2 | HT19 | C1 | AA18 | BB1 | ET12 | ET15 | 46 | 1.6 |
| Exemplary embodiment 33 | HT16 | HT2 | HT15 | C5 | AA19 | BB4 | ET12 | ET2 | 48 | 1.9 |
| Exemplary embodiment 34 | HT16 | HT3 | HT19 | C13 | AA22 | BB1 | ET11 | ET2 | 46 | 1.5 |
| Exemplary embodiment 35 | HT16 | HT3 | HT15 | C6 | AA19 | BB13 | ET12 | ET15 | 47 | 1.8 |
| Exemplary embodiment 36 | HT16 | HT2 | HT19 | C2 | AA18 | BB13 | ET12 | ET15 | 46 | 1.5 |
| Comparative example 6 | HT16 | HT3 | HT19 | C1 | AA18 | — | ET12 | ET2 | 25 | 1.0 |
| Comparative example 7 | HT16 | HT3 | HT19 | C1 | AA18 | EM6 | ET12 | ET2 | 30 | 0.8 |
| Comparative example 8 | HT16 | HT3 | HT19 | C1 | AA18 | HT7 | ET12 | ET2 | 33 | 0.8 |

Table 8 shows that Comparative Example 6 had an efficiency (cd/A) of 25, which is lower than the luminescence efficiencies of the light-emitting elements of the exemplary embodiments. This is because the element structures according to the present disclosure have higher quantum yields. Furthermore, Comparative Examples 7 and 8 had a luminance degradation rate ratio of 0.8, and the light-emitting elements according to the exemplary embodiments had a longer life. The LUMO level of the assist material used in Comparative Example 7 is 2.7 eV, which is almost the same as the LUMO levels of the host materials. The LUMO level of the assist material used in Comparative Example 8 is 2.5 eV, which is shallower than the LUMO levels of the host materials. This shows that the LUMO level of an assist material deeper (lower) than the LUMO level of a host material can result in a high-durability yellow-light-emitting element with a maximum emission wavelength in the range of 565 to 590 nm.

The present disclosure can provide an organic light-emitting element with high luminescence efficiency and drive durability.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-124118 filed Jul. 29, 2021, which is hereby incorporated by reference herein in its entirety.

What is claimed is:

1. An organic light-emitting element comprising:

a positive electrode, a light-emitting layer, and a negative electrode in this order, wherein the light-emitting layer contains a dopant material, a host material, and an assist material, the dopant material is a compound represented by the following general formula [1], the host material is an aromatic hydrocarbon compound, and the assist material has a lower LUMO level than the host material (farther from the vacuum level),

[1]

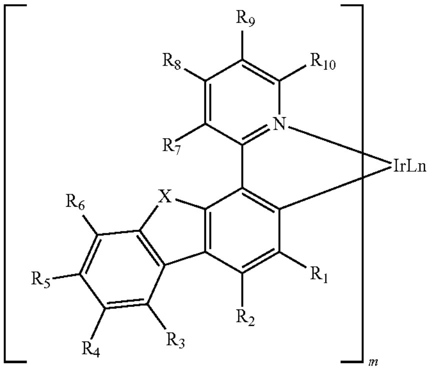

wherein $R_1$ to $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group, X denotes O or S, m denotes an integer in the range of 1 to 3, and n denotes an integer in the range of 0 to 2, provided that m+n is 3, and the partial structure $IrL_n$ is any one of structures represented by the following general formulae [2] and [3],

[2]

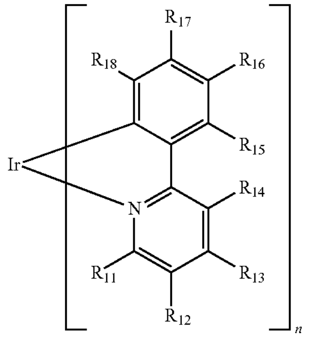

-continued

[3]

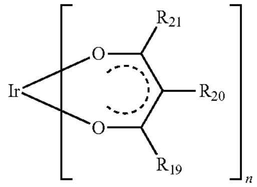

wherein $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group, and wherein the organic light-emitting element emits yellow light.

2. The organic light-emitting element according to claim 1, wherein the assist material is a compound partially having any one of the following structures:

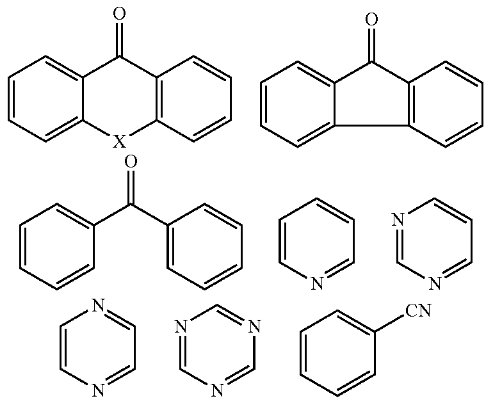

wherein X denotes an oxygen atom, a sulfur atom, or a substituted or unsubstituted carbon atom.

3. The organic light-emitting element according to claim 1, wherein the host material has at least one of a triphenylene ring, a phenanthrene ring, a chrysene ring, and a fluoranthene ring as a backbone.

4. The organic light-emitting element according to claim 1, wherein at least one of $R_1$ to $R_{21}$ denotes an alkyl group having 1 to 4 carbon atoms.

5. The organic light-emitting element according to claim 1, wherein the organic light-emitting element emits green light.

6. The organic light-emitting element according to claim 1, further comprising another light-emitting layer on the light-emitting layer, wherein the other light-emitting layer emits light of a different emission color from the light-emitting layer.

7. The organic light-emitting element according to claim 6, wherein the organic light-emitting element emits white light.

8. A display apparatus comprising a plurality of pixels, wherein at least one of the plurality of pixels includes the organic light-emitting element according to claim 1 and an active element coupled to the organic light-emitting element.

9. The display apparatus according to claim 8, further comprising a color filter.

10. A photoelectric conversion apparatus comprising:

an optical unit with a plurality of lenses;

an imaging element configured to receive light passing through the optical unit; and a display unit configured to display an image taken by the imaging element, wherein the display unit includes the organic light-emitting element according to claim 1.

11. Electronic equipment comprising:

a display unit including the organic light-emitting element according to claim 1;

a housing in which the display unit is provided; and a communication unit configured to communicate with an outside provided in the housing.

12. A lighting apparatus comprising:

a light source including the organic light-emitting element according to claim 1; and a light-diffusing unit or an optical filter that transmits light emitted by the light source.

13. A moving body comprising:

a lamp including the organic light-emitting element according to claim 1; and a body to which the lamp is provided.

14. An exposure light source of an electrophotographic image-forming apparatus, comprising the organic light-emitting element according to claim 1.

15. An organic light-emitting element comprising:

a positive electrode, a light-emitting layer, and a negative electrode in this order, wherein the light-emitting layer contains a dopant material, a host material, and an assist material, the dopant material is a compound represented by the following general formula [1], the host material is an aromatic hydrocarbon compound, and the assist material has a lower LUMO level than the host material (farther from the vacuum level),

[1]

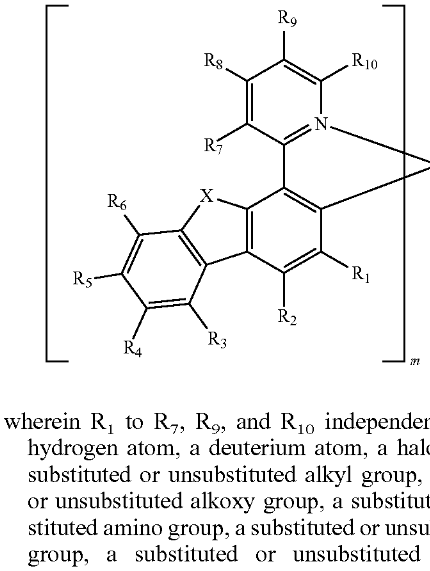

wherein $R_1$ to $R_7$, $R_9$, and $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group, $R_8$ denotes a phenyl group, X denotes O or S, m denotes an integer in the range of 1 to 3, and n denotes an integer in the range of 0 to 2, provided that m+n is 3, and the partial structure $IrL_n$ is any one of structures represented by the following general formulae [2] and [3],

[2]

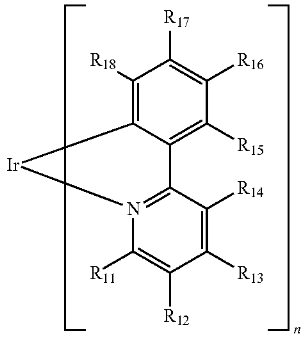

[3]

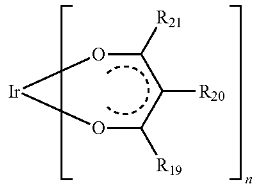

wherein $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

16. An organic light-emitting element comprising:

a positive electrode, a light-emitting layer, and a negative electrode in this order, wherein the light-emitting layer contains a dopant material, a host material, and an assist material, wherein the dopant material is any one of the following compounds,

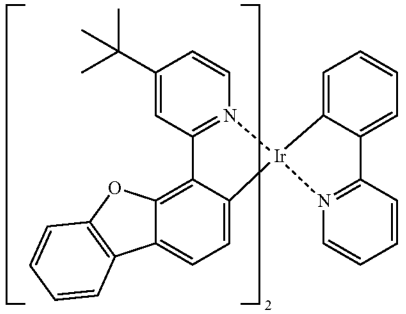

-continued

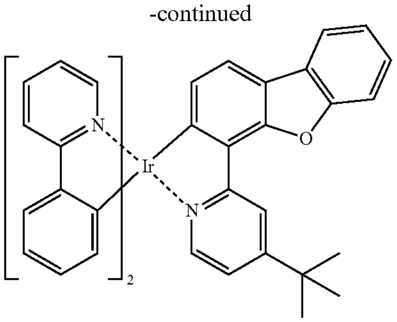

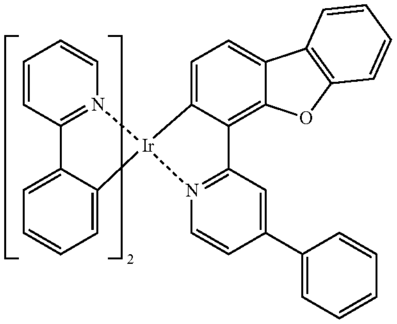

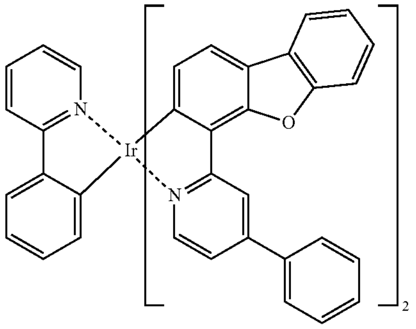

the host material is an aromatic hydrocarbon compound, and the assist material has a lower LUMO level than the host material (farther from the vacuum level),

[1]

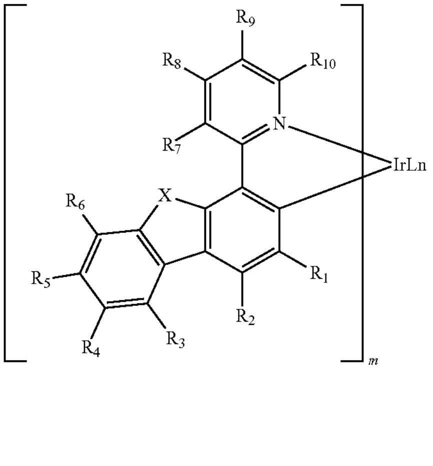

wherein $R_1$ to $R_{10}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group, X denotes O or S, m denotes an integer in the range of 1 to 3, and n denotes an integer in the range of 0 to 2, provided that m+n is 3, and the partial structure $IrL_n$ is any one of structures represented by the following general formulae [2] and [3],

[2]

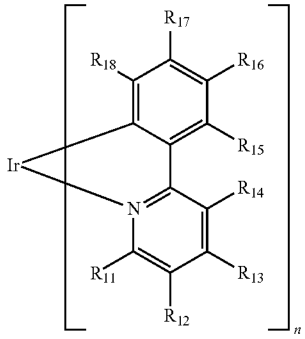

[3]

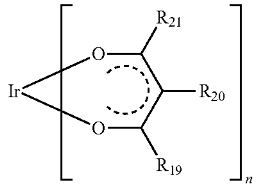

wherein $R_{11}$ to $R_{21}$ independently denote a hydrogen atom, a deuterium atom, a halogen atom, a substituted or unsubstituted alkyl group, a substituted or unsubstituted alkoxy group, a substituted or unsubstituted amino group, a substituted or unsubstituted aryl group, a substituted or unsubstituted heterocyclic group, a substituted or unsubstituted aryloxy group, a substituted or unsubstituted heteroaryloxy group, a substituted or unsubstituted silyl group, or a cyano group.

* * * * *